United States Patent
Kaya et al.

(10) Patent No.: US 11,011,642 B2
(45) Date of Patent: May 18, 2021

(54) AMBIPOLAR FIELD-EFFECT DEVICE USING ENGINEERED WORK-FUNCTIONS

(71) Applicant: Ohio University, Athens, OH (US)

(72) Inventors: Savas Kaya, Hilliard, OH (US);
Avinash Karanth, Athens, OH (US);
Talha F. Canan, Athens, OH (US)

(73) Assignee: Ohio University, Athens, OH (US)

( * ) Notice: Subject to any disclaimer, the term of this patent is extended or adjusted under 35 U.S.C. 154(b) by 0 days.

(21) Appl. No.: 16/445,824

(22) Filed: Jun. 19, 2019

(65) Prior Publication Data
US 2019/0386139 A1 Dec. 19, 2019

Related U.S. Application Data

(60) Provisional application No. 62/686,844, filed on Jun. 19, 2018.

(51) Int. Cl.
| | |
|---|---|
| *H01L 51/30* | (2006.01) |
| *H01L 29/78* | (2006.01) |
| *H03K 19/0948* | (2006.01) |
| *H03K 19/20* | (2006.01) |
| *H01L 29/739* | (2006.01) |

(52) U.S. Cl.
CPC ...... *H01L 29/7855* (2013.01); *H01L 29/7393* (2013.01); *H03K 19/0948* (2013.01); *H03K 19/20* (2013.01)

(58) Field of Classification Search
CPC ............ H01L 29/7393; H01L 29/7855; H03K 19/0948; H03K 19/20
See application file for complete search history.

(56) References Cited

U.S. PATENT DOCUMENTS

| | | | | |
|---|---|---|---|---|
| 5,273,921 | A | * | 12/1993 | Neudeck ........... H01L 29/66772 257/E21.415 |
| 7,019,342 | B2 | * | 3/2006 | Hackler, Sr. ........ H01L 21/2256 257/250 |

(Continued)

OTHER PUBLICATIONS

Rao, L. Dileshwar; FinFET Based Adiabatic Logic Design for Low Power Applications; 2017; IEEE (Year: 2017).*

(Continued)

*Primary Examiner* — Alexander H Taningco
*Assistant Examiner* — Kurtis R Bahr
(74) *Attorney, Agent, or Firm* — Wood Herron & Evans LLP

(57) ABSTRACT

Devices, circuits, and methods for fabricating circuits. A device having ambipolar characteristics includes a semiconductor layer and multiple gates, a source contact, and a drain contact coupled to the semiconductor layer. One channel may have elections as the majority charge carrier and may be formed proximate to one of the gates. Another channel may have holes as the majority charge carrier and be formed proximate another gate. Each of the channels is generally parallel to the other and couples the source contact to the drain contact. The device may be optimized by adjusting the work-functions in one or more of source and drain contacts or gates to compensate for differences in the effective masses of the majority carriers in each of the channels. The ambipolar nature of the devices allows logic circuits to be fabricated using one or two of the devices.

19 Claims, 43 Drawing Sheets

Band-Diagram Along P-P' Section

(56) References Cited

U.S. PATENT DOCUMENTS

| | | | | |
|---|---|---|---|---|
| 7,407,843 B2* | 8/2008 | Afentakis | ......... | H01L 29/78624 |
| | | | | 257/365 |
| 7,704,838 B2* | 4/2010 | John | ................ | H01L 29/78648 |
| | | | | 438/283 |
| 9,197,215 B1* | 11/2015 | Balandin | ........... | H01L 29/78648 |
| 9,412,590 B1* | 8/2016 | Hsu | ................... | H01L 21/02658 |
| 9,922,995 B2* | 3/2018 | Ge | ...................... | H01L 27/1225 |
| 10,509,297 B2* | 12/2019 | Kafaie Shirmanesh | .. | G02F 1/29 |
| 2013/0234116 A1* | 9/2013 | Lee | ....................... | B82Y 10/00 |
| | | | | 257/40 |
| 2013/0313524 A1* | 11/2013 | De Micheli | ......... | H01L 29/0673 |
| | | | | 257/29 |

OTHER PUBLICATIONS

Ben G. Streetman, Solid State Electronic Devices, p. 31 (2d ed. 1980).

* cited by examiner

6T D FLIP-FLOP

AMBIPOLAR FIELD-EFFECT DEVICE USING ENGINEERED WORK-FUNCTIONS

CROSS-REFERENCE TO RELATED APPLICATIONS

This application claims the benefit of U.S. Application No. 62/686,844 filed on Jun. 19, 2018, and entitled "Ambipolar Field-Effect Device Using Engineered Work-Functions", the disclosure of which is incorporated by reference herein in its entirety.

GOVERNMENT RIGHTS

This invention was made with government support under CCF1513606 awarded by the National Science Foundation. The government has certain rights in the invention.

BACKGROUND

This invention generally relates to semiconductor devices and, in particular, to ambipolar field-effect devices and logic circuits based thereon.

Complementary Metal-Oxide-Semiconductor (CMOS) devices fabricated on silicon is the preferred technology for fabricating integrated circuits and is used in a wide array of digital logic circuits, such as microprocessors, microcontrollers, and Random Access Memory (RAM). Over the years, the performance of silicon-based CMOS technology has been increased largely by reducing the dimensions of the devices through improvements in fabrication techniques. However, as CMOS devices have begun to reach sub-10 nm scale, it has become difficult to fabricate transistors that deliver $I_{ON}/I_{OFF}$ current ratios sufficient for good performance in logic circuits.

As continued downscaling of silicon CMOS devices in sub-10-nm scale is proceeding, options for viable, reliable, relatively simple Si MOSFET architectures that can deliver the required $I_{ON}/I_{OFF}$ current ratios is rather limited. Attempts to improve the performance of sub-10 nm devices have so far been limited to incremental changes in their structure. With these small-scale geometries, fundamental limits imposed by parasitic and quantum effects often cap the performance of the devices. Thus, although the incremental approaches used so far have managed to extend the lifetime of CMOS in the hope that an alternative technology will emerge, the performance of these devices has significant shortcomings, and may be nearing the limit of what can be achieved using conventional CMOS technology.

Thus, there is a need for improved devices and circuits, as well as methods of fabricating devices and circuits, that provide improved performance in sub-10 nm architectures.

SUMMARY

In an embodiment of the invention, a device is provided. The device includes a semiconductor layer including a first end, a second end opposite the first end, a first surface that extends from the first end to the second end, and a second surface opposite the first surface. A first contact (e.g., a source contact) is coupled to the first end of the semiconductor layer and has a first contact work-function. A second contact (e.g., a drain contact) is coupled to the second end of the semiconductor layer and has a second contact work-function. A first gate electrode is coupled to the first surface of the semiconductor layer and has a first gate work-function, and a second gate electrode is coupled to the second surface of the semiconductor layer and has a second gate work-function. The work-functions are selected so that at least one of the first contact work-function is different from the second contact work-function, or the first gate work-function is different from the second gate work-function.

In another embodiment of the invention, a method of fabricating the device is provided. The method includes providing the semiconductor layer including the first end, the second end opposite the first end, the first surface that extends from the first end to the second end, and the second surface opposite the first surface. The method further includes coupling the first contact having the first contact work-function to the first end of the semiconductor layer, coupling the second contact having the second contact work-function to the second end of the semiconductor layer, coupling the first gate electrode having the first gate work-function to the first surface of the semiconductor layer, and coupling the second gate electrode having the second gate work-function to the second surface of the semiconductor layer. A least one of the first contact work-function is different from the second contact work-function, or the first gate work-function is different from the second gate work-function.

In another embodiment of the invention, another device is provided. The device includes the semiconductor layer including the first end, the second end opposite the first end, the first surface that extends from the first end to the second end, and the second surface opposite the first surface. The device further includes a contact coupled to the first end of the semiconductor layer and having a contact work-function, another contact coupled to the second end of the semiconductor layer and having another contact work-function, a gate electrode coupled to the first surface of the semiconductor layer and having a gate work-function, and another gate electrode coupled to the second surface of the semiconductor layer and having a another gate work-function. One of the gate work-functions has a value that causes the gate to operate as an n-channel device, and the other gate work-function has a value that causes the gate to operate as a p-channel device.

In certain embodiments of the invention, the coupling of contacts to the ends of the semiconductor layer may be via quantum mechanical tunneling though the Schottky Barrier, the coupling of gate electrodes to the surface of the semiconductor layer may be via electro-static field action, and the contact and gate work-functions may or may not be different from one another.

The above summary presents a simplified overview of some embodiments of the invention to provide a basic understanding of certain aspects of the invention discussed herein. The summary is not intended to provide an extensive overview of the invention, nor is it intended to identify any key or critical elements, or delineate the scope of the invention. The sole purpose of the summary is merely to present some concepts in a simplified form as an introduction to the detailed description presented below.

BRIEF DESCRIPTION OF THE DRAWINGS

The accompanying drawings, which are incorporated in and constitute a part of this specification, illustrate various embodiments of the invention and, together with the general description of the invention given above, and the detailed description of the embodiments given below, serve to explain the embodiments of the invention.

DETAILED DESCRIPTION

Figure 1:
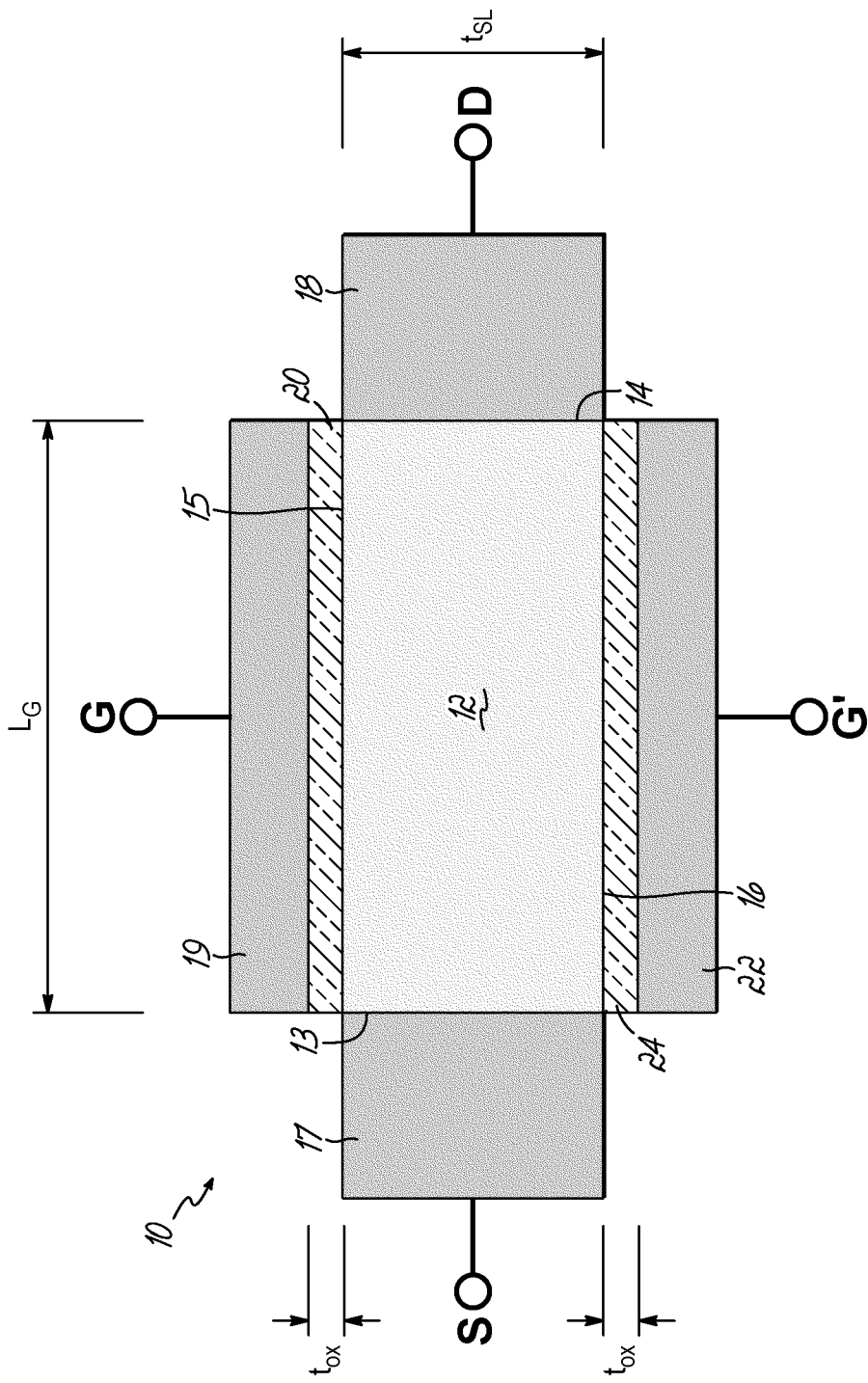
FIG. 1 is a diagrammatic view of an ambipolar device including a source, a drain, a top gate, and a bottom gate.

Embodiments of the invention are directed to ultra-compact logic circuits fabricated using devices with ambipolar characteristics and which are capable of working both as a p-channel and as an n-channel MOSFET. These devices may include Schottky-Barrier (SB) Field-Effect Transistors (FETs) having multiple gates, such as a SB-FinFET having top and bottom gates. The devices may be optimized using metal work-function engineering to adjust the Schottky barrier height in one or more of the source contact, the drain contact, and the gates. The gates may also be independently biased to adjust carrier densities in their respective channels. The use of ambipolar devices may provide an increased degree of freedom for designing logic functionality as compared to conventional logic circuits. The use of Schottky barrier contacts, high-k gate dielectrics, and an ultra-thin body may contribute to a high-degree of short-channel immunity to the devices. This may enable SB-FinFETs with ambipolar current-voltage characteristics at least down to gate lengths of 5 nm. The unique characteristics of these logic circuits may lower transistor count by 50% and may significantly reduce overall power-delay products (PDPs) as compared to conventional CMOS logic circuits.

To illustrate the potential of these ambipolar devices, a novel conjugate (n-channel/p-channel) single transistor CMOS pass-gate (also referred to as a "transmission gate") was developed that can be used to fabricate two-transistor (2T), three-transistor (3T), and four transistor (4T) XOR logic circuits in which the 3T and 4T logic circuits do not require inverters. The 4T and 3T XOR logic circuits eliminate the need for inverted inputs by shifting the ambipolar I-V characteristics using the associated gate work-function so that a separate conduction channel forms under each gate.

Minimalist 2T NAND/NOR logic circuits have also been designed and modeled using Technology Computer Aided Design (TCAD) simulations. Depending on the type of logic circuit, the TCAD simulations indicate that judicious choice of gate work-functions between 3.7 and 5.2 eV can lead to logic circuits with a power-delay product (PDP) at a $5 \times 10^{-18}$ J level with immunity to ±0.1-eV work-function variations. It has been determined that work-function engineering in independent-gate SB-FinFETs may enable fabrication of ultracompact logic circuits with a 50% reduction in area and up to a 10 times reduction in power. These improvements may be achieved without a significant degradation to overall power-delay product performance due to the slower switching response of the model logic circuits as compared with conventional designs using p-n junction FinFET counterparts.

Ten transistor (10T) and eight transistor (8T) full-adder logic circuits based on the above XOR logic circuits have also been modeled. These full-adder logic circuits would normally require up to 20 FinFETs in a conventional CMOS architecture. Simulated power-delay products of the novel full-adders show a significant (e.g., ~5×) improvement in dynamic performance attributed largely to the 50% reduction in total area and the accompanying reduction in parasitics. However, these improvements may come at the expense of a loss in noise margins. While the 8T full-adder logic circuit can be realized without inversion of inputs (and is thus smaller that the 10T circuit), the 10T logic circuit can be operated with only six transistors if inverted inputs are available. Performance of the full adder logic circuits has been confirmed via standard Synopsys TCAD tools and found to have a competitive power-delay product at $10^{-17}$ J scale, which is ~5× lower than the CMOS counterparts evaluated in the same framework. Besides the full-adders explored, the disclosed work-function engineering approach may provide area and performance gains for additional logic circuit building blocks that can be redesigned using SB-FinFETs. Additional novel logic circuits described herein include latches and flip-flops. The above logic circuits may provide building blocks for more complex logic circuits.

Work-function engineering is applied to independent-gate SB ambipolar FinFETs with specific gate work-functions and can lead to unique logic circuits. In particular, we have determined how a single transistor CMOS pass-gate with one pair of source/drain contacts and two opposite types of channels (e.g., n- and p-channels) can be built using unequal gate work-functions in an independent FinFET gate. Based on the 1T pass gate, we have further designed a minimalist 2T XOR gate. Novel 2T NAND and NOR gates have also been designed using high/low threshold devices utilizing two different work-functions for the n- and p-channel SB-FinFETs. Functionality of 2T logic gates has been confirmed via standard Synopsys TCAD tools that take into account band-to-band tunneling, barrier tunneling, as well as first-order quantum-mechanical correction via a density-gradient approach. Dynamic performance and area of the 2T ambipolar gates are compared with the 4T conventional counterparts built using FinFETs with p-junction and n-junction contacts.

In an exemplary embodiment, a novel conjugate CMOS pass-gate (i.e., having both n and p channels) is used to provide two-transistor (2T) XOR and NAND/NOR logic circuits. The performance of these devices has been evaluated using TCAD simulations. These simulations indicate that CMOS logic circuits having a power-delay product of $5 \times 10^{-18}$ J can be realized through judicious choice of gate work-functions, e.g., in the range of about 3.7 eV and 5.2 eV for silicon-based devices. Using work-function engineering to optimize the performance of independent-gate SB-FinFETs allows logic circuits with minimal area and transistor count to be designed, thereby enabling novel logic functionalities that have not previously been possible.

By using gate work-function engineering to overcome the limits of existing fabrication technologies, embodiments of the present invention improve the performance of circuits as compared to circuits fabricated using conventional CMOS devices. The disclosed gate work-function engineering approach enables fabrication of ultra-compact, relatively simple logic circuits down to at least a 5 nm scale, while also increasing the logic density by advantageous use of independent-gate control in FinFETs. The improvements in size and performance of logic circuits have been accomplished using a FinFET architecture which can be fabricated using standard CMOS processes by setting work-function values independently for n-channel and p-channel FinFETs gates. These novel architectures allow ultra-high-density logic circuits to be fabricated using sub-10 nm MOSFETs having substantially reduced transistor counts and total areas.

Exemplary compact logic circuits use an ambipolar device capable of working both as an n-channel or p-channel MOSFET that can be utilized in CMOS logic circuits demanding equal current drive of both types. When realized in the body of a single FinFET with two independent gates, this ambipolar operation effectively translates to a single MOSFET pass-gate device that can operate with any combination of two n-type or p-type channels (n-channel/n-channel, n-channel/p-channel, or p-channel/p-channel) depending on the choice of gate work-function. This leads to a unique XOR/XNOR functionality using only 2T FinFET cells. This approach also allows the use of low and high-threshold FinFET devices to implement 2T NAND or NOR functions that are not feasible using conventional sub-10 nm devices. Embodiments of the invention thereby provide a new way of using SB-MOSFETs to offer competitive logic performance in sub-10 nm CMOS design.

The exemplary 2T XOR/NAND/NOR logic circuits disclosed herein provide substantial gains in logic density, reductions of parasitics, novel logic circuits (e.g. a CMOS pass-gate device implemented using a single device), lower power consumption (e.g., low off-current $I_{OFF}$), improved device scaling (e.g., down to 5 nm), and operation using low-voltages (e.g., 0.3 to 0.7 volts, such as $V_{DD}$=0.3V, 0.5V, 0.6V, and 0.7V). A standard Silicon FinFET device has been used to provide examples that describe embodiments of the invention for industrial and practical reasons to validate gate work-function engineering approaches. However, it is contemplated that other ambipolar devices, such as nanowires, 2D crystals, III-V semiconductors, thin-film semiconductors, silicon-on-insulator devices, or carbon nanotube channels, could also be used to implement the logic circuit architectures described herein. Thus, embodiments of the invention are not limited to SB-FinFETs, and may include other devices utilizing an independent pair of bottom and top gates which could also be used to implement transistor architectures presented here. The disclosed gate work-function engineering approach presents opportunities to pursue both extremely compact and practical Si FinFETs as well as entirely novel logic devices having gate lengths below 10 nm. This approach is also relevant for both practical industrial Si FinFETs and for any device that possess ambipolar current-voltage (I-V) characteristics such as Silicon Tunnel FETs that utilizes band-to-band tunneling as opposed to Schottky-Barrier tunneling to inject current between source and drain contacts.

FIG. 1 depicts a cross-section of an exemplary ambipolar SB-MOSFET device 10 in accordance with an embodiment of the invention. The device 10 includes a semiconductor layer 12 having a thickness $t_{SL}$ that forms the body of device 10. The semiconductor layer 12 includes a source end 13, a drain end 14 opposite the source end 13, a top surface 15 that extends from the source end 13 to the drain end 14, and a bottom surface 16 opposite the top surface 15. A source contact 17 may be coupled to the source end 13 of semiconductor layer 12, and a drain contact 18 may be coupled to the drain end 14 of semiconductor layer 12. A top gate electrode 19 may be coupled to the top surface 15 of semiconductor layer 12 by a top dielectric layer 20, and a bottom gate electrode 22 may be coupled to the bottom surface 16 of semiconductor layer 12 by a bottom dielectric layer 24. It should be understood that although the top gate may refer to the gate adjacent to an n-channel and the bottom-gate may refer to a gate adjacent to a p-channel, these terms are somewhat arbitrary. For example, top and bottom gates may be adjacent to either type of channel depending on the bias voltage applied to the gate. The terms "top gate" and "bottom gate" also do not imply a particular spatial orientation. That is, the "top gate" may be below or horizontally displaced from the "bottom gate" in any particular device.

The semiconductor layer 12 may comprise a semiconductor, such as silicon, germanium, gallium arsenide, gallium nitride, indium phosphate or any other suitable semiconductor material, and may be intrinsic or doped as an n-type or p-type semiconductor. The top and bottom gate electrodes 19, 22 may each comprise one or more conductive layers, such as metal or polysilicon layers. The top and bottom dielectric layers 20, 24 may each comprise one or more suitable insulating materials, such as silicon dioxide, silicon nitride, or hafnium oxide layers. The carrier density or majority carrier type in the semiconductor layer 12 may be manipulated by applying a voltage to one or more of the top gate electrode 19 or bottom gate electrode 22 relative to the source or drain contacts 17, 18.

The source and drain contacts 17, 18 may be formed from a metallic material, such as silicide. The use of metallic contacts may provide improved speed and reduce space-charge issues as compared to source and drain contacts 17, 18 using p-n junctions. These improvements may be particularly advantageous as gate dimensions are scaled to 10 nm and below. In an exemplary embodiment of the invention, the dielectric layers 20, 24 may have a thickness $t_{ox}$ of about 1 nm and a relative permittivity $\varepsilon_{ox}$ having a range of about 12 to 26, a gate length $L_G$ of about 7 nm, and a semiconductor layer thickness $t_{SL}$ of about 4 nm. Device 10 may be capable of ambipolar carrier injection and may address many issues with conventional devices such as poor sub-threshold slope, large parasitics, dopant fluctuations, as well as incompatibility with novel 1D/2D channel materials, e.g. carbon nanotubes or graphene.

The presence of a Schottky barrier at the source and drain contacts 17, 18 may "lift" the potential at the ends 13, 14 of the semiconductor layer 12, which would otherwise slip away from gate control due to the depletion fields of the source-drain junctions. The Schottky barrier may thereby improve the scalability of the device 10. Moreover, in a conventional device, the top and bottom gate electrodes 19, 22 are physically one structure and are driven together for maximum logic performance as indicated by the ratio of on-current $I_{ON}$ to off-current $I_{OFF}$, or the "$I_{ON}/I_{OFF}$ current ratio". These conventional devices may only create a barrier sufficiently thin and low enough to allow tunneling at one end of the semiconductor layer 12 and only for one type of carrier. Thus, the device can only function either as an n-channel or p-channel MOSFET at a given gate bias. Defining the gate electrodes 19, 22 of the device from two different materials having different work-functions may enable the formation of two separate channels within the semiconductor layer 12, one under each gate. For example, the top gate electrode 19 may be biased for electron tunneling or conduction, and the bottom gate electrode 22 may be biased for hole tunneling or conduction. The independently driven gate electrodes 19, 22 and dual-channel behavior of device 10 may allow operation in a manner analogous to a CMOS pass-gate comprising a pair of parallel n-channel and p-channel MOSFETs driven with opposing logic states.

Advantageously, the type of tunneling carriers in device 10 may be determined by adjusting the barrier height of the source or drain contacts rather than by using heavy doping in a p-n junction. The silicon barrier height may thereby provide an additional mechanism for defining the characteristics of an ambipolar SB-MOSFET such as device 10.

Figure 2:
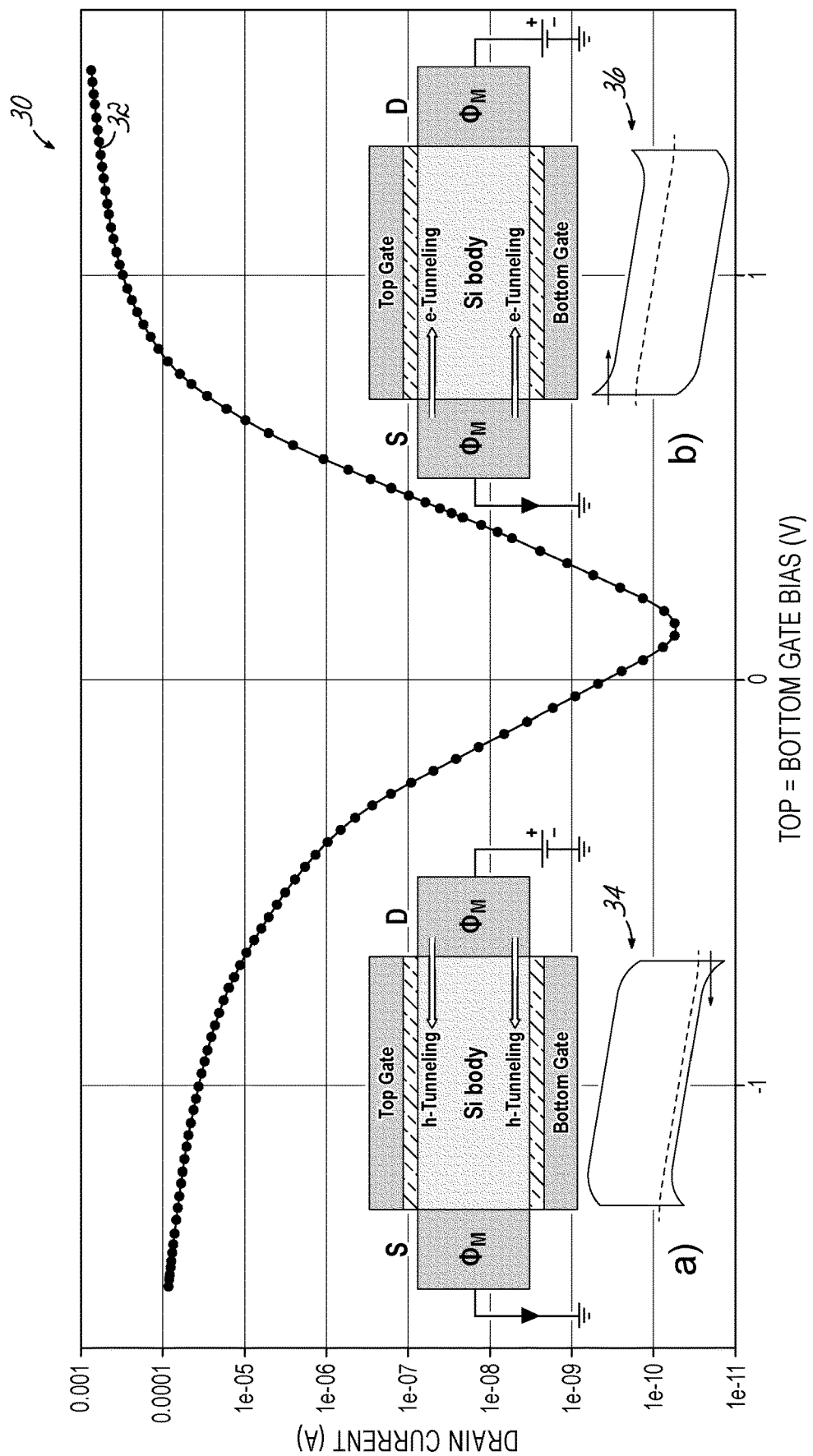
FIG. 2 is a graphical view illustrating an exemplary drain current verses gate bias for the device of FIG. 1.

FIG. 2 depicts a graph 30 including a plot 32 of drain current verses gate voltage for a p-channel version of the ambipolar SB-MOSFET device 10 having contact work-functions $\phi$ larger than mid-gap (e.g., $\phi>4.6$ eV for silicon) for the source and drain contacts. It should be understood that although the term "source" typically indicates a source of charge carriers (electrons for n-channel and holes for p-channel devices) that flow through the device body, and the term "drain" generally indicates a location where the charge carriers leave the channel, these terms may be used interchangeably in certain embodiments. For example, due to device symmetry and sourcing of electrons or holes at the same end of the device body through which holes or electrons also leave the channel, the terms "drain" and "source" may be somewhat arbitrary as used with respect to the ambipolar devices described herein. Thus, the terms source and drain may be interpreted as merely identifying opposing ends of the body of the device between which current is conducted.

As illustrated by the conduction band diagrams 34, 36, a work-function that is larger than mid-gap may lower the barrier height for holes and increase the barrier height for electrons. One design issue with SB-MOSFETs that may have caused them to be overlooked for use in logic circuits is that SB-MOSFETs can exhibit additional series resistance as compared to a conventional MOSFET. This additional series resistance may be associated with tunneling and can result in a reduced on-current $I_{ON}$ that prevents longer gate length SB-MOSFETs from matching the performance of dominant p/n junction FinFET switches in conventional logic circuits. Unexpectedly, this situation can reverse in sub-10 nm operation in which the off-current $I_{OFF}$ is reduced by the tunneling barrier. This reduced off-current $I_{OFF}$ increases the overall $I_{ON}/I_{OFF}$ ratio in SB-MOSFETs so that they are suitable for use in logic circuits. Advantageously, the lower $I_{ON}$ may also result in reduced heating of the device as compared to conventional devices.

As can be seen from plot 32, an asymmetry may exist between the on-current $I_{ON}$ for positive gate biasing as compared to negative gate biasing. An asymmetry may also exist regarding the voltage at which the minimum current bias is reached. As described below, these asymmetries may be addressed by adjusting the work-functions of the source, drain, or gate.

Figure 3:
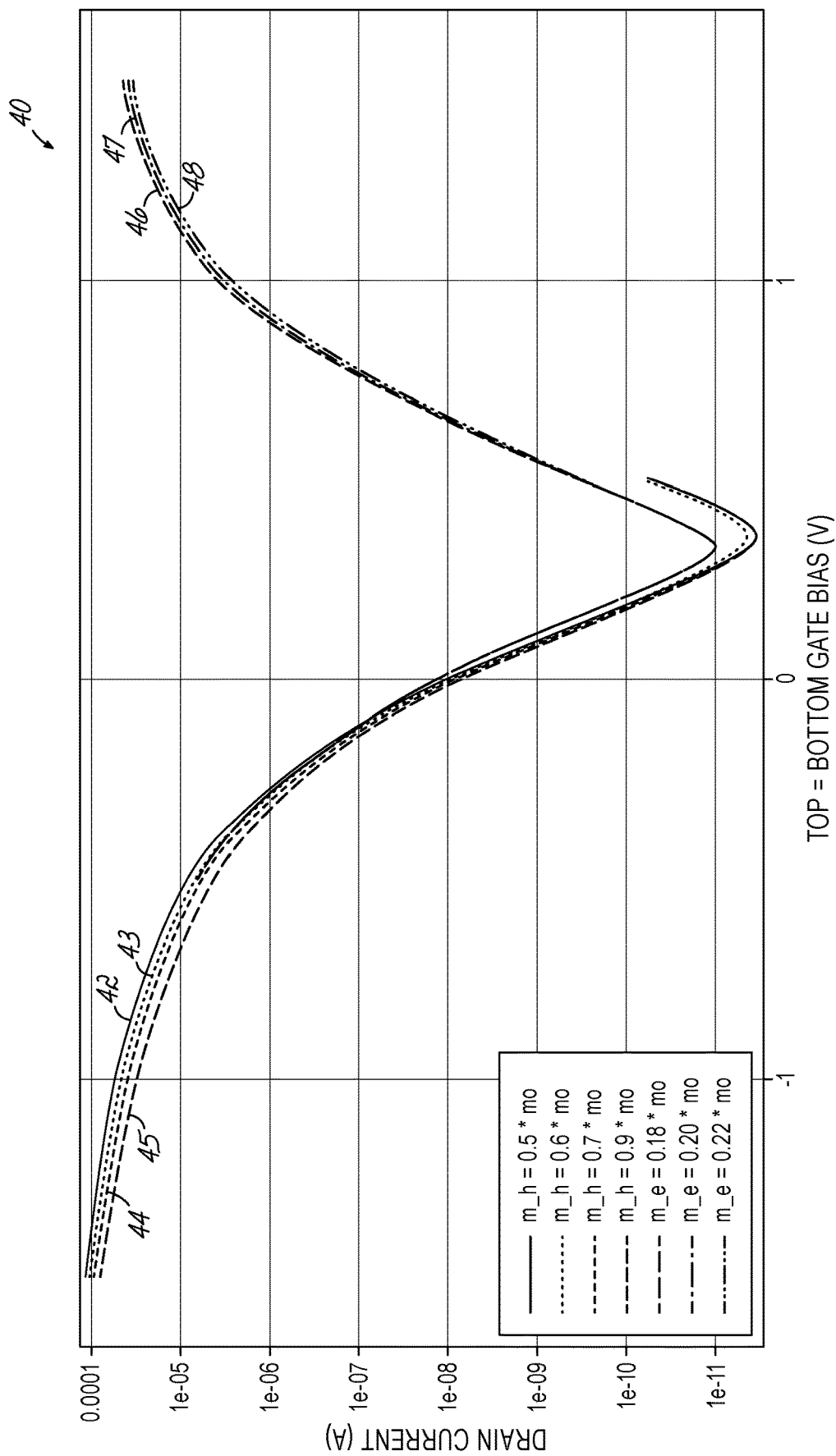
FIG. 3 is a graphical view illustrating hole and electron drain currents verses gate bias for the device of FIG. 1 for holes and electrons having different effective masses.

Additional design considerations may be used to optimize performance of the device 10. For example, FIG. 3 depicts a graph 40 including plots 42-48 of drain current verses gate voltage of a p-channel device for various effective electron masses $m_e^*$ and hole masses $m_h^*$ injected into the semiconductor layer 12 through the source contact 17 and drain contact 18 barriers. Different silicide alloys may be used for the source and drain contacts 17, 18 to vary the nature of the interface between the contacts 17, 18 and semiconductor layer 12. Thus, the values of the effective election masses $m_e^*$ and hole masses $m_h^*$ may be difficult to determine. Due to quantum-mechanical quantization, lower transverse effective mass of silicon X-valleys and lower effective hole masses $m_h^*$ may be preferred. The higher hole mobility along the [011] direction may provide a reason to use a lighter hole mass $m_h^*$. In any case, and as can be seen from the plots 42-48, variations in the effective carrier masses $m_e^*$ and $m_h^*$ do not in general dramatically alter the simulated I-V characteristics of SB-MOSFETs. For the simulations described below with respect to FIGS. 5-12, an effective electron mass of $m_e^*=0.2$ and an effective hole mass $m_h^*=0.9$ have been used unless indicated otherwise.

As shown in the following figures, dark shading of the device body generally indicates a semiconductor that operates by way of a depletion mode (e.g., that is doped or otherwise intrinsically conductive), and light shading of the device body generally indicates a semiconductor that operates by way of an enhancement mode (e.g., that is undoped or otherwise intrinsically non-conductive). In addition, the presence of a small circle at the input of a gate generally indicates p-channel depletion/enhancement, and the absence of the small circle generally indicates n-channel depletion/enhancement. Thus, a device having a circle on the gate and light shading in the body adjacent to the gate would indicate p-channel enhancement mode operation for that gate, a device not having a circle on the gate and light shading in the body adjacent to the gate would indicate n-channel enhancement mode operation for that gate, a device having a circle on the gate and dark shading in the body adjacent to the gate would indicate p-channel depletion mode operation for that gate, and a device not having a circle on the gate and having dark shading in the body adjacent to the gate would indicate n-channel depletion mode operation for that gate.

Figure 4:
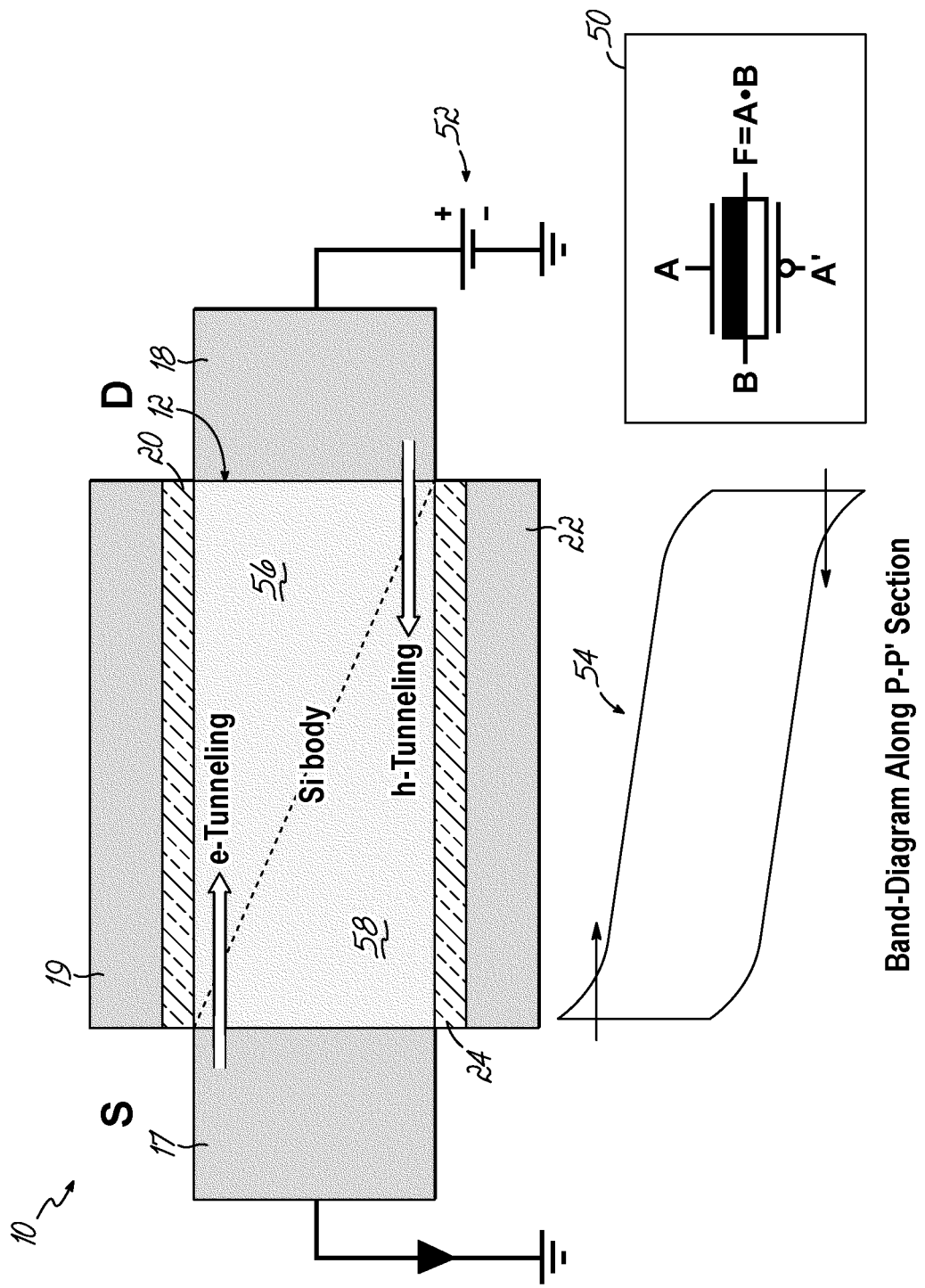
FIG. 4 is a diagrammatic view of a single-transistor pass-gate device configured to provide an AND logic operation based on the device of FIG. 1.

FIG. 4 depicts an exemplary embodiment of device 10 configured to provide an AND logic function 50. To this end, a voltage source 52 may be coupled across the drain and source of the device 10 to provide a positive drain-to-source voltage $V_{DS}$. A band diagram 54 shows how the carrier density, which may be optimized for logic performance, varies along the length of the semiconductor layer 12. The work-function of the semiconductor layer 12 proximate to the source contact 17 may be shifted toward the valance band (e.g., to 4.90 eV) by the source contact 17 to obtain a similar on-current $I_{ON}$ for both a top channel 56 and a bottom channel 58 of semiconductor layer 12. This feature may be used to address differences in the effective masses of elections and holes for tunneling and the density of states between electrons and holes.

Figure 5:
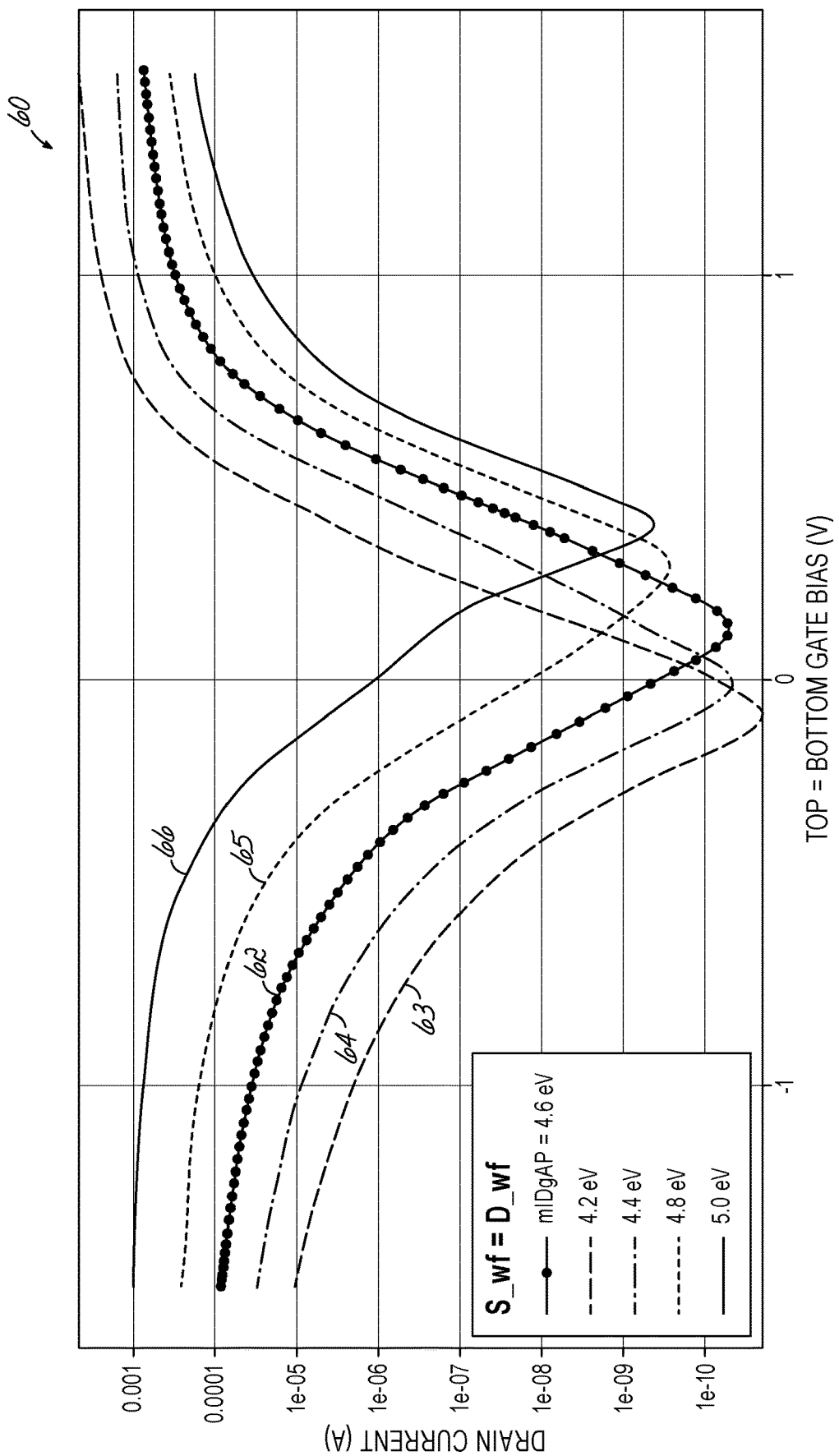
FIG. 5 is a graphical view illustrating drain current verses gate bias using different source and drain work-functions for the device of FIG. 1.

Simulation results have been obtained for logic circuits utilizing a simplistic drift-diffusion model using TCAD as a proof-of-concept for gate work-function engineering. FIG. 5 depicts a graph 60 including plots 62-66 of drain current verses gate bias voltage for a drain to source voltage $V_{DS}=0.5V$ for a plurality of source and drain work-functions. The plots 62-66 show that without compensation, the difference in the effective masses for tunneling and density of states between electrons and holes can result in up to two orders of magnitude difference in $I_{ON}$ for the hole and electron currents. However, the apparent uneven ambipolar behavior resulting from mid-gap contacts having similar barrier heights may be compensated for by adjusting the source and drain work-functions to lower barriers in favor of holes, raise barriers against electrons, or both.

Figure 6:
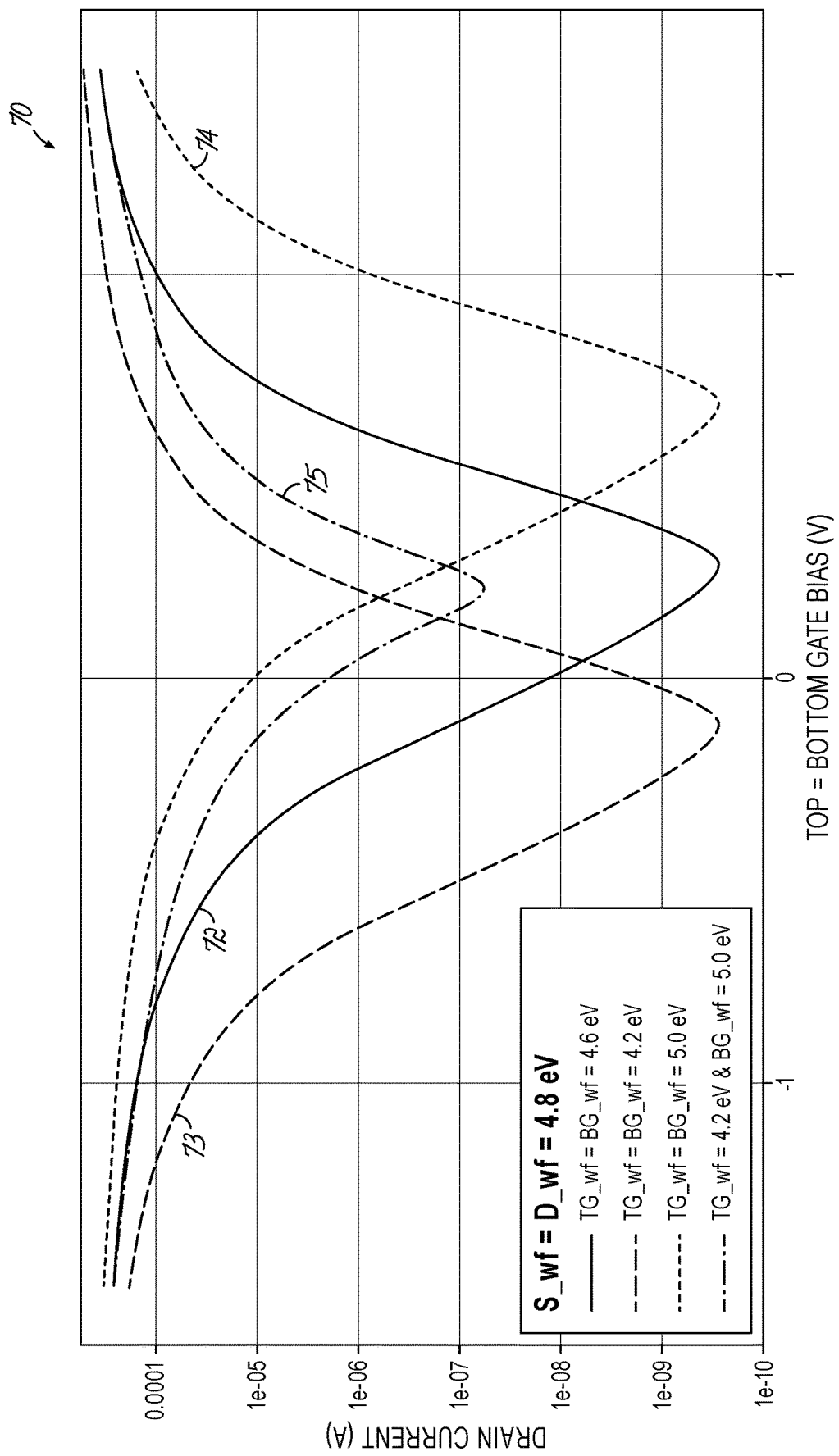
FIG. 6 is a graphical view illustrating drain current verses gate bias using different gate work-functions for the device of FIG. 1.

FIG. 6 depicts a graph 70 including plots 72-75 of drain current verses gate bias voltage for a plurality of gate work-functions, and show that top and bottom gate electrodes 19, 22 may be "electrostatically biased" to lower thresholds. This lowering of thresholds to prefer injection of one type of carrier over another may be achieved by choosing different work-functions for each gate, e.g., 4.2 eV for the top gate electrode 19 verses 5.0 eV for the bottom gate electrode 22. Electrostatically biasing the gate electrodes 19, 22 by adjusting their work-functions can be achieved, for example, with gate engineering (e.g., using epitaxial growth, Atomic Layer Deposition (ALD), or Chemical Vapor Deposition (CVD) processes), especially if a lateral double-gate architecture is implemented. The resulting gate-wise asymmetric device may be subject to Drain Induced Barrier Lowering (DIBL) related shifts in I-V curves and current imbalances. As a result, it may be advantageous to keep $V_{DS} \approx V_{DD}/2$ (e.g., 0.5V) throughout the optimization to balance logic switching performance, where $V_{DD}$ is a positive voltage indicative of a logic level "1" or "logic level high voltage", and another voltage is indicative of a logic level "0" or "logic level low voltage", e.g., $V_{SS}$ or ground.

Figure 7:
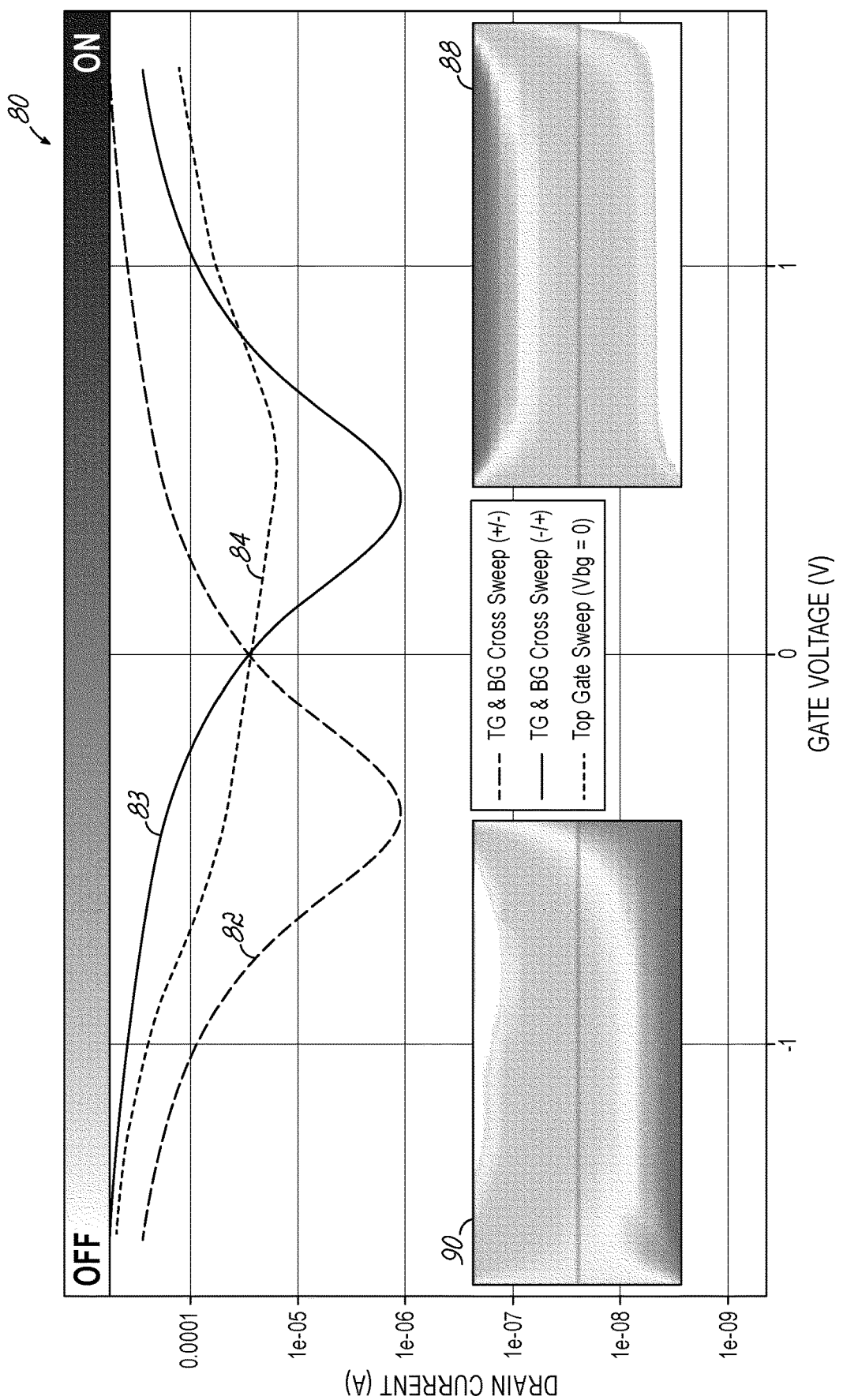
FIG. 7 is a graphical view illustrating current densities in the semiconductor layer of the device of FIG. 1.

FIG. 7 depicts a graph 80 having plots 82-84 and heat maps 88, 90 illustrating the results of a simulation for the above described SB-FinFET with parameters optimized for conjugate (i.e., n-channel and p-channel) dual channels. These parameters include a top gate electrode 19 configured for electron tunneling/conduction and a bottom gate electrode 22 configured for hole tunneling/conduction. Heat map 88 shows electron current densities along the length of the semiconductor layer 12, and heat map 90 shows hole current densities along the length of the semiconductor layer 12.

Figure 8:
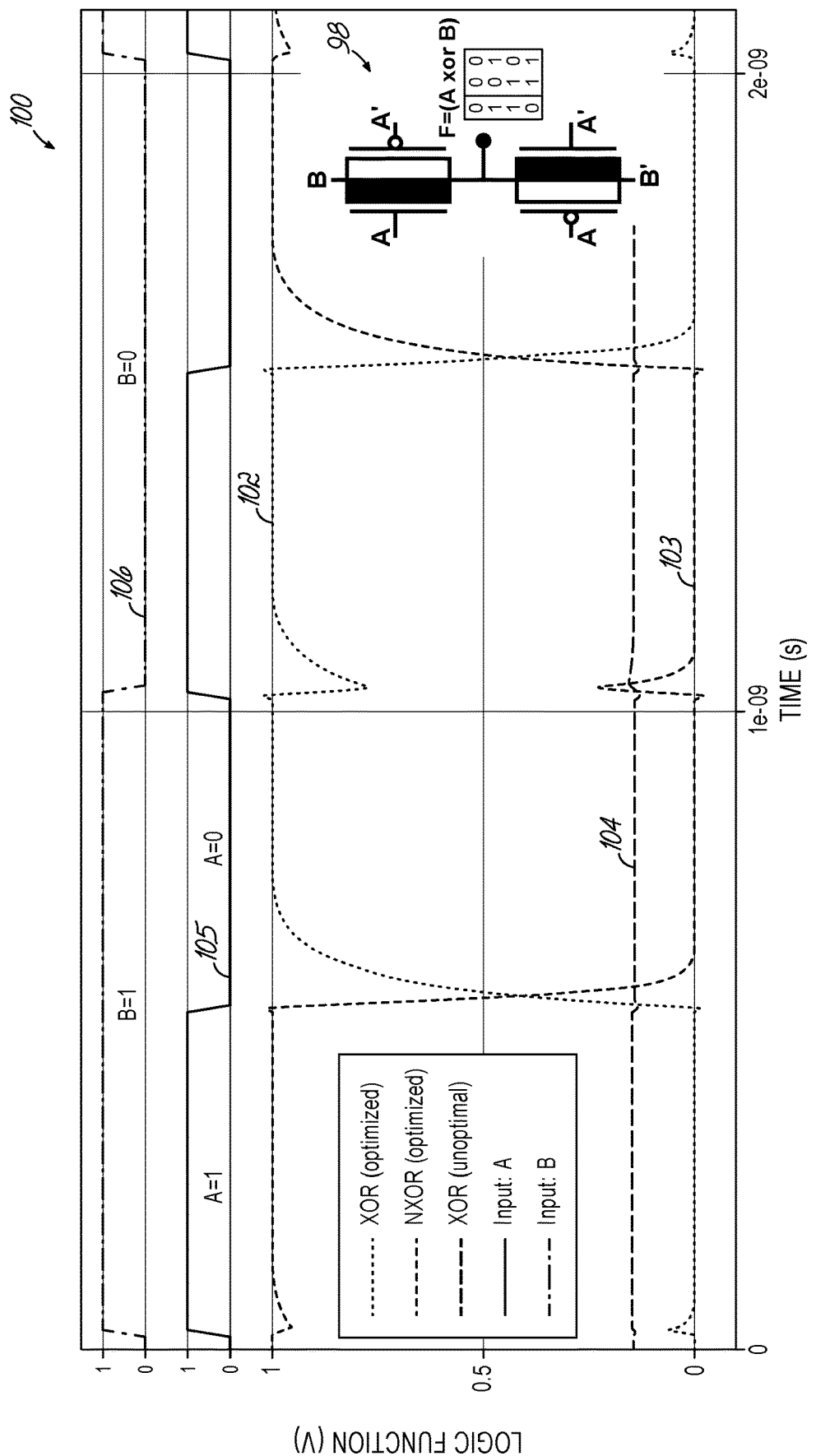
FIGS. 8 and 9 are graphical views illustrating a simulated performance of a logic circuit based on the device of FIG. 1.
Figure 9:
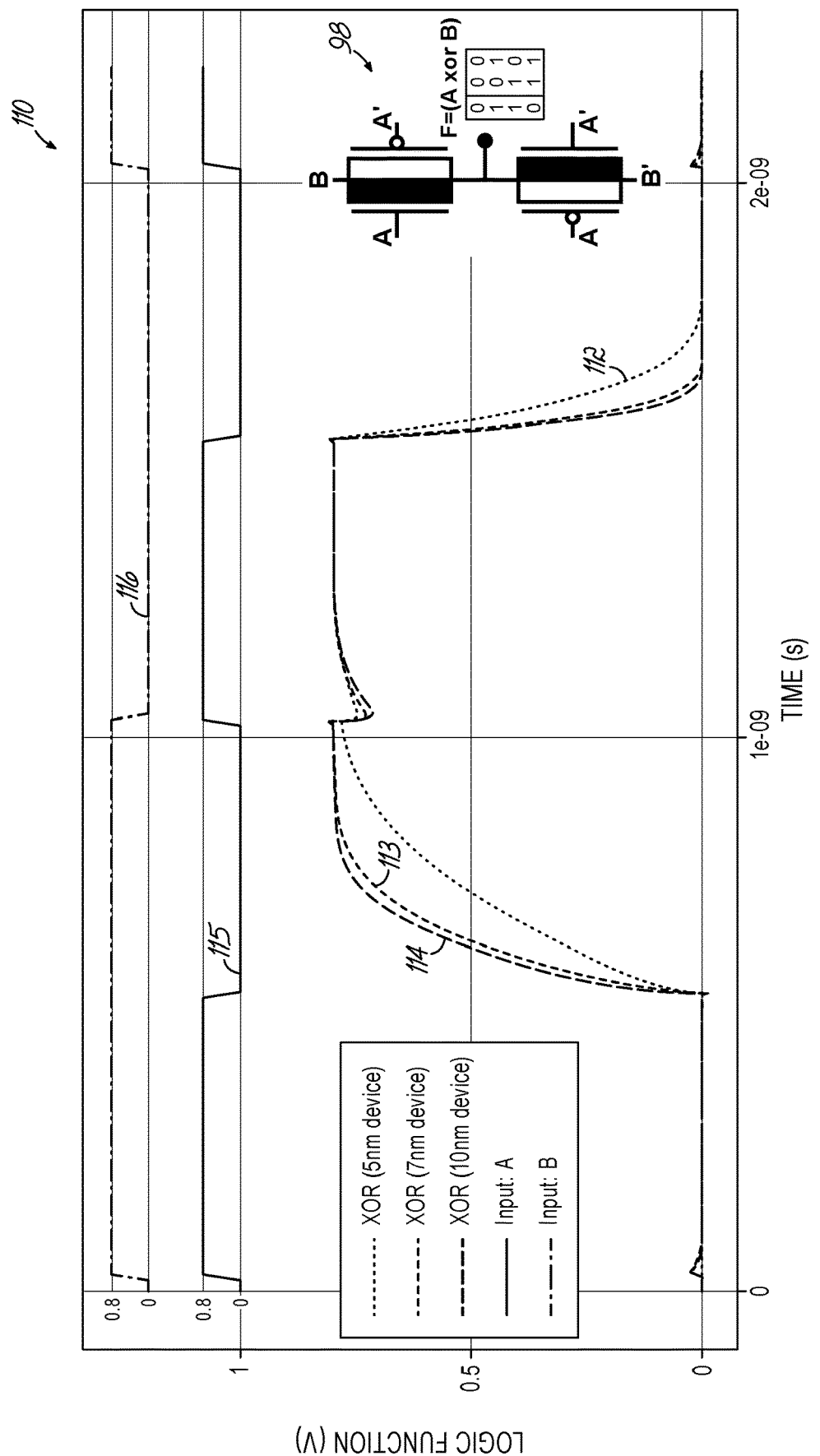

The simulated results depicted in FIGS. 8 and 9 illustrate operation of an ambipolar FinFET pass-gate device that may be used to build a 2T XOR/NOR logic circuit 98. FIG. 8 depicts a graph 100 including plots 102-106 that show the logic output for an optimally designed XOR/XNOR logic circuit 98 (plots 102 and 103, respectively) using 10 nm ambipolar FinFET pass-gate devices. The results show correctly and evenly switching XOR/XNOR logic circuits. In contrast, an un-optimized device (plot 104) fails to deliver the same output as the optimized gates. FIG. 9 depicts a graph 110 including plots 112-116 that illustrate XOR logic circuit function for the optimized device of FIG. 8 with gate lengths of $L_G=10$ nm (plot 112), $L_G=7$ nm and $t_{SL}=3$ nm (plot 113), and $L_G=5$ nm and $t_{SL}=2$ nm. As can be seen from the plots, the XOR logic circuits operate with similar performance at $V_{DD}=0.8V$.

The above results demonstrate that work-function engineering can be used to alter the threshold voltage of a given ambipolar n/p-channel SB-FinFET. Following the same strategy to optimize device channel thresholds as described above but keeping top and bottom gate work-functions the same, low and high threshold voltage $V_t$ devices for both n-channel MOSFET (nMOS) and p-channel (pMOS) SB-FinFETs may be obtained. In some cases, threshold voltages for n-channel devices may be indicated by $V_{tn}$, and threshold voltages for p-channel devices may be indicated by $V_{tp}$.

Figure 10:
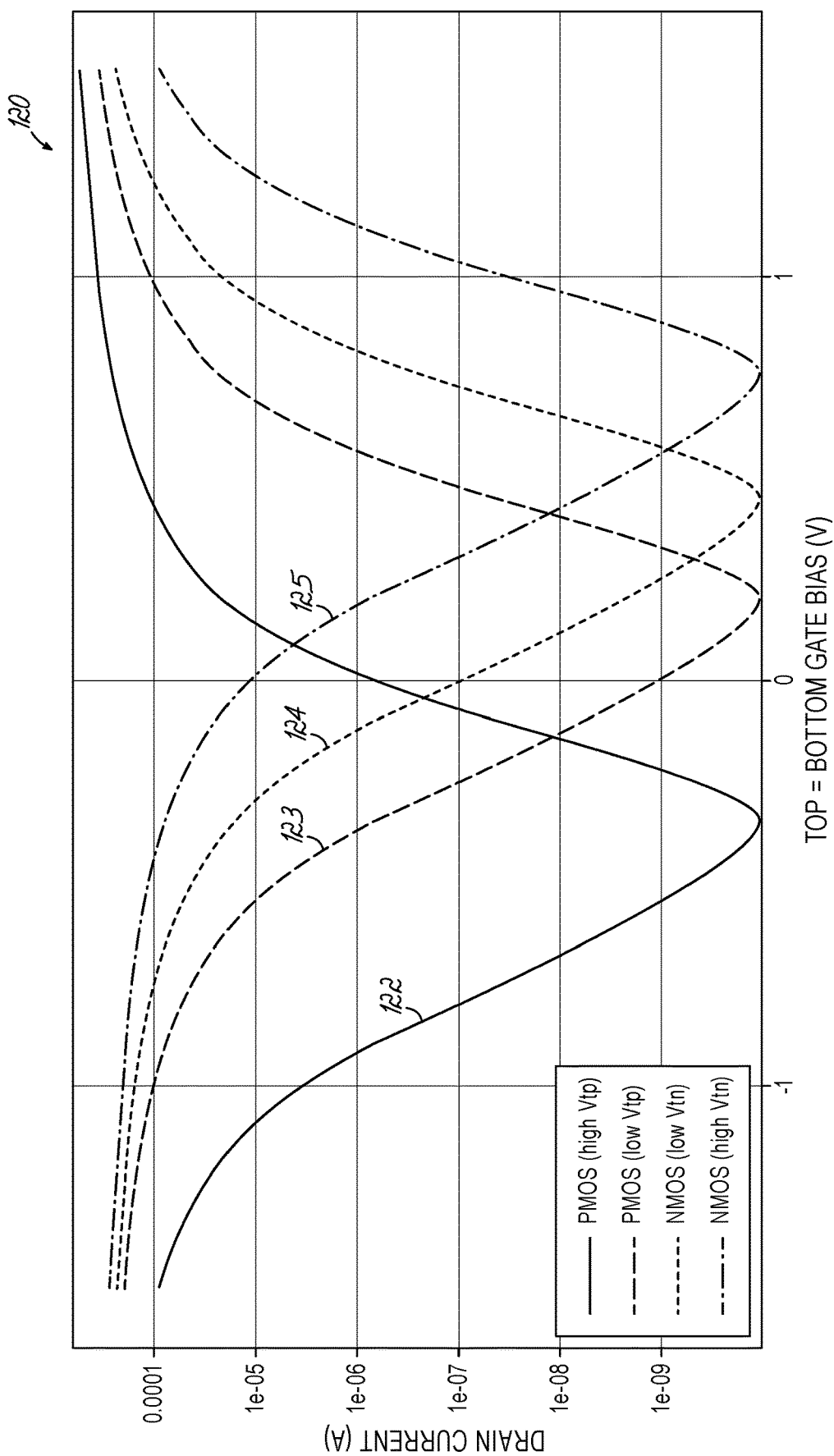
FIG. 10 is a graphical view illustrating drain current verses gate bias for the device of FIG. 1 optimized for different functions.

FIG. 10 depicts a graph 120 including plots 122-125 that illustrate simulated drain current $I_D$ verses gate voltage $V_G$ for four different devices each optimized for a specific function. Plot 122 shows the $I_D/V_G$ relationship for a high $V_t$ pMOS device with top gate and bottom gate work-functions $\phi_{TG}=\phi_{BG}=4.80$ eV. Plot 123 shows the $I_D/V_G$ relationship for a low $V_t$ pMOS device with top gate and bottom gate work-functions $\phi_{TG}=\phi_{BG}=5.10$ eV. Plot 124 shows the $I_D/V_G$ relationship for a low $V_t$ nMOS device with top gate and bottom gate work-functions $\phi_{TG}=\phi_{BG}=4.00$ eV. Plot 125 shows the $I_D/V_G$ relationship for a high $V_t$ nMOS device with top gate and bottom gate work-functions $\phi_{TG}=\phi_{BG}=4.55$ eV. Based on the simulated I-V curves, it can be seen that the characteristics of SB-FinFET devices may be shifted steadily from left to right as the work-functions are moved from near mid-gap values (e.g., ~4.6 eV for silicon) toward the band edges. Thus, gate work-function engineering may be used to create distinct n and p-channel FinFETs with high and low threshold voltages.

A single high-$V_t$ n-channel independent gate FinFET may be utilized as an AND logic pull-down element that only conducts if both gates are biased with a positive voltage equivalent to a logic level high voltage, e.g., a voltage near $V_{DD}$. This may provide a compact 2T NAND logic circuit having both reduced power consumption (e.g., by 40%) and reduced delay (e.g., by 10%) as compared to standard CMOS circuits in a minimal logic circuit configuration, i.e., using a single device. A similar configuration can be made for a pMOS pull-up network by replacing two series pMOS devices with a single independent-gate high-$V_t$ p-channel SB-FinFET.

The thickness $t_{OX}$ of the dielectric layers 20, 24 may also be varied to adjust for high-$V_t$. In some cases, adjusting the gate insulator thickness parameter to control $V_t$ may be impractical or provide sub-optimal performance. In these cases, it may be preferred to leave the dielectric thickness constant and optimize the I-V characteristics by selecting appropriate gate work-functions.

Figure 11:
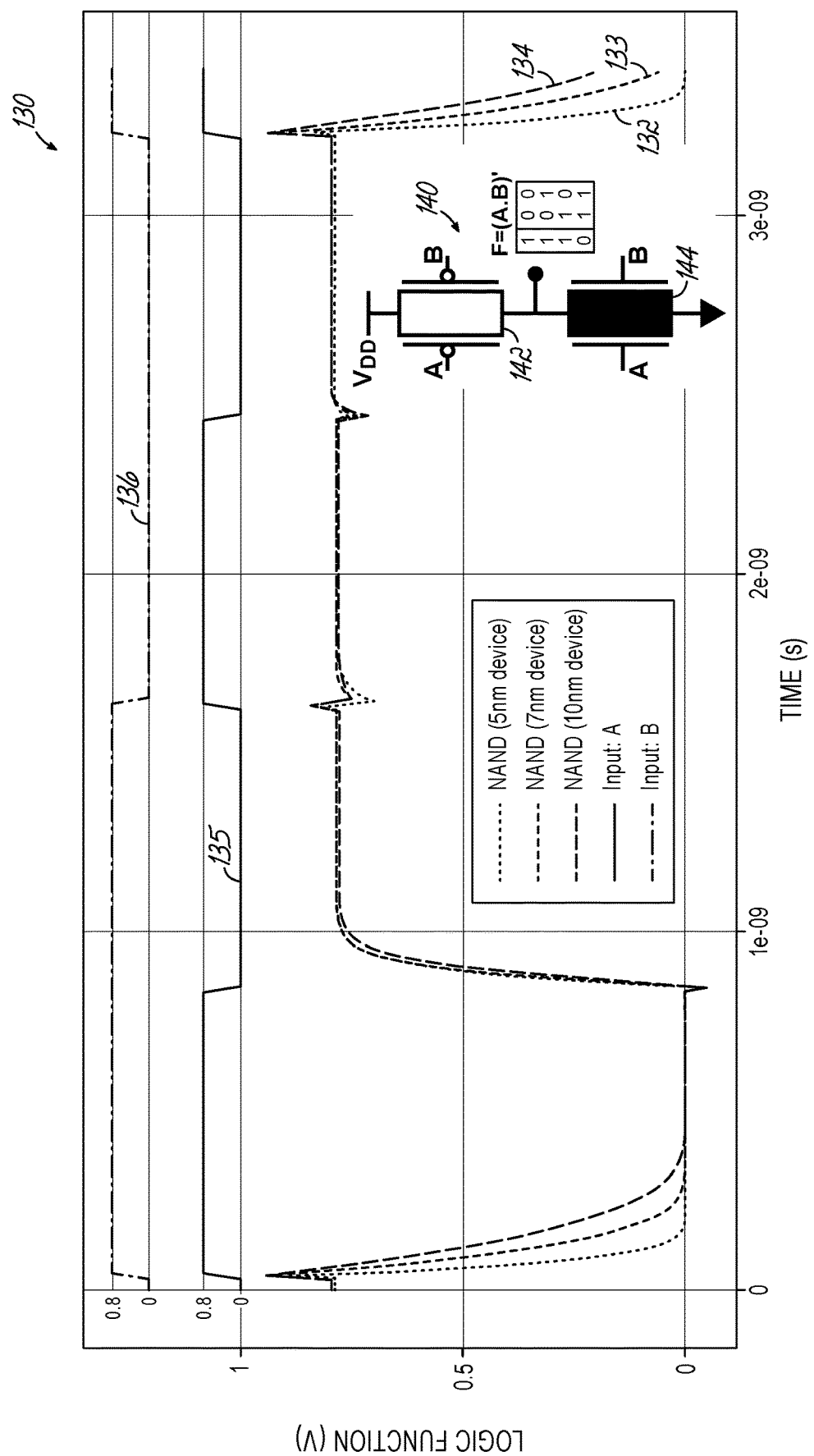
FIGS. 11 and 12 are graphical views illustrating a simulated performance of another logic circuit based on the device of FIG. 1.
Figure 12:
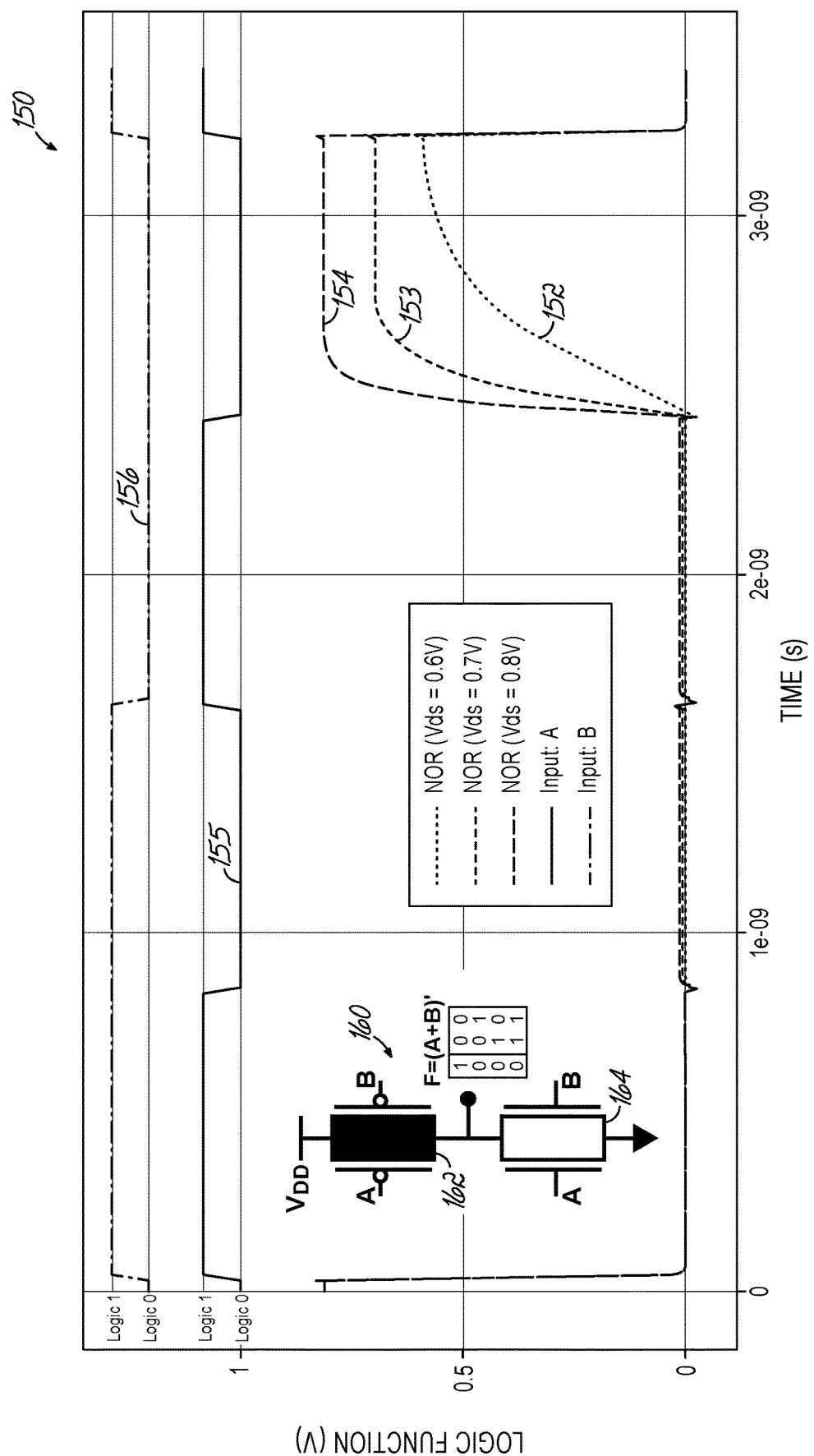

FIGS. 11 and 12 present simulation results illustrating the performance of logic circuits implemented using the above described sub-10 nm SB-FinFET devices. FIG. 11 depicts a graph 130 including plots 132-136 that show the logic inputs and outputs for an optimally designed NAND logic circuit 140 using 5 nm, 7 nm, and 10 nm gate lengths. The NAND logic circuit 140 includes a SB-FinFET 142 with a low-$V_t$ and a SB-FinFET 144 with a high-$V_t$ in a series configuration. FIG. 12 depicts a graph 150 including plots 152-156 that show NOR logic circuit function at drain to source voltages of 0.6 volts (plot 152), 0.7 volts (plot 153), and 0.8 volts (plot 154) for the a NOR logic circuit 160 comprising a SB-FinFET 162 with a high-$V_t$ in a series configuration with a SB-FinFET 164 with a low-$V_t$. In each case, the logic circuits were found to operate correctly with supply voltages as low as 0.6 V and gate lengths as short as 5 nm using the same work-functions. The optimization was thereby determined to be valid for a relevant and practical range of devices and operating conditions.

The simulations described below with respect to FIGS. 13-20 provide a detailed analysis based on first-order quantum mechanical corrections using a Density-Gradient approach. This may allow a more accurate selection of gate work-functions for logic operation as compared to the drift-diffusion model used above. For a given set of device dimensions, the carrier quantization and modifications to the channel and barrier potentials may be accounted for to increase the accuracy of the device design. This level of accuracy may be achieved to a large degree using density-gradient corrections implemented in the TCAD suite. Carrier injection through the source and drain contacts may be modeled using an energy-dependent barrier tunneling model in TCAD that utilizes a Wentzel-Kramers-Brillouin (WKB) model to calculate tunneling rates. The below simulation results utilize a broader range of source and drain work-function $\phi_S$, $\phi_D$ and device dimensions that provide practical circuit examples. An effective electron mass of $m_e^*=0.2$ and an effective hole mass $m_h^*=0.6$ were used to obtain the below results unless indicated otherwise.

As described above with respect to FIG. 4, in an optimized SB-FinFET, two distinct ambipolar channels 56, 58 may form in semiconductor layer 12, one proximate each gate electrode 19, 22. For an optimized SB-FinFET having a 7 nm gate length L, a change in device ON/OFF switching states with three orders of magnitude difference may be seen. A one-transistor (1T) ambipolar pass-gate device may be optimized using gate work-function engineering with two independently-driven gates. This type of device may be used to build very compact CMOS designs. In the design process, the source and drain work-functions $\phi_S$, $\phi_D$ may be shifted toward valance band (e.g., approximately 4.90 eV for silicon) in order to obtain similar on-currents $I_{ON}$ for both channels 56, 58. Shifting the source and drain work-functions $\phi_S$, $\phi_D$ before adjusting other parameters may be advantageous as a design approach since a large difference between the effective electron mass $m_e^*$ and effective hole mass $m_h^*$ for quantization, tunneling, and density of states can result in a two order of magnitude difference in on-currents $I_{ON}$. As previously discussed with respect to FIG. 5, a drain to source voltage $V_{DS}=0.5$V and a work-function of 4.90 eV at both the source and drain gives almost equal n-channel and p-channel currents. The top and bottom gate electrodes 19, 22 may be electrostatically biased to lower the thresholds for injection of either type of carrier by choice of opposing work-functions, e.g., $\phi_{TG}=3.7$ eV and $\phi_{BG}=5.3$ eV.

Figure 13:
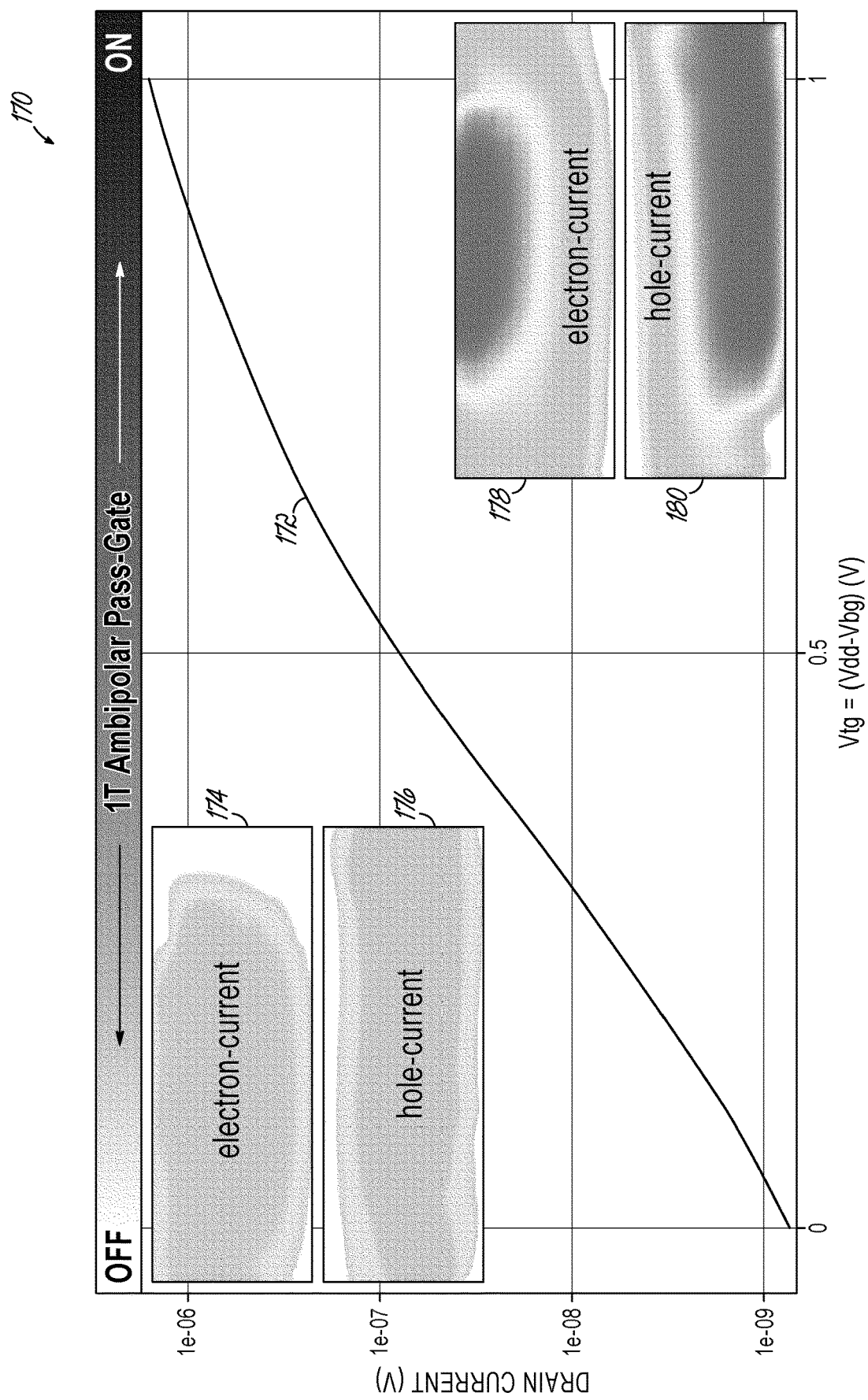
FIG. 13 is a graphical view illustrating current densities in the semiconductor layer of another embodiment of the device of FIG. 1.
Figure 14:
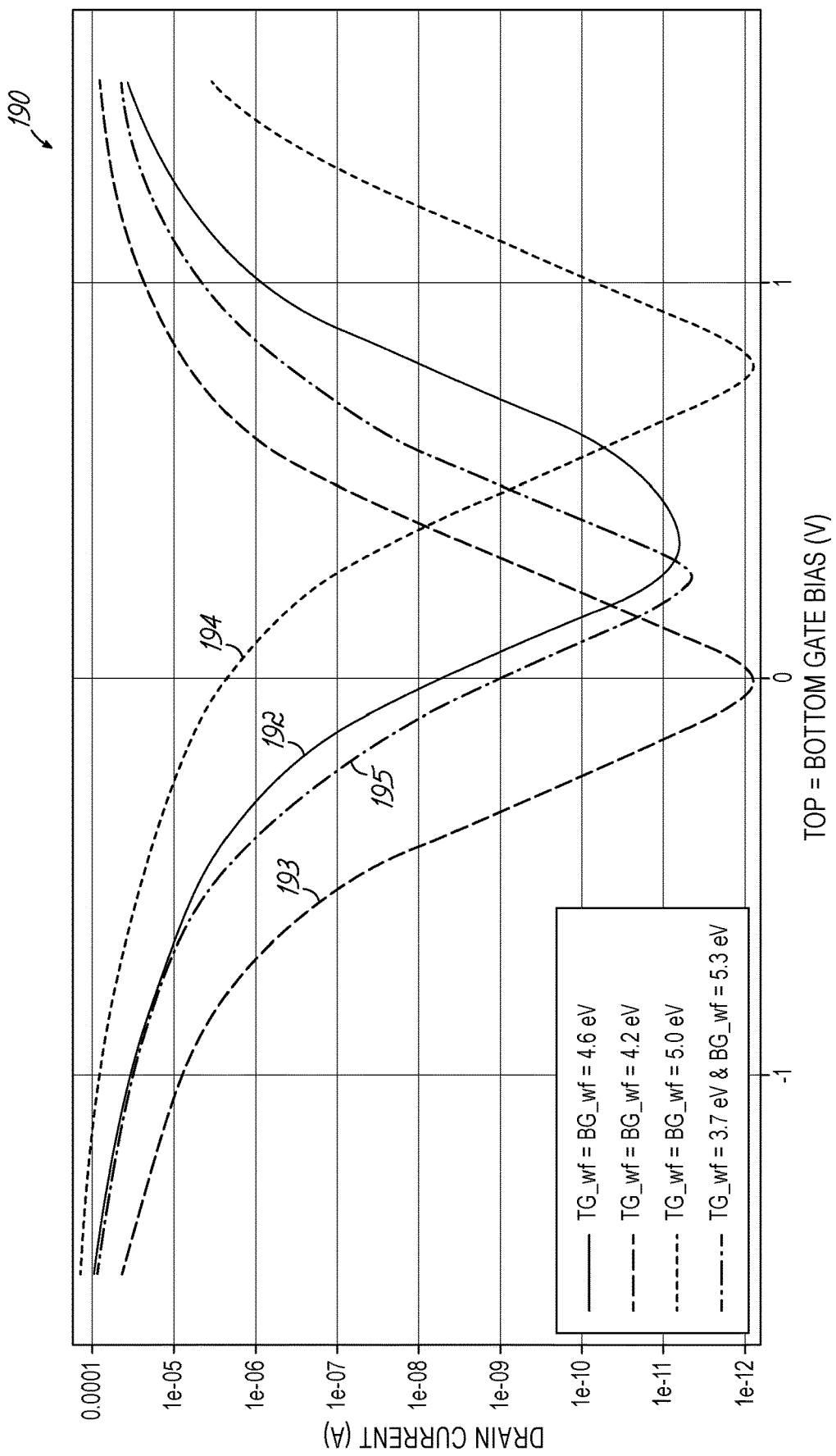
FIG. 14 is a graphical view illustrating drain current verses gate bias using different gate work-functions for another embodiment of the device of FIG. 1.

FIG. 13 depicts results of a simulation of a pass-gate device using an optimized 7 nm ambipolar 1T device that includes corresponding electron and hole current densities in ON and OFF cases for a drain to source base voltage $V_{DS}=1.0$V. The results are presented in the form of a graph 170 having a plot 172, a heat maps 174, 176 showing electron and hole current densities, respectively, in the semiconductor layer 12 with the pass-gate device in an OFF state, and heat maps 178, 180 showing the electron and hole current densities, respectively, in the semiconductor layer 12 with the pass-gate device in an ON state FIG. 14 depicts a graph 190 including plots 192-195 of drain current verses gate bias voltage for a plurality of gate work-function combinations that electrostatically biased the device to lower voltage thresholds $V_t$. Plot 192 depicts the drain current verses gate voltage for top gate and bottom gate work-functions $\phi_{TG}=\phi_{BG}=4.6$ eV. Plot 193 depicts the drain current verses gate voltage for top gate and bottom gate work-functions $\phi_{TG}=\phi_{BG}=4.2$ eV. Plot 194 depicts the drain current verses gate voltage for top gate and bottom gate work-functions $\phi_{TG}=\phi_{BG}=5.0$ eV. Plot 195 depicts the drain current verses gate voltage for top gate work-function $\phi_{TG}=3.7$ eV and bottom gate work-function $\phi_{BG}=5.3$ eV.

As noted above, an ambipolar pass-gate device may be vulnerable to significant changes in the tunneling currents due to drain-induced lowering of Schottky barriers at the source and drain contacts, which can alter tunneling currents exponentially. Thus, although $V_{DS}=V_{DD}/2=0.5V$ has been used to obtain the results in FIGS. 5 and 14, this drain to source voltage may not be necessarily the best choice for a given logic switching performance. By way of example, some experimental results indicate that logic circuits may be optimized using a bottom gate work-function $\phi_{BG}=5.0$ eV.

Figure 15:
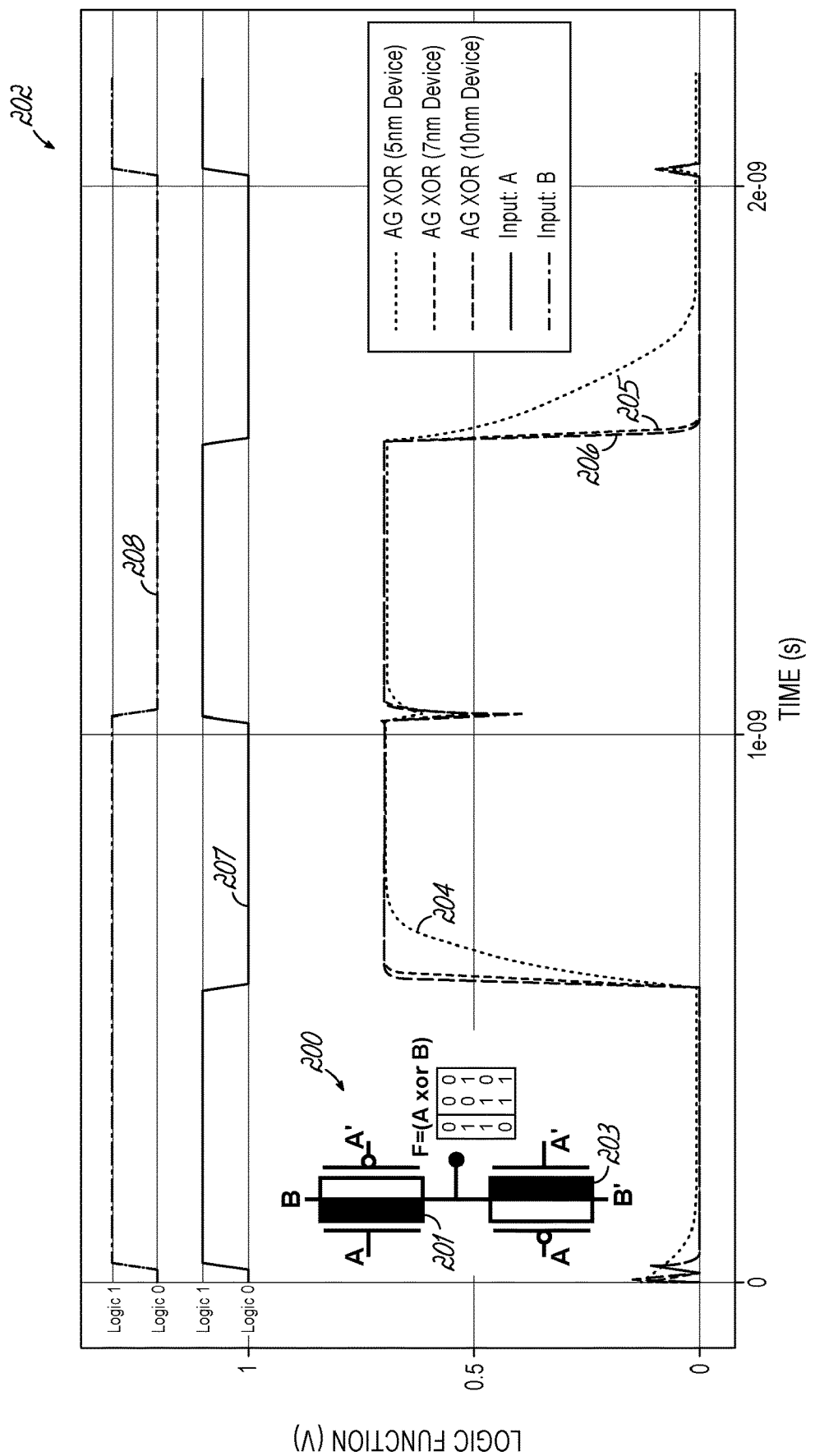
FIGS. 15 and 16 are graphical views illustrating a simulated performance of yet another logic circuit based on the device of FIG. 1.
Figure 16:
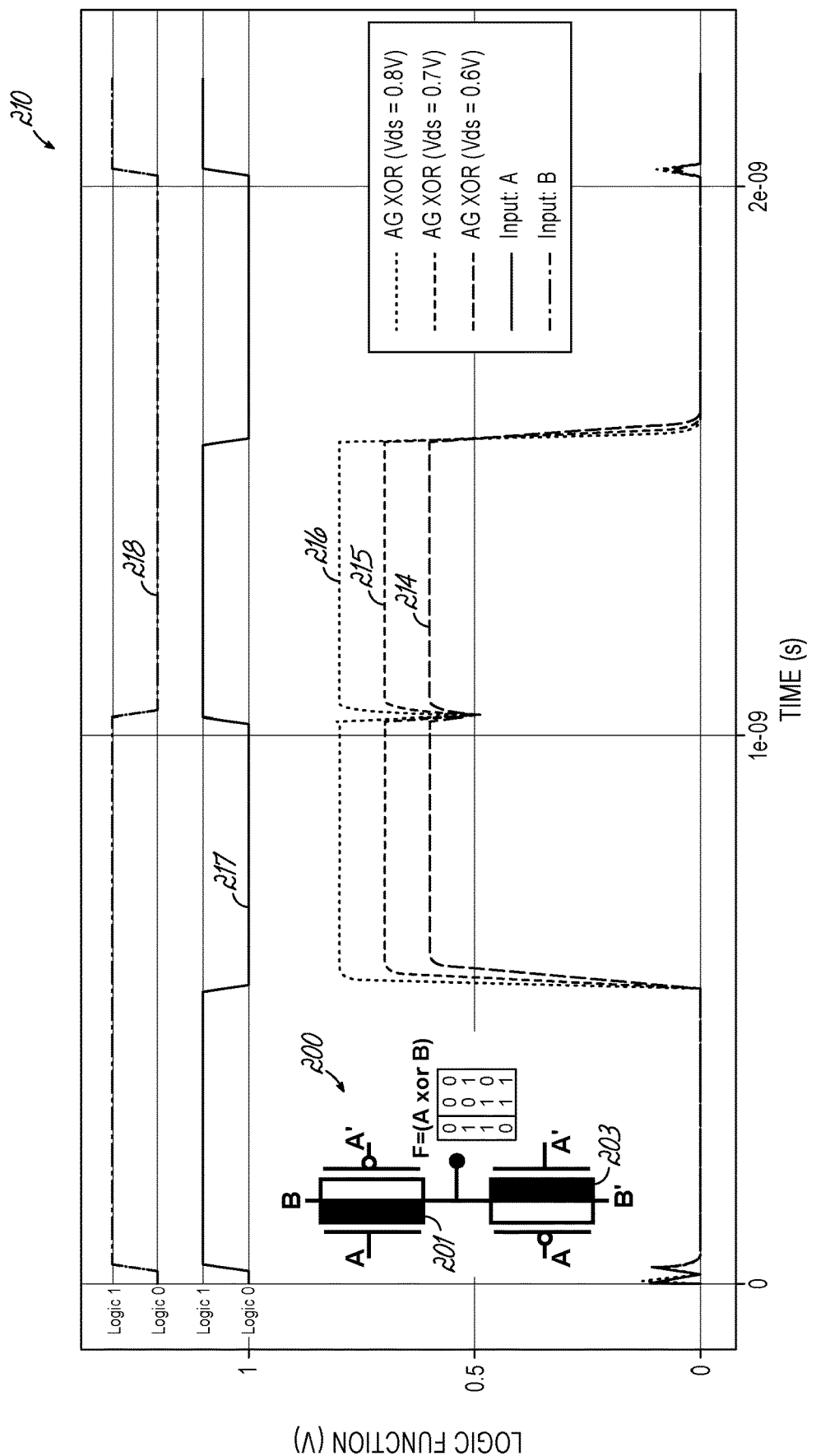

The simulated results depicted in FIGS. 15 and 16 verify operation of an ultra-compact 2T XOR/XNOR logic circuit 200 built using ambipolar FinFET pass-gate devices 201, 203. FIG. 15 depicts a graph 202 including plots 204-208 that show logic inputs and outputs for optimally designed XOR/NOR logic circuits. Plots 204-206 show the output of the logic circuit 200 using 5 nm ($t_{SL}=4$ nm), 7 nm ($t_{SL}=3$ nm), and 10 nm ambipolar FinFET pass-gate devices 201, 203, respectively, with a supply voltage of 0.7 volts. The results show a correctly and evenly switching XOR/NOR logic circuit 200.

FIG. 16 depicts a graph 210 including plots 214-218 that show logic inputs and outputs for the circuit 200 for supply voltages $V_{DD}$ of 0.6 volts (plot 214), 0.7 volts (plot 215), and 0.8 volts (plot 216) for input signals A (plot 217) and B (plot 218). The plots 214-216 show that the circuit 200 operates with similar conviction at $0.6<V_{DD}<0.8V$. The exemplary logic circuit 200 built using 1T ambipolar FinFET pass-gate devices 201, 203 and XOR/XNOT functionality has significant advantages over known logic circuits. For example, the 1T ambipolar FinFET pass-gate devices 201, 203 may be utilized to dramatically reduce transistor counts and device area for a wide variety of logic functions where pass-gate logic circuits are preferred, such as full adders and multiplexers.

Figure 17:
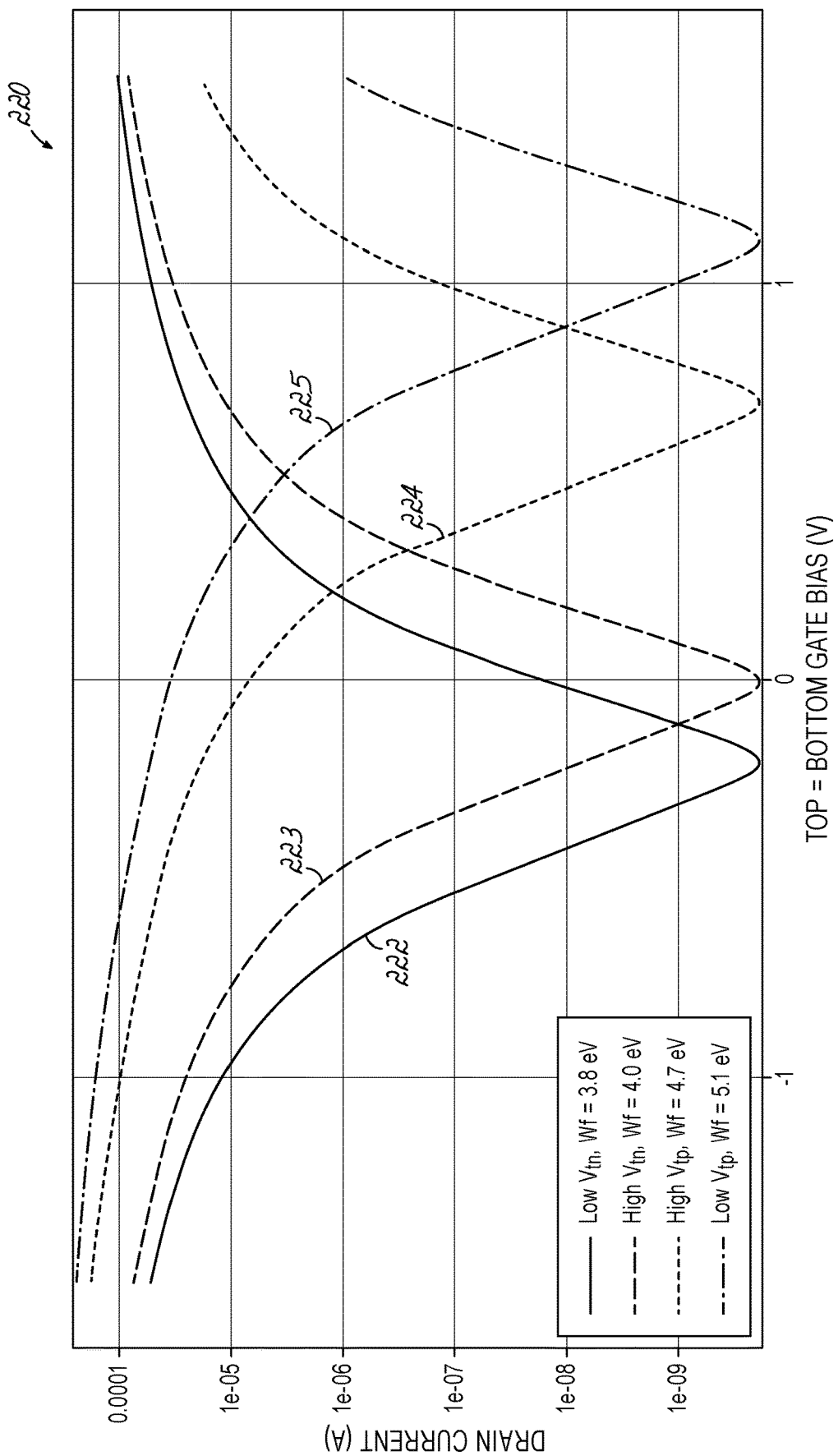
FIG. 17 is a graphical view illustrating drain current verses gate bias for the device of FIG. 1 optimized for different functions.

FIG. 17 depicts a graph 220 including plots 222-225 that show simulated drain current $I_D$ verses gate voltage $V_G$ for four different devices each optimized for a specific function, and takes into account quantum mechanical corrections for thin-body via density-gradient approach. Taking quantum mechanical corrections into account in this manner may provide a more accurate analysis of ambipolar device operation for nMOSFET and pMOSFET branches in the $I_D/V_G$ characteristics and shows that the ambipolar device action remains intact with this more accurate simulation.

Plot 222 shows the $I_D/V_G$ relationship for a low $V_t$ nMOS device with top gate and bottom gate work-functions $\phi_{TG}=\phi_{BG}=3.8$ eV. Plot 223 shows the $I_D/V_G$ relationship for a high $V_t$ nMOS device with top gate and bottom gate work-functions $\phi_{TG}=\phi_{BG}=4.0$ eV. Plot 224 shows the $I_D/V_G$ relationship for a high $V_t$ pMOS device with top gate and bottom gate work-functions $\phi_{TG}=\phi_{BG}=4.7$ eV. Plot 225 shows the $I_D/V_G$ relationship for a low $V_t$ pMOS device with top gate and bottom gate work-functions $\phi_{TG}=\phi_{BG}=5.1$ eV. As with the simulated results of FIG. 10, the simulated I-V curves demonstrate that the I-V characteristics of SB-FinFET devices can be shifted steadily from left to right as the work-functions are changed from near mid-gap values (i.e. by increasing the barriers) to the band edges (i.e. by reducing the barriers), thus creating four distinct FinFETs with high and low thresholds, respectively.

In a previous example, it was noted that adjusting the thickness $t_{OX}$ of the dielectric layers 20, 24 to adjust for high-$V_t$ could be impractical in certain cases. In these cases, it may be advantageous to select I-V characteristics that can be optimized by only adjusting gate work-functions to implement logic circuits using the above set of sub-10 nm SB-FinFETs.

Figure 18:
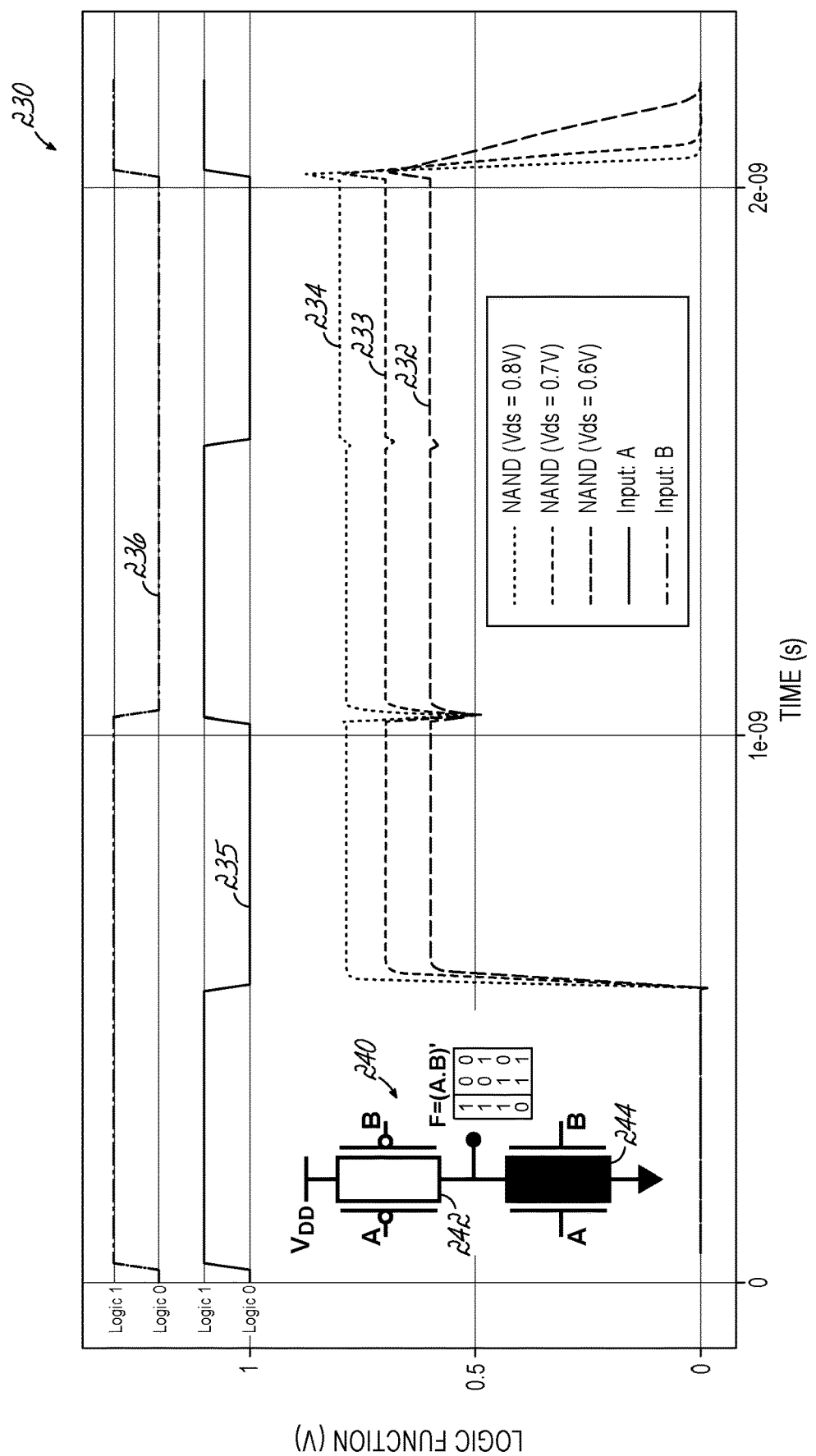
FIGS. 18 and 19 are graphical views illustrating a simulated performance of yet another logic circuit based on the device of FIG. 1.

FIG. 18 depicts a graph 230 including plots 232-236 that show the logic inputs (plots 235 and 236) and outputs (plots 232-234) for an optimally designed NAND logic circuit 240. The NAND logic circuit 240 includes a SB-FinFET 242 with a low-$V_{tp}$ and a SB-FinFET 244 with a high-$V_m$ in a series configuration. The plots show gate function at drain to source voltages of 0.6 volts (plot 232), 0.7 volts (plot 233), and 0.8 volts (plot 234).

Figure 19:
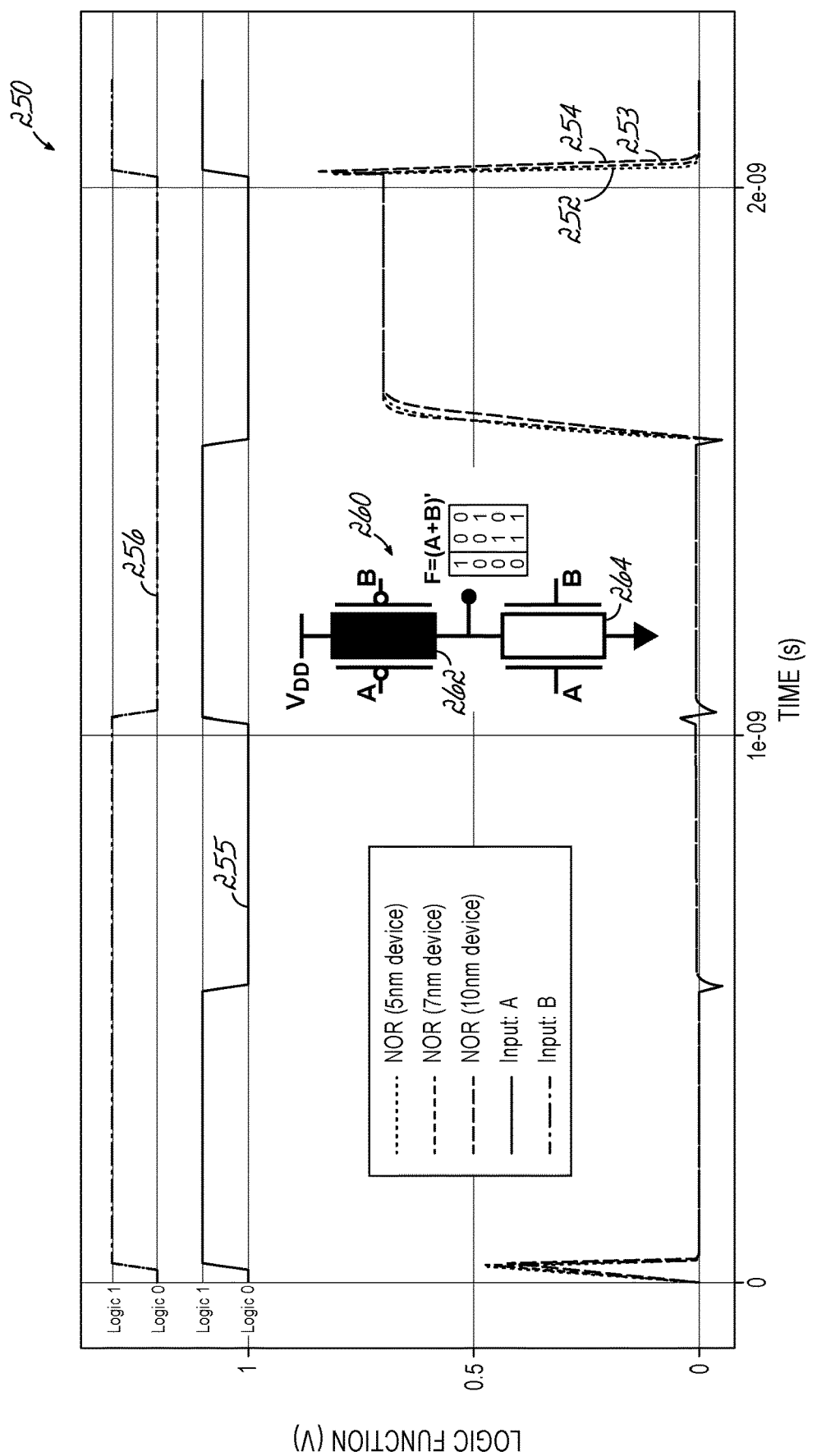

FIG. 19 depicts a graph 250 including plots 252-256 that show logic circuit function for devices having a gate length $L_G=5$ nm (plot 252), 7 nm (plot 253), and 10 nm (plot 254) for a NOR logic circuit 260 comprising a SB-FinFET 262 with a high-$V_t$ in a series configuration and a SB-FinFET 264 with a low-$V_t$. In each case, the logic circuits were found to operate correctly with supply voltages as low as 0.5 V and gate lengths as short as 5 nm using the same work-functions. In other words, the optimization was determined to be valid for a relevant and practical range of devices and operating conditions.

According to the logic operations in FIGS. 18 and 19, a NAND logic circuit can be fabricated using only a pair of ambipolar SB-FinFETs 242, 244 in a series arrangement. Similarly, in the opposite arrangement, a NOR logic operation can be provided. Moreover, in each case, the logic circuits are found to operate correctly with supply voltages as low as 0.6 V and gate lengths as short as 5 nm using the same arrangement of work-functions. In other words, the work-function optimization disclosed herein is relevant and practical for a wide range of 2T NAND/NOR logic circuits and operating conditions. Thus, together with the use of 2T-XOR logic circuits, work-function engineering may enable construction of previously unknown ultracompact logic circuits. One challenge of these high and low threshold devices is the use of new gate electrode metals (or silicides) in order to achieve the desired work-function.

Below, a brief evaluation of the performance of the proposed logic circuits is provided, including dynamic performance, power dissipation, tolerance for process variability and gate area, which is summarized in Tables 1A and 1B. To keep Tables 1A and 1B to a manageable size, results listed are limited to those for an ambipolar SB-FinFETs with a gate length $L_G=7$ nm and a gate width to length ratio W/L=11. However, similar observations have been made for other gate lengths. To provide a comparison, Tables 1A and 1B also include "control" devices in the form of standard four-transistor (4T) logic circuits employing conventional p/n junction FinFETs (i.e., without a Schottky barrier source or drain) with mid-gap metal on both gates driven symmetrically. Hence, these "control" designs generally require twice the number of transistors as logic circuits fabricated in accordance with embodiments of the invention. The control designs may also set an upper limit for performance as they have a symmetrical gate drive that leads to more than a doubling of transconductance ($g_m$).

In order to probe the resilience of the proposed logic circuits against the process variability in setting the optimal work-functions, 27 simulations were performed for each logic function at process corners with ±0.1 eV variations in source, drain, top gate, and bottom gate barrier heights. The result from these simulations were utilized for the statistical assessments.

The figures of merit for logic performance are summarized in Tables 1A and 1B for both ambipolar logic circuits and conventional FinFET counterparts. The gate work-functions in each posted device correspond to the optimal values of top and bottom gate work-functions for XOR (5.3 and 3.7 eV), NAND (5.1 and 4.0 eV), and NOR (4.7 and 3.8 eV) logic circuits as determined from the optimization processes described herein. For conventional devices, gates were assumed to be the same metal with a mid-gap value.

TABLE 1A

Comparison of 7 nm Work-Function Engineered 2T and Standard Logic Circuits

| Logic Circuit | S/D $\phi_m$ [eV] | Pgate $\phi_m$ [eV] | Ngate $\phi_m$ [eV] | <P> [nW] | $<t_d>$ [ps] |
|---|---|---|---|---|---|
| 2T Ambipolar NOR | 5.0 | 4.7 | 3.8 | 8.96 | 36.1 |
| 2T Ambipolar NAND | 5.0 | 5.1 | 4.0 | 8.41 | 52.2 |
| 2T Ambipolar XOR | 5.0 | 5.3 | 3.7 | 78.0 | 21.1 |
| 4T Standard NOR | 4.6 | 4.6 | 4.6 | 16.4 | 5.15 |
| 4T Standard NAND | 4.6 | 4.6 | 4.6 | 26.6 | 4.39 |
| 4T Standard XOR | 4.6 | 4.6 | 4.6 | 958 | 6.62 |

TABLE 1B

Comparison of 7 nm Work-Function Engineered 2T and Standard Logic Circuits

| Logic Circuit | <PDP> [aJ] | $\sigma_{PDP}$ [aJ] (%) | ±0.1 eV Yield [%] | Area [$\lambda^2$] |
|---|---|---|---|---|
| 2T Ambipolar NOR | 4.25 | 0.86 (20.2%) | 100 | 165 |
| 2T Ambipolar NAND | 5.41 | 1.86 (34.3%) | 81 | 165 |
| 2T Ambipolar XOR | 1.57 | 0.38 (24.2%) | 100 | 132 |
| 4T Standard NOR | 2.44 | 0.48 (19.7%) | 100 | 231 |
| 4T Standard NAND | 1.48 | 0.12 (08.1%) | 100 | 231 |
| 4T Standard XOR | 3.77 | 0.021 (05.6%) | 100 | 260 |

One figure of merit for logic circuits is known as the power-delay product, which is an integral measure of switching delay and power dissipation. The simulated average power-delay product of the proposed 7 nm ambipolar gates for $V_{DD}$=0.7V is 6.69×10$^{-19}$ J, 4.76×10$^{-19}$ J, and 9.78×10$^{-19}$ J for NOR, NAND and XOR logic circuits, respectively. While the finite parasitics included in the TCAD model ($R_{SD}$=10Ω and $C_L$=3 fF) and a lack of gate tunneling (i.e. static leakage) in the above simulations may affect the accuracy of the power-delay products, they nevertheless indicate a very competitive logic performance as compared to standard 4T logic circuits. The 2T logic circuits with ambipolar pass-gate devices (e.g., XOR logic circuit) outperform 4T conventional counterparts in terms of average power-delay product, presumably due to lower overall parasitics, even though they do have more variability as evident from the standard deviation of the power-delay product.

Because tunneling though the source and drain Schottky barriers may occur with ambipolar FinFETs, higher sensitivity to work-function variability can be expected. The resulting standard deviations for all ambipolar cases simulated is <30%, with the NAND logic circuits being the worst (34.3%). Moreover, according to the same table, a small subset (19%) of NAND logic circuits displayed logic failure due to ±0.1 eV variations to the barrier heights. All failure cases were associated with source/drain (S/D) contacts being set to 5.1 eV. Since all ambipolar NOR and XOR logic circuits worked under similar constraints, the failing logic circuits may indicate that the adapted top and bottom gate work-function values are suboptimal for NAND circuits. By adjusting the proposed work-function values slightly, the few failing NAND logic circuits should be able to operate within these error margins. Therefore, the gate work-function engineering devices appear to be sufficiently robust for typical process variations in metal work-functions.

Figure 20:
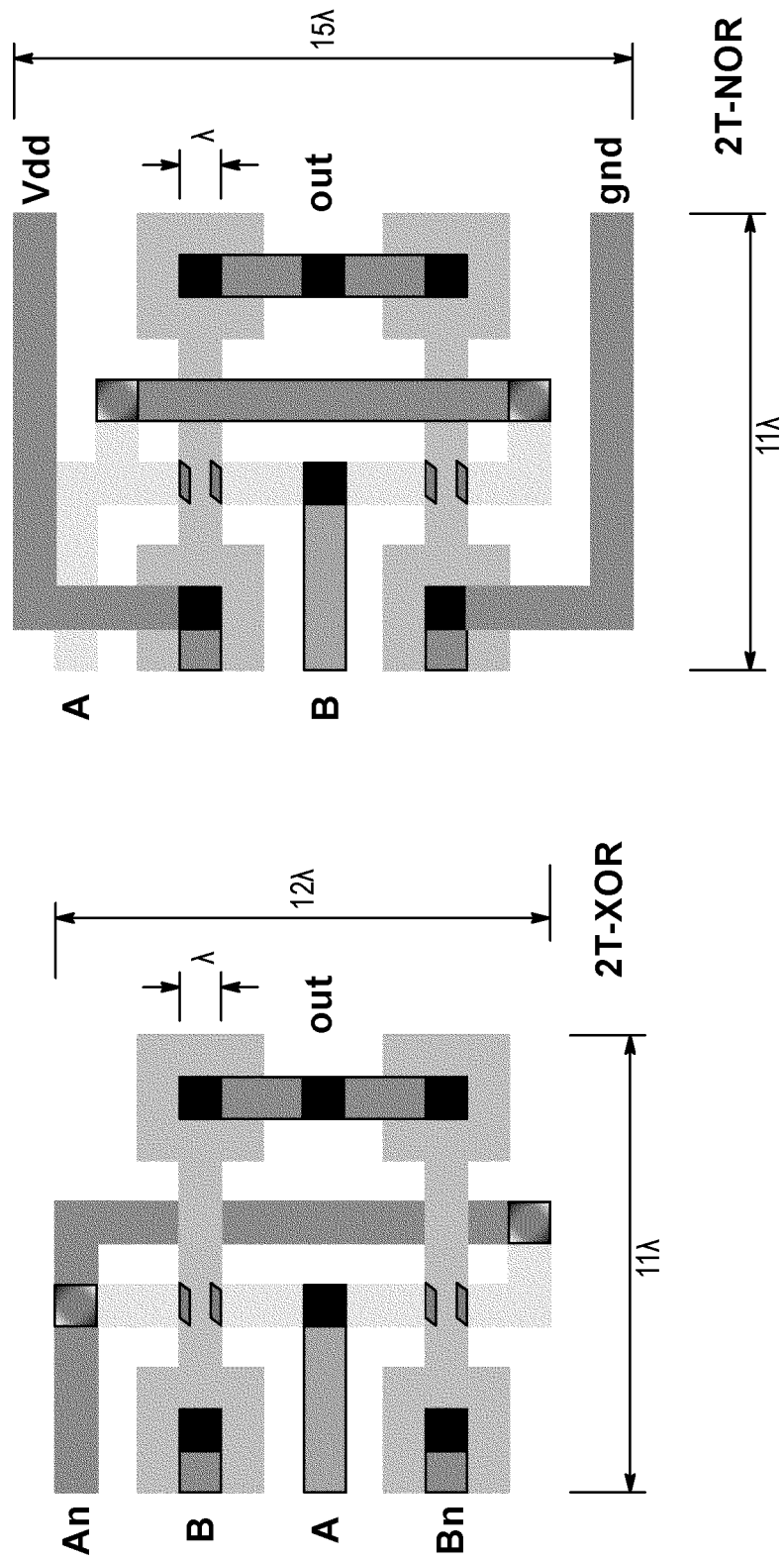
FIG. 20 is a diagrammatic view of an exemplary topology for an XOR and a NOR logic circuit implemented based on the device of FIG. 1.

In any case, a separate set of work-function values may be available for gates if the source/drain work-function is readjusted according to the design principles described herein. In addition, a general assessment of the wafer area required for the novel XOR, NAND and NOR logic circuits has also been made taking into account the additional area needed to route independent gate signals. By way of example, FIG. 20 depicts exemplary layouts for the 2T XOR and NOR logic circuits using Insulated Gate SB-FinFETs where λ is the gate pitch. The analysis shows that compact 2T logic circuits can be laid out within 132$\lambda^2$ and 165$\lambda^2$ for XOR and NAND/NOR logic. As compared to 4T conventional counterparts with symmetrically-driven FinFETs that occupy 231$\lambda^2$ or 260$\lambda^2$, the proposed 2T implementations offer 30% or 50% reductions in area of NAND/NOR or XOR logic circuits, respectively. Use of a gate contacting approach may allow elimination of overheads associated with routing of independent gates, which would allow independently driven gate devices to reach or exceed an expected 50% area savings for ambipolar 2T logic circuits in sub-10 nm logic systems.

Embodiments of the invention may depend on the capability of building independent gates of FinFETs with multiple (e.g., three or four) specific work-functions. Due to the asymmetry of the electron and hole tunneling rates, these work-functions may be other than symmetrical around mid-gap. The drain-induced bias asymmetry at full supply may also contribute to the asymmetry of these optimal work-functions. Because the tunneling rates in SB-FinFETs for channel carriers to and from source and drain contacts is normally sensitive to the barrier height, drain induced bias length effect may become a challenge in SB-FinFET device optimization. To address this potential issue, source and drain work-functions $\phi_S=\phi_D$=5.0 eV may be used in the above gates. These work-functions may be higher than those for the seemingly optimal balanced I-V characteristics observed at a work-function value of 4.9 eV optimized for $V_{DD}$=0.5V case.

The I-V curves and logic transients in the earlier sections indicate that the power-delay product improvements in the ambipolar 2T logic circuits may be due to ultra-low power levels as opposed to faster switching (e.g., approximately 10 ps) or sub-threshold slope (e.g., approximately 80-100 mV/decade). Introduction of tunneling barriers at the source or drain contacts may dramatically lower off-currents $I_{OFF}$ to 10 pA levels (e.g., as indicated by FIGS. 3 and 5) along with a considerable drop in the on-current levels (e.g., into the micro-amp range) that limits the logic switching speed. Since SB-FinFETs have a superior subthreshold slope (80-100 mV/decade) compared with conventional FinFETs in sub-10-nm scale, it may be possible to lower the off-current $I_{OFF}$ substantially. This implies that the gate work-function engineering approach delivers essentially ultra-low power (e.g., μW) logic circuits with 10 ps switching speeds on silicon in the sub-10 nm regime. Moreover, for channels that have considerably lower effective mass such as graphene, carbon nanotubes, or III-V semiconductors, there could be further advantages in terms of speed. Both observations imply that gate work-function engineering may provide a path for device design and optimization.

As compared to the simulations on the gate work-function engineering using drift-diffusion based simulations described in association with FIGS. 3-12, the incorporation of first-order quantum corrections via density-gradient approximation indicate that modeling of quantum mechanical effects increases the accuracy of the design and optimization of the proposed circuits.

Based on the improvements seen from adjusting gate work-functions for logic design demonstrated by the above simulation results, it is contemplated that this technique may be applied at a "cell-level". That is, gate work-function engineering may be applied to the whole functional cell such as a full-adder, multiplexer or SRAM by adjusting or allocating multiple work-functions to individual devices rather than every device to optimize the cell function and performance. This novel approach has produced exciting results.

A novel approach to design and operation of ultra-compact XOR, NAND, NOR logic circuits in sub-10 nm CMOS has been set forth and verified via TCAD simulations. The approach described herein utilizes, but is not limited to, independent-gate SB-FinFETs with specific gate work-functions that can be conveniently utilized to fabricate unique and compact logic circuits. Specific circuits analyzed include, but are not limited to, a 2T XOR circuit based on a conjugate dual-channel transistor that provides similar functionality as CMOS pass-gate devices but with only one pair of source and drain contacts and opposing gate work-functions on two gates. Novel 2T NAND and NOR logic circuits have also been set forth using high/low threshold devices, utilizing two different work-functions for n-channel and p-channel SB-MOSFETs. Functionality of 2T logic circuits has been confirmed via standard Synopsys TCAD tools and their performance evaluated. It has been determined that ambipolar gates offer a reduction in total area of no less than 50%, have competitive power-delay product at $1\times10^{-18}$ scale, and are resilient to 0.1 eV fluctuations in the work-function values.

One type of device that may be manipulated to implement work-function engineering is an SB FinFET that employs metallic (typically silicided) source and drain contacts. Metallic source and drain contacts may be used instead of slower and space-charge prone p-n junctions, which can become problematic as gate dimensions are scaled to 10 nm. A modeled ambipolar FinFET transistor ("modeled device") may have a dielectric layer with a thickness of $t_{ox}=1$ nm and a relative dielectric constant $\varepsilon_{ox}=12$ (e.g., for a dielectric layer comprising $HfO_2/SiO_2$), and semiconductor layer thickness $t_{SL}=4$ nm with metallic Schottky barrier source/drain contacts that enable ambipolar carrier injection. This modeled device may address several issues, such as poor subthreshold slope, larger capacitive parasitics, dopant fluctuations, as well as incompatibility with novel 1-D/2-D channel materials (e.g., nanowires, carbon nano-tubes, or graphene). The type of tunneling carriers may be determined by the silicide barrier height rather than heavy doping in a p-n junction, and may determine the characteristics of an ambipolar SB-FinFET as illustrated by the conduction band diagrams 34, 36 of FIG. 2.

Typically, p-channel devices may have work-functions larger than mid-gap for the source/drain contacts to lower the barrier height for holes and raise the barrier height for electrons. One potential disadvantage for SB-FinFETs may be the presence of series resistance associated with tunneling and reduced on-current $I_{ON}$. As a result, at longer gate lengths, the performance advantages of SB FinFET-based logic as compared to dominant p-/n-junction FinFET switches may not be immediately apparent. However, in sub-10-nm operation the performance advantages of SB FinFET-based logic may become more pronounced. This may be attributed to the off-current $I_{OFF}$ being reduced due to the tunneling barrier and the overall $I_{ON}/I_{OFF}$ ratio in SB-MOSFETs becoming more advantageous for logic operation. In particular, a lower value of $I_{ON}$ may provide reduced heating and thereby offer a significant advantage over conventional devices.

Device simulations have been performed to explore ranges of work-functions and various exemplary dimensions, e.g., $L/t_{SL}=10/7$, 7/4, or 5/3 nm. Another design feature evaluated is the choice of effective masses for electron ($m_e^*$) and hole ($m_h^*$) injection through the source/drain contact barriers. Since the barrier height is a design parameter, these additional simulations do not make an a priori assumption as to which silicide material (i.e., Schottky barrier height) and effective mass should be chosen. Moreover, the exact nature of the interface between the Si channel and silicided contacts (e.g., chemical uniformity and atomic sharpness) may also impact the values for $m_e^*$ or $m_h^*$, which may in turn impact the choice of effective mass. However, due to quantum mechanical quantization, lower transverse effective mass of silicon X-valleys and lighter holes may be preferred. Due to higher hole mobility along the [011] direction, there is additional pretext for the use of lighter hole mass.

Figure 21:
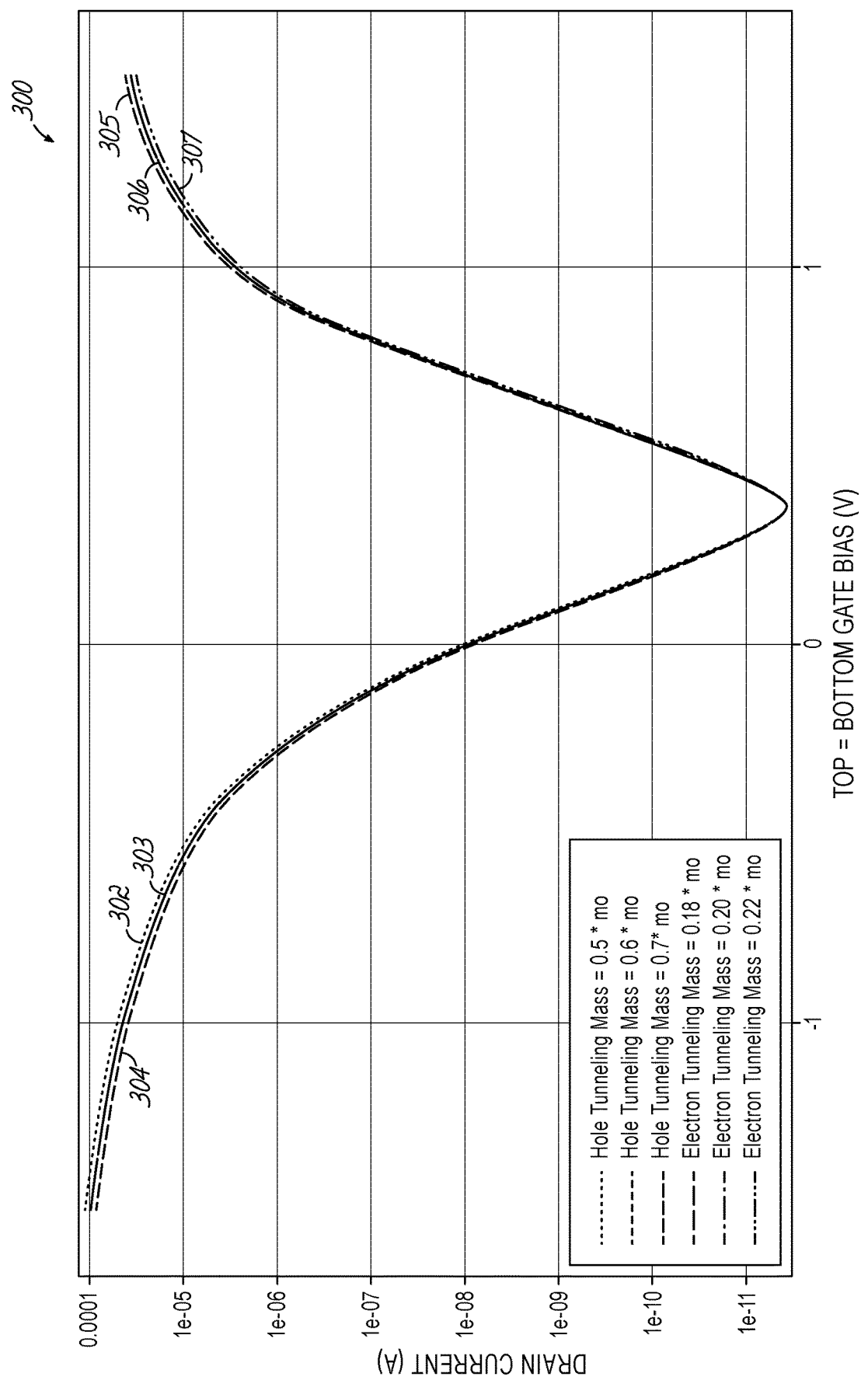
FIG. 21 is a graphical view illustrating drain current verses gate bias for different carrier masses for the device of FIG. 1.

FIG. 21 depicts a graph 300 including plots 302-307 of drain current verses bottom gate bias voltage for a plurality of carrier tunneling effective masses. As can be seen from the similarity between the plots 302-307, variations in effective mass for tunneling electrons and holes does not dramatically alter the simulated I-V characteristics of an ambipolar SB-FinFET within a practical range of values. The nominal case for the plots 302-307 is $m_e^*=0.2$ and $m_h^*=0.6$, where the work-function for the top and bottom gates is assumed to be mid-gap, and the work-function for the source/drain contacts is assumed to be 5.0 eV.

An ambipolar device may inject both electrons and holes into an undoped channel depending on the size of Schottky-barrier height dictated by the choice of source/drain contacts, thereby producing two conduction modes. With the correct contact metal choice, ambipolar devices can deliver equal current drive for both types of carriers and can thereby provide a reconfigurable logic element in CMOS circuits. When realized in the form a single FinFET with two independent gates optimized with dissimilar work-functions, the device can operate as a single transistor pass-gate with one electron channel and one hole channel in a single semiconductor body. This unique ability to set independent gate work-functions in a single FinFET may enable novel circuits as described herein. Another capability that may be used in logic circuit implementations is a fine threshold adjustment which can be obtained using work-function engineering that leads to lateral shifts in the ambipolar I-V characteristics for SB-FinFETs as shown in FIG. 17. Such higher threshold FinFETs can be used to create pass-gates that only turn on when both independent gates are driven to provide an AND function in a single transistor. This enables two series FinFETs in the NAND/NOR logic circuits to be combined into one device.

The two gates of the ambipolar device are physically one structure in a standard FinFET, and thus are driven together for a maximum logic performance, e.g., $I_{ON}/I_{OFF}$ ratio. This may result in barriers that are sufficiently thin and low to allow tunneling at only one end of the channel and for only one type of carrier as depicted in FIG. 2. This prevents the inherent "duality" of the channels from being exploited in the same body, and thus the device can only function as either an n-channel or p-channel FinFET at a given gate bias. However, by fabricating the FinFET gates from two different metals, which may be performed by adding a few additional steps to the conventional FinFET fabrication process, this duality can be exploited at two separate channels under each gate, as shown by FIG. 13. The simulated SB-FinFET has parameters optimized for conjugate dual channels that includes a bottom gate optimized for hole tunneling/conduction and top gate optimized for electron tunneling/conduction. Simulated characteristics of an optimized 7-nm ambipolar pass-gate and the corresponding electron/hole current densities in ON and OFF cases are depicted by heat maps 174, 176, 178, 180 of FIG. 13 for a drain-to-source bias voltage $V_{DS}$=1.0 V.

This novel configuration may be analogous to a pass-gate CMOS pair with parallel n-/p-channel MOSFETs driven with opposing logic states. A device generally as depicted by FIG. 4 and optimized for a 7-nm SB-FinFET may include two distinct ambipolar channels in a single body, each associated with the unique gate work-function chosen. As can be seen in FIG. 13, this structure may produce a device having a three orders of magnitude change in resistance between ON/OFF states. Hence, using work-function engineering, a 1T CMOS ambipolar pass-gate device can be fabricated with two independently driven gates. This device can be utilized to construct very compact CMOS circuits.

Having determined that a 1T pass-gate functionality is present in an ambipolar SB-FinFET with independent gate drive, a strategy may be determined to obtain and optimize this conjugate channel operation for logic performance. In the design process, a source-drain work-function may be shifted toward the valance band (e.g. ~4.90 eV for silicon) in order to obtain similar on-currents $I_{ON}$ for each of the two channels. This shift in work-function may be necessary to account for a difference in the effective masses between electrons and holes (e.g., $m_e$*=0.2 and $m_h$*=0.6) for quantization, tunneling, and density of states. Left uncompensated for, this difference in mass could result in up to two orders of magnitude difference in on-currents $I_{ON}$. In other words, the visibly uneven ambipolar behavior resulting from the use of equal mid-gap work-functions shown by FIG. 2 may necessitate lowering barriers for holes, raising barriers for electrons, or a combination of both.

Figure 22:
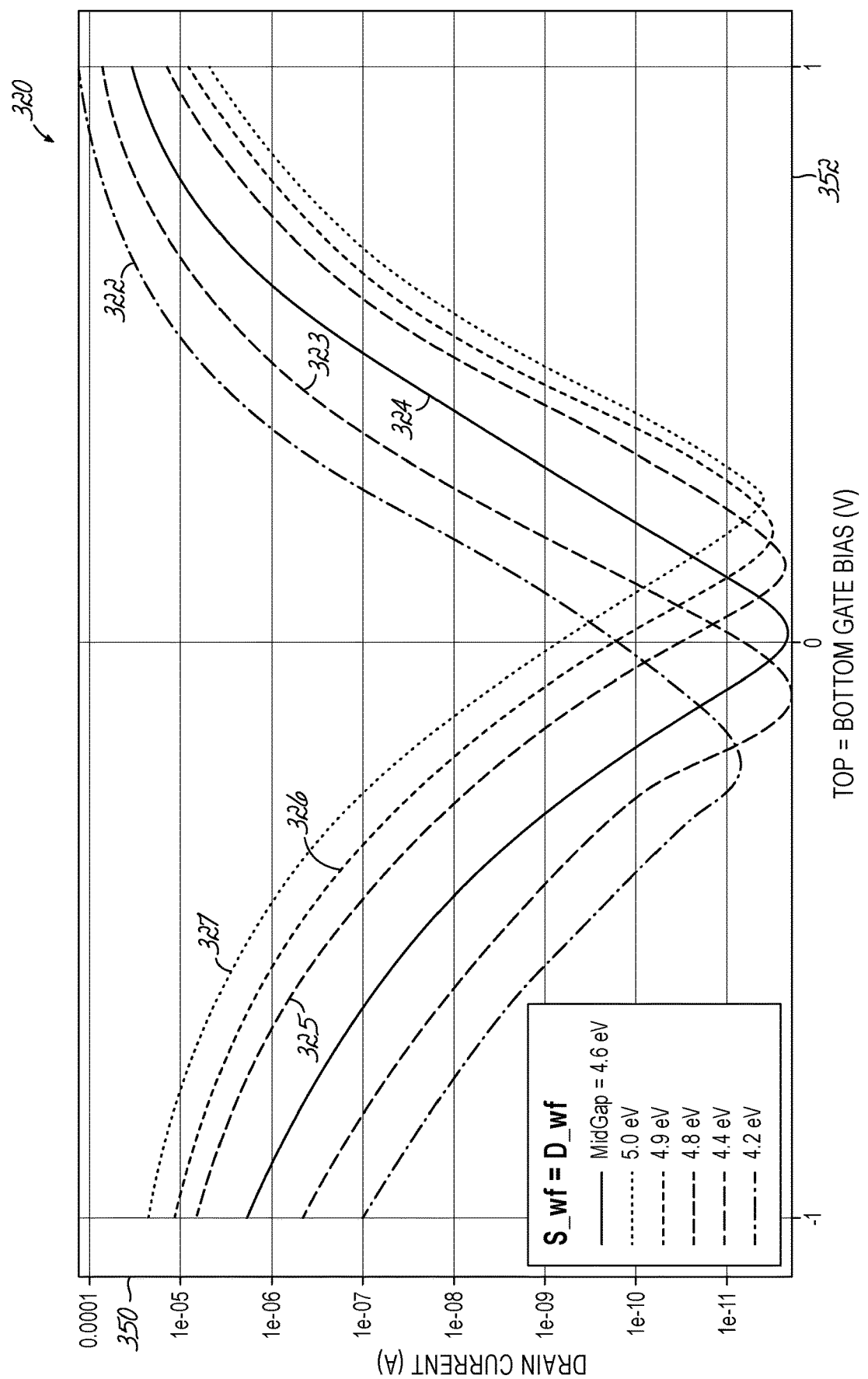
FIG. 22 is a graphical view illustrating drain current verses gate bias for different carrier masses for the device of FIG. 1 with source/drain contact work-function of 4.9 eV and a drain bias of 0.5 V.
Figure 23:
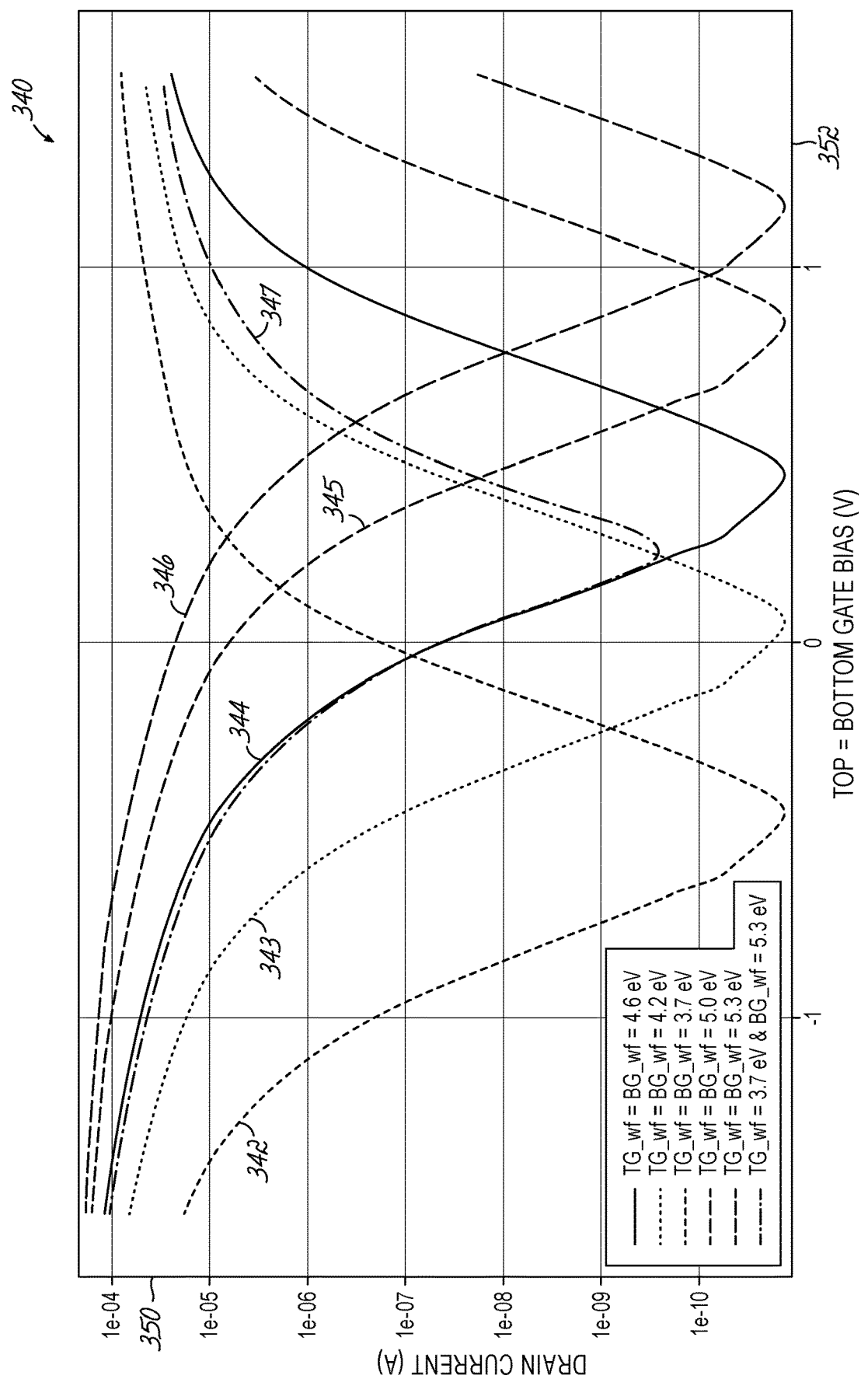
FIG. 23 is a graphical view illustrating drain current verses gate bias for different carrier masses for the simulation depicted in FIG. 22 showing the effects of setting top gate and bottom gate work-functions near band edge values.

Referring now to FIGS. 22 and 23, a simulated drain current verses bottom gate bias is illustrated by plots 322-327 of graph 320 and plots 342-347 of graph 340. Each graph 320, 340 includes a vertical axis 350 representing drain current and a horizontal axis 352 representing a bottom gate bias voltage $V_{BG}$. Each plot 322-327, 342-347 was generated with the top gate bias voltage $V_{TC}$ equal to the bottom gate bias voltage $V_{BG}$, and the source and drain work-functions equal to about 4.9 eV. The simulated drain current verses bottom gate bias of plots 322-327 indicate that for a drain to source voltage $V_{DS}$=0.5 V and a top gate/bottom gate mid-gap work-function of 4.6 eV, balanced ambipolar currents occur for a source-drain work-function of ~4.9 eV. That is, for a reduction of the hole barrier or an increase in the electron barrier that generates a depletion mode threshold voltage $V_{tp}$>0 for hole channels and $V_{tp}$~0.3 V for a minimum drain current $I_D$. Thus, FIG. 22 shows that a source/drain contact work-function of 4.9 eV gives essentially equal n/p channel currents for a drain bias of 0.5 V.

The top and bottom gates may be electrostatically biased by lowing the thresholds for the injection of either type of carrier through the choice of opposing work-functions. FIG. 23 shows simulated results for top gate and bottom gate work-functions set to near band edge values, e.g., 3.7 and 5.3 eV, respectively, for the top and bottom gates. This may provide an inherent electrostatic bias in the top and bottom channels for hole and electron injection, respectively, which may be analogous to a CMOS pass-gate.

Plots 342-347 illustrate the significance of setting different and opposite gate work-functions to alter branch currents in 1T pass-gate operation, with plot 342 representing top and bottom gate work-functions of 3.7 eV, plot 343 representing top and bottom gate work-functions of 4.2 eV, plot 344 representing top and bottom gate work-functions of 4.6 eV, plot 345 representing top and bottom gate work-functions of 5.0 eV, plot 346 representing top and bottom gate work-functions of 5.3 eV, and plot 347 representing a top gate work-function of 3.7 eV and a bottom gate work-function of 5.3 eV.

The use of unequal work-functions may place additional demands on device fabrication. However, these demands are within a current level of gate engineering, and could be accomplished using, for example, epitaxial growth or atomic layer deposition/chemical vapor deposition processes. The ambipolar pass-gate may be vulnerable to significant changes in the tunneling current due to drain-bias induced changes (e.g., depletion effects) to the Schottky barriers at the source/drain contacts, which can upset the balanced ambipolar behavior. Although $V_{DS}$=$V_{DD}$/2~0.5 V was used to generate the plots 322-327, 342-347 of graphs 320 and 340, it should be understood that other values may be used to optimize a given logic switching performance at full $V_{DD}$ bias.

Figure 24:
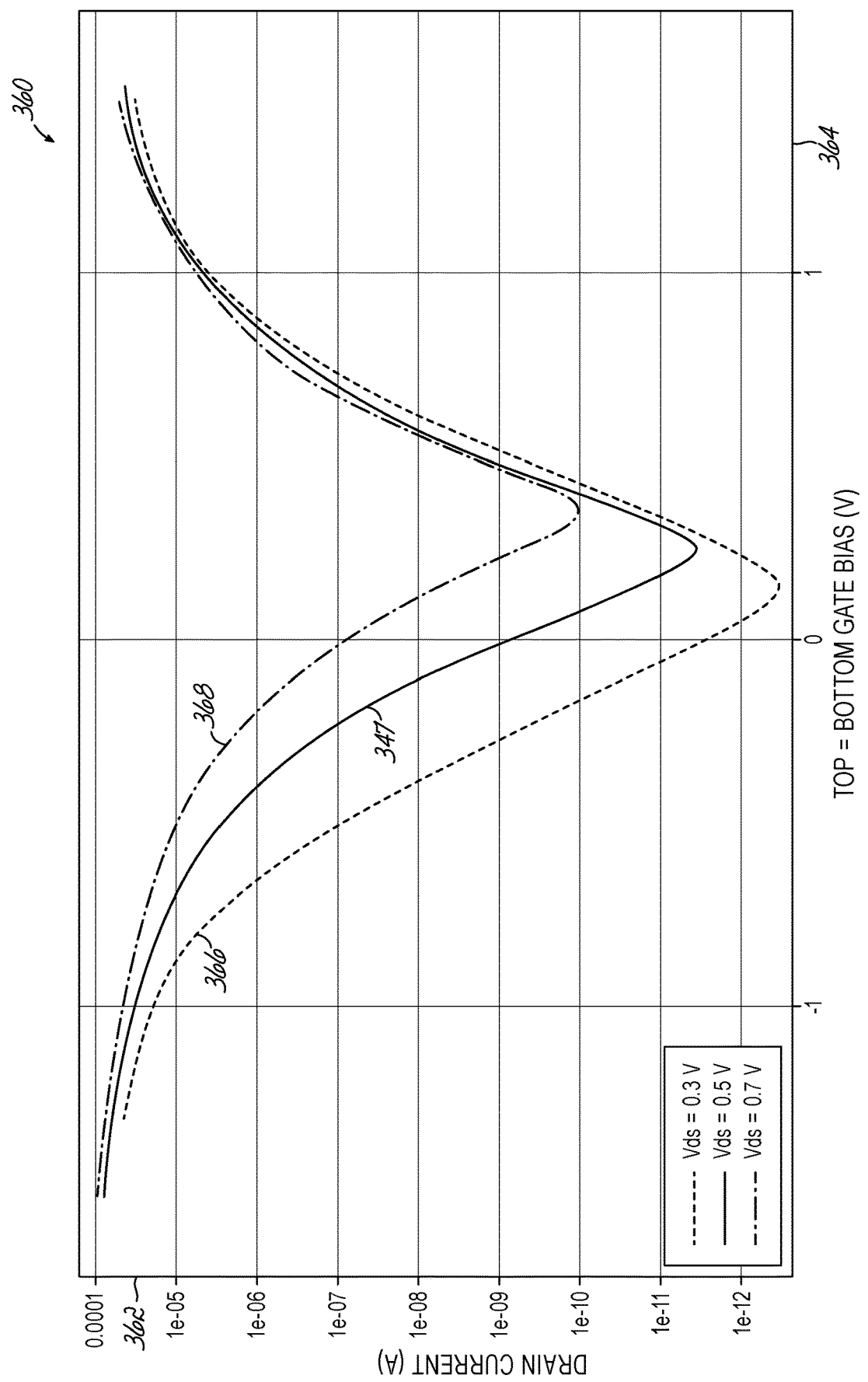
FIG. 24 is a graphical view illustrating the impact of dynamic drain bias on the optimal I-V curves of FIGS. 22-23.

FIG. 24 depicts a graph 360 that illustrates the impact of dynamic drain bias on the optimal I-V curves. Graph 360 includes a vertical axis 362 representing drain current, a horizontal axis 364 representing the bottom and top gate bias voltages $V_{BG}$ and $V_{TG}$, plot 347 from graph 340 depicting $I_{DS}$ vs $V_{BG}$ for a drain to source voltage $V_{DS}$ of 0.5 volts, and plots 366 and 368 depicting $I_{DS}$ vs $V_{BG}$ for drain to source voltages $V_{DS}$ of 0.3 volts and 0.7 volts, respectively. As can be seen, the drain bias effects the hole tunneling current more readily than the drain-bias induced changes, especially at off-current levels. Thus, during XOR logic switching, maintaining a static $V_{DS}$ bias of 0.5 V can lead to suboptimal performance with lower hole currents than initially assumed. Subsequent simulation analysis indicates that more optimal logic circuits typically set the source and drain work-functions $\phi_B$=5.0 eV, which increases the hole current slightly as compared to $\phi_B$=4.9 eV.

Figure 25:
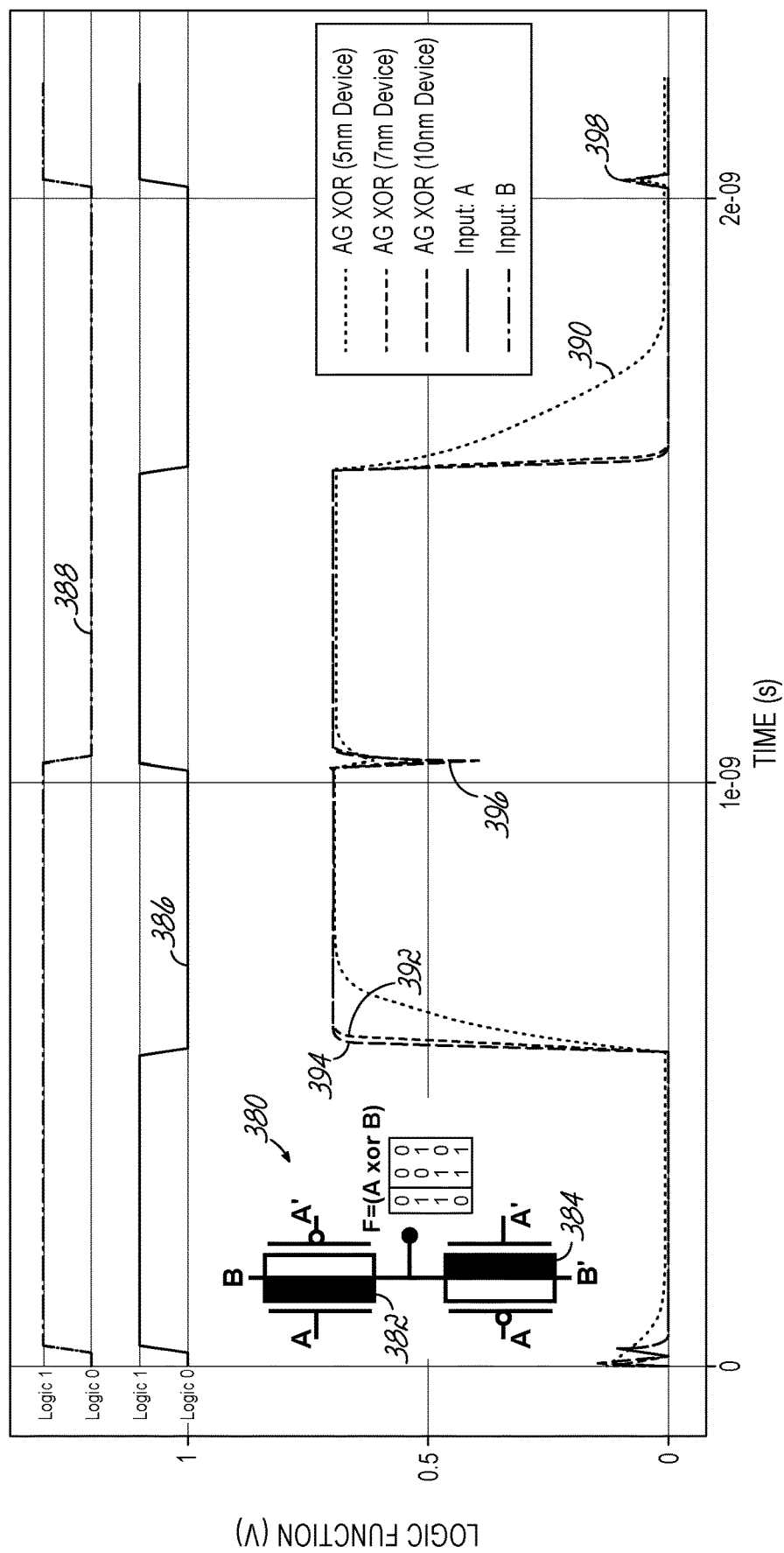
FIG. 25 is a graphical view illustrating the simulated performance of an XOR logic circuit using devices with characteristics shown in FIGS. 21-24 for different gate lengths.

FIG. 25 depicts an XOR logic circuit 380 including two optimally designed ambipolar pass-gates 382, 384 designed using the above design procedure, logic switching input signals 386, 388, and logic output signals 390, 392, 394 for $L_G$=5 nm, 7 nm, and 10 nm, respectively operating at a supply voltage $V_{DD}$=0.7 volts. For this exemplary case, the same optimization is valid also for the $L_G$=10 nm ($t_{SL}$=7 nm) and $L_G$=5 nm ($t_{SL}$=3 nm) XOR logic circuits. The 5 nm device shows signs of slower switching due to higher thresholds resulting from quantum mechanical discretization. Such a performance loss may be compensated for by adjusting the optimal work-functions specifically for the 5-nm device. The middle glitches 396, 398 in these logic plots may be due to the relatively slow input rise and fall times used to guarantee convergence of the simulation.

Figure 26:
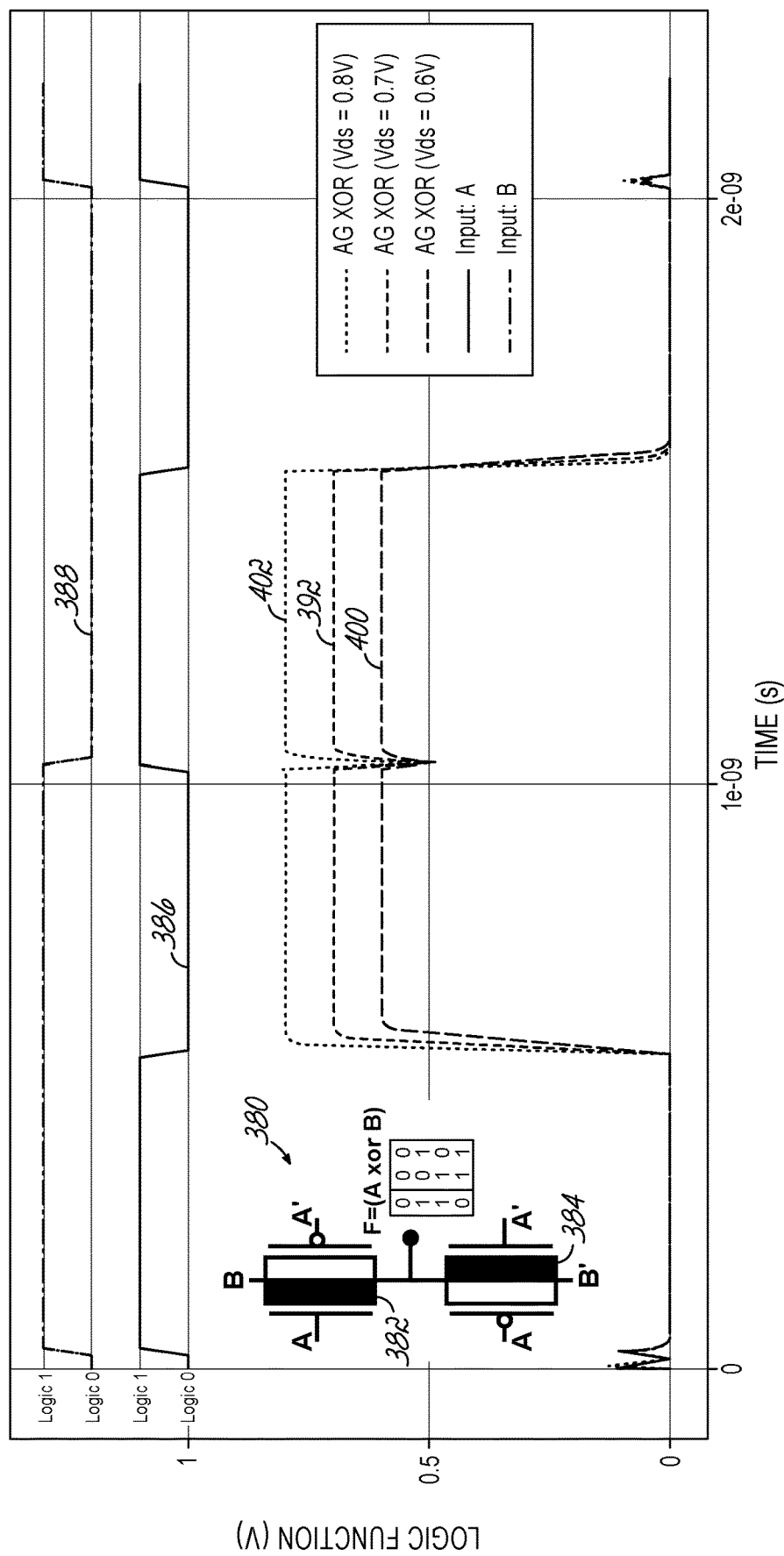
FIG. 26 is a graphical view illustrating the simulated performance of an XOR logic circuit using devices with characteristics shown in FIGS. 21-24 for different drain-source voltages.

FIG. 26 depicts the XOR logic circuit 380 including the ambipolar pass-gates 382, 384 with $L_G$=7 nm, logic switching input signals 386, 388, and logic output signal 392 for operation at a supply voltage $V_{DD}$=0.7 volts, and logic output signals 400, 402 for operation at supply voltages $V_{DD}$ of 0.6 volts and 0.8 volts, respectively. The plots of logic output signals 392, 400, 402 demonstrate that the 7-nm ambipolar XOR operates equally well under different supply voltages 0.6<$V_{DD}$<0.8 V. Hence, optimization holds for a wide range of device dimensions and operating conditions.

Both 1T pass-gate and 2T XOR logic circuits can be utilized to dramatically reduce transistor counts and device area for a wide variety of logic functions where pass-gates are preferred, such as full adders and MUXs.

Figure 27:
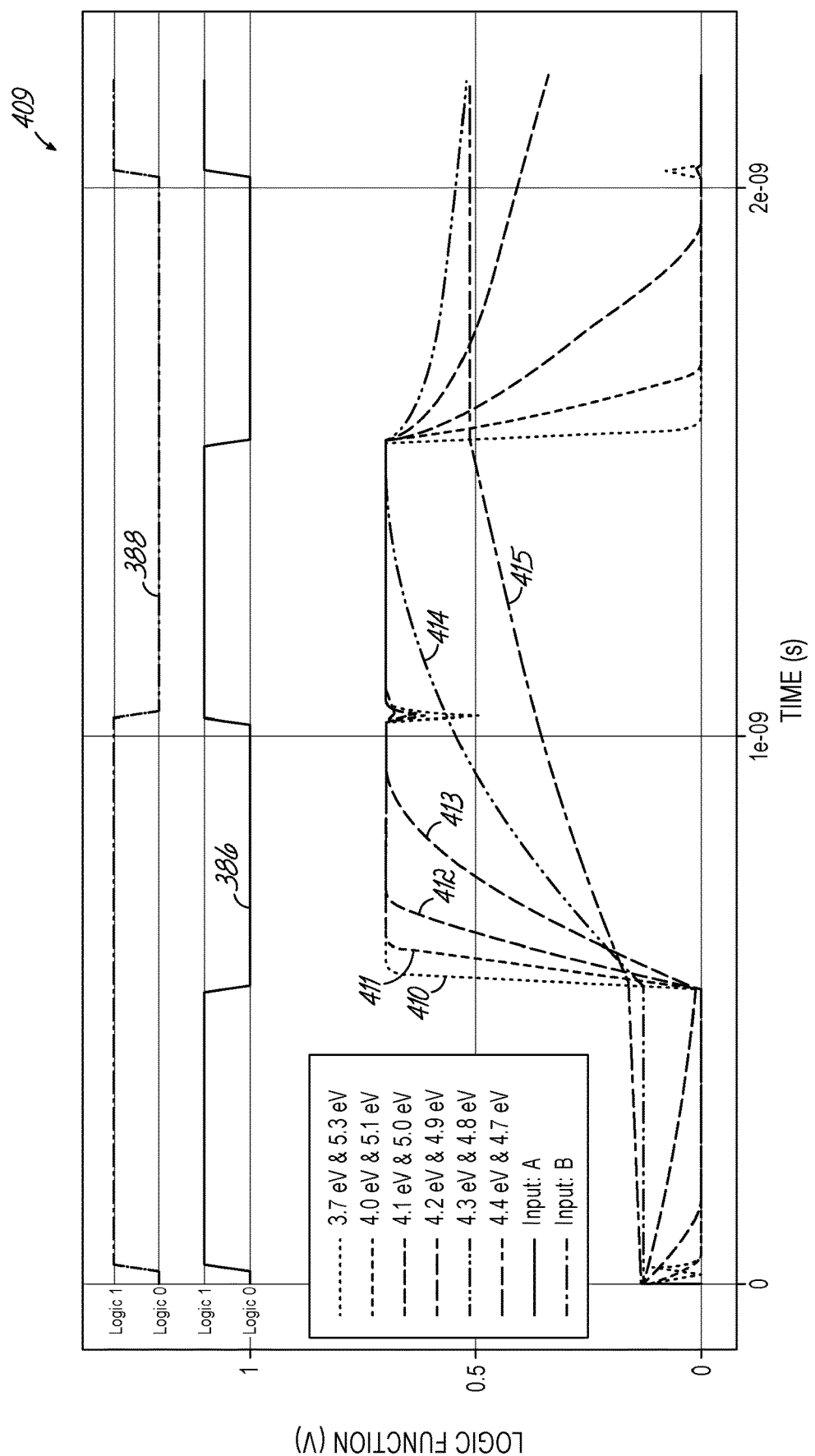
FIG. 27 is a graphical view illustrating the simulated performance of an XOR logic circuit using devices with characteristics shown in FIGS. 21-24 for different gate work-functions.

FIG. 27 depicts a graph 409 illustrating logic switching input signals 386, 388 and logic output signals 410-415 for the XOR logic circuit 380 operating with a supply voltage $V_{DD}$=0.7, source and drain contact work-functions $\phi_B$=5.0 eV, and top gate/bottom gate work-functions of 3.7 and 5.3 eV (plot 410), 4.0 and 5.1 eV (plot 411), 4.1 and 5.0 eV (plot 412), 4.2 and 4.9 eV (plot 413), 4.3 and 4.8 eV (plot 414), and 4.4 and 4.7 eV (plot 415). As can be seen, for top gate work-functions >4.0 eV and bottom gate work-functions <5.1 eV, performance of the XOR logic circuit 380 quickly deteriorates, and malfunctions for work-function values near the mid-gap value of 4.6 eV where the conjugate electron and hole channels lose their distinct behavior.

A single n-channel high-threshold voltage $V_t$ independent gate FinFET can be utilized as an AND logic pull-down element that only conducts if both gates are biased with a logic level 1 input. This can create a compact 2T NAND logic circuit that reduces both power (e.g., by 40%) and delay (e.g., by 10%) as compared to conventional CMOS AND logic circuits, and provides a minimal logic circuit arrangement. A similar arrangement can be made for a pMOS pull-up network in CMOS NOR logic circuits, replacing two series pMOS with a single p-channel high-threshold voltage $V_{tp}$ independent gate FinFET. However, the method of adjusting for high threshold voltages for these types of devices is to adjust the threshold voltage $V_t$ by varying the thickness of the oxide. This may be both impractical and suboptimal for sub-10-nm devices, which could suffer from a high subthreshold slope. In contrast, as shown by graph 220 of FIG. 17, the I-V characteristics of ambipolar FinFETs are optimized for low and high threshold FinFETs of both polarity when the work-function for the source and drain is 5.0 eV. Thus, using the I-V characteristics optimized only by the choice of gate work-functions, it is possible to implement high and low threshold variants of the n- or p-channel SB-FinFETs. Advantageously, this feature can be exploited to build 2T NAND/NOR logic circuits using sub-10-nm ambipolar FinFETs.

Figure 28A:
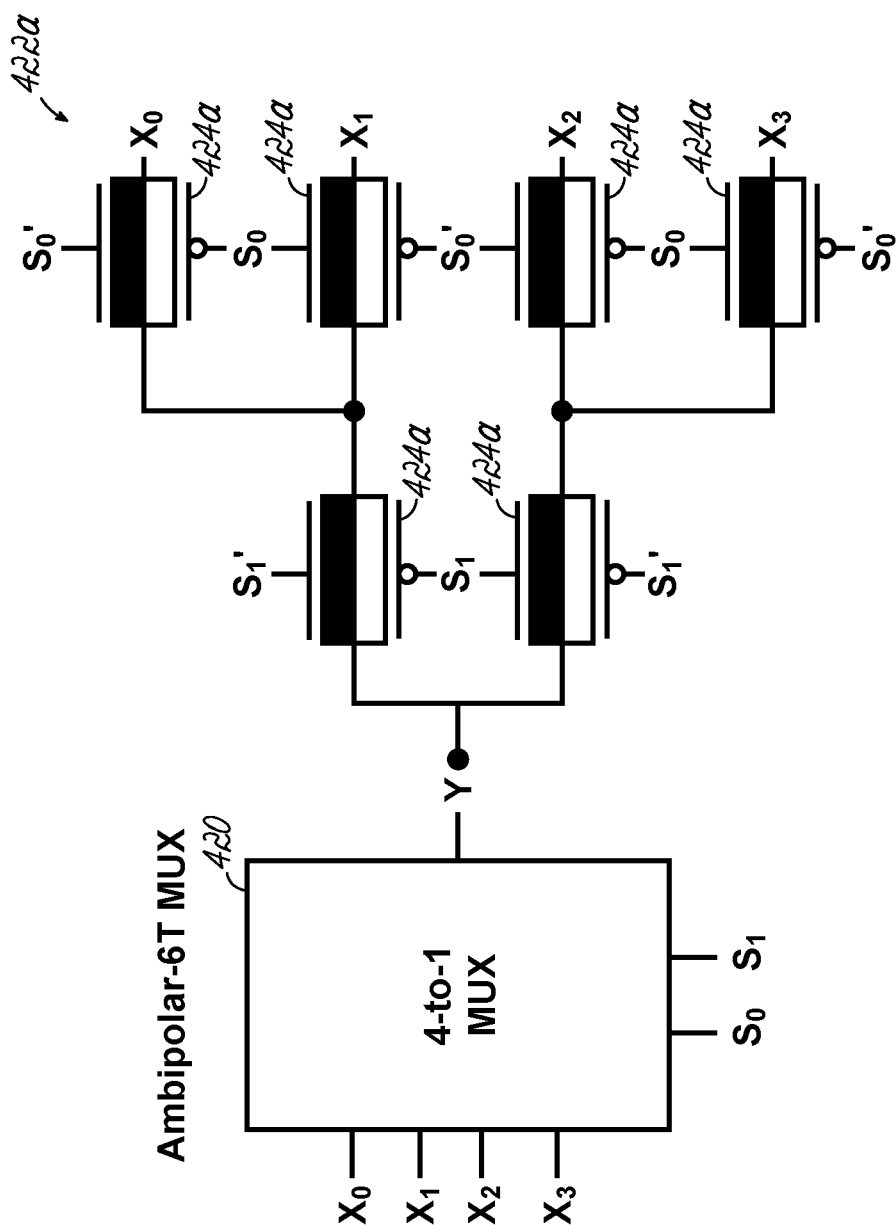
FIG. 28A is a diagrammatic view of a conventional 4-to-1 MUX and a 4-to-1 MUX logic circuit based on the device of FIG. 1.
Figure 28B:
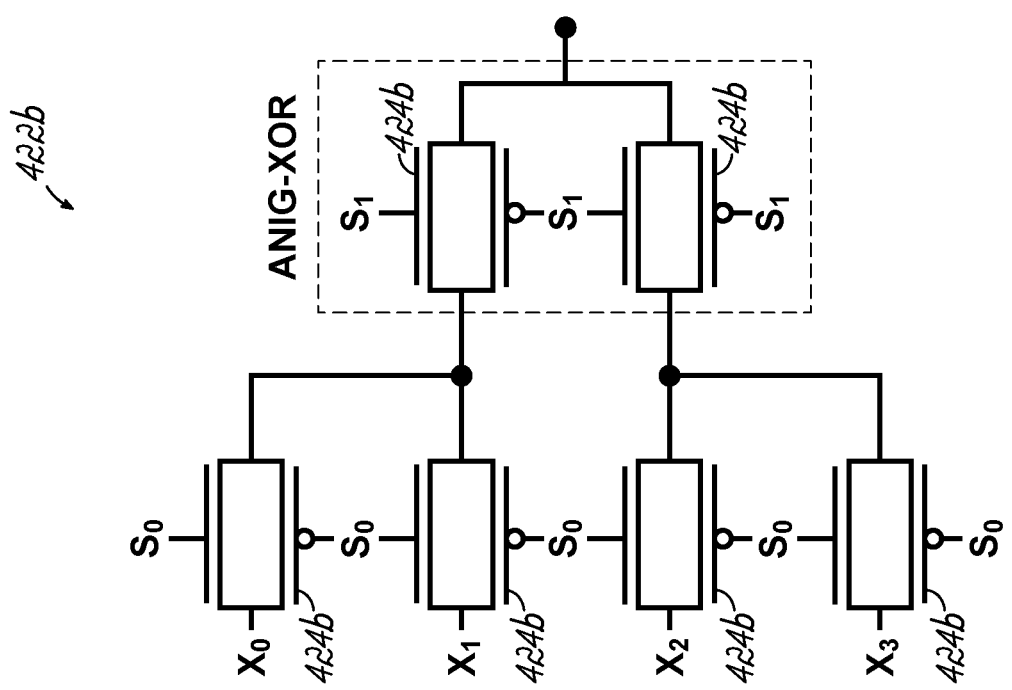
FIG. 28B is a diagrammatic view of another 4-to-1 MUX logic circuit based on the device of FIG. 1.

FIG. 28A depicts a conventional six pass-gate (12-transistor) conventional FinFET implemented 4-to-1 CMOS MUX 420 and a novel six-transistor (6T) ambipolar XOR logic circuit based 4-to-1 MUX circuit 422a built using three XOR pass-gates 424a, not including inverters for the select bits (not shown). In cases where inverters are included in the XOR logic circuit based 4-to-1 MUX circuit 422a, the circuit may include four additional transistors for the inverters, and thus be a 10T SB AB XOR logic circuit. FIG. 28B depicts a different and novel 6T ambipolar XOR logic circuit based 4-to-1 MUX circuit 422b built using three XOR pass-gates 451 that does not require any inverters on the input signals.

Figure 29:
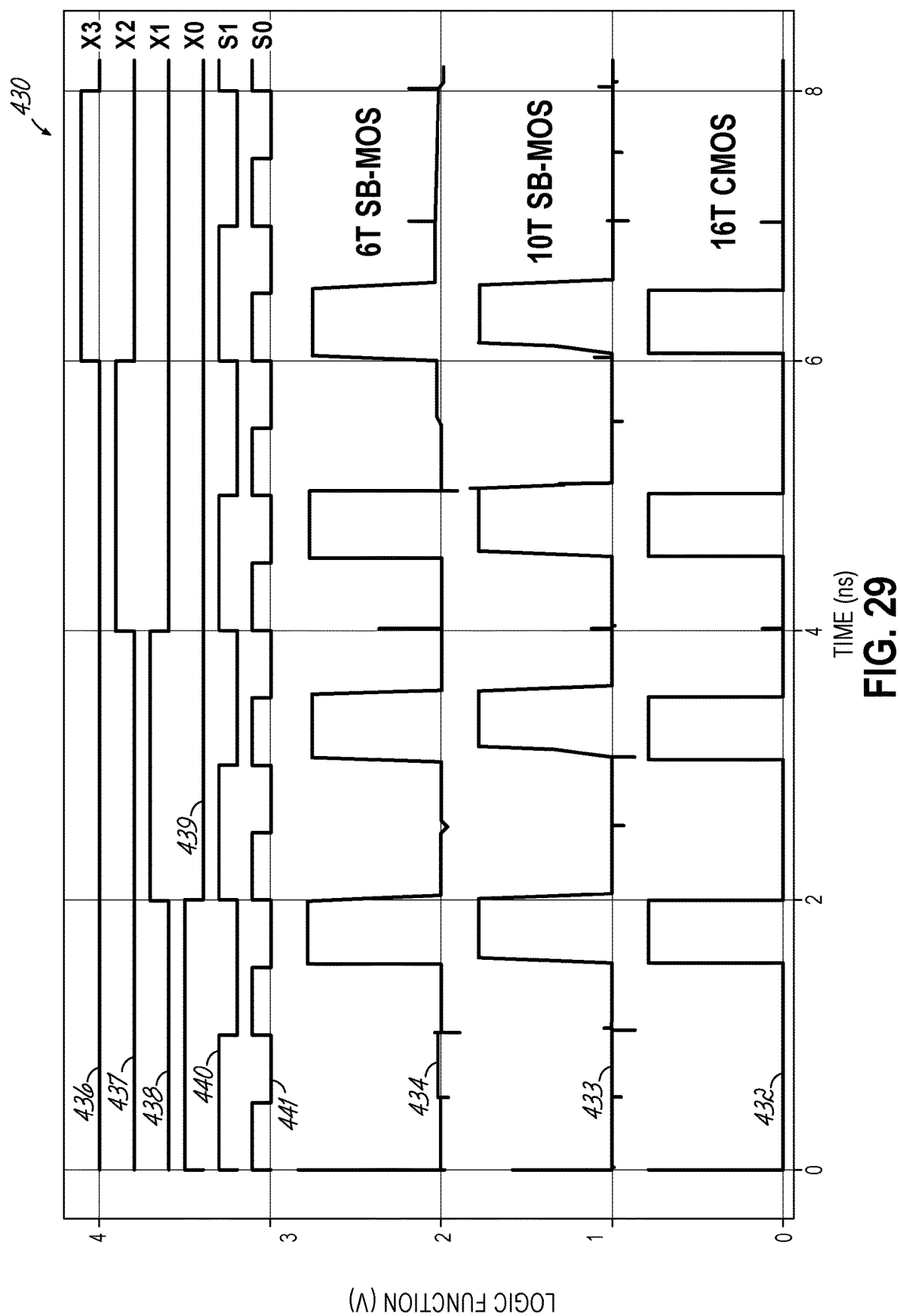
FIG. 29 is a graphical view illustrating a simulated performance of the 4-to-1 MUX logic circuits of FIGS. 28A and 28B.

FIG. 29 depicts a graph 430 depicting a plot 432 of the output of CMOS MUX 420, a plot 433 of the output of 10T MUX circuit 422a, and a plot 434 of 6T MUX circuit 422b for input signals 436-441. The plots 432-434 were obtained by the application of full 16-bit input combinations to 7-nm transistors for a $V_{DD}$ bias of 0.8 V. Simulator results show that the MUX circuits 422a, 422b operate correctly for all input conditions, and correct operation was verified for 5- and 10-nm versions of the MUX circuits 422a, 422b.

For comparison, plot 432 shows the corresponding output for the conventional CMOS pass-gate design, employing six pairs of p-n-junction FinFETs and that requires at least 16 FinFET transistors including inverter circuits for selected input signals. The dynamic performance of the logic circuits extracted from these plots via MATLAB postprocessing is provided in Table 2. Although the ambipolar versions are slower by up to an order of magnitude, they consume five times less power and requires at least 50% less area that the conventional CMOS Mux 420. Thus, the resulting power-delay product is ~30% and ~65% larger for the 6T and 10T MUX circuits 422, respectively. Moreover, despite the significant area and power-delay product advantage of 6T MUX circuit, its noise margin is higher than the 10T version. The delays from the MUX were determined using an average of the four transitions in FIG. 29, while in Table 1B they were calculated from 27 simulations of varying work-functions in a single XOR logic circuit. Thus, these values may be expected to differ between Tables 1B and 2. Nevertheless, the general conclusion in both cases remains the same.

TABLE 2

Switching Performance of 4-TO-1 MUXs Compared to Conventional CMOS Device

| Pass-Gate Type | <P> [μW] | <$t_d$> [ps] | <PDP> [aJ] | NM Loss [mV] | Area [$\lambda_2$] |
|---|---|---|---|---|---|
| CMOS - 16T | 1.923 | 4.75 | 9.14 | ~5 | 846 |
| Ambipolar - 10T | 0.397 | 37.875 | 15.04 | ~10 | 442 |
| Ambipolar - 6T | 0.452 | 26.25 | 11.854 | ~30 | 330 |

Advantageously, the ambipolar logic circuits provide lower power consumption and smaller area. The advantages of lower power and space requirements are sufficient to overcome the speed disadvantage in many applications because the performance of modern sub-100 nm CMOS logic circuits is typically dominated by interconnection overheads. The performance is thus limited by power dissipation rather than switching speed. Given that device downscaling may be reaching the limits of what can be achieved through improvements in semiconductor processing, a 50% reduction in area and 5 to 10 times lower power consumption represents a significant advantage for the ambipolar SB-FinFET circuitry, which may be preferred for logic applications going forward based on these advantages alone.

Figure 30:
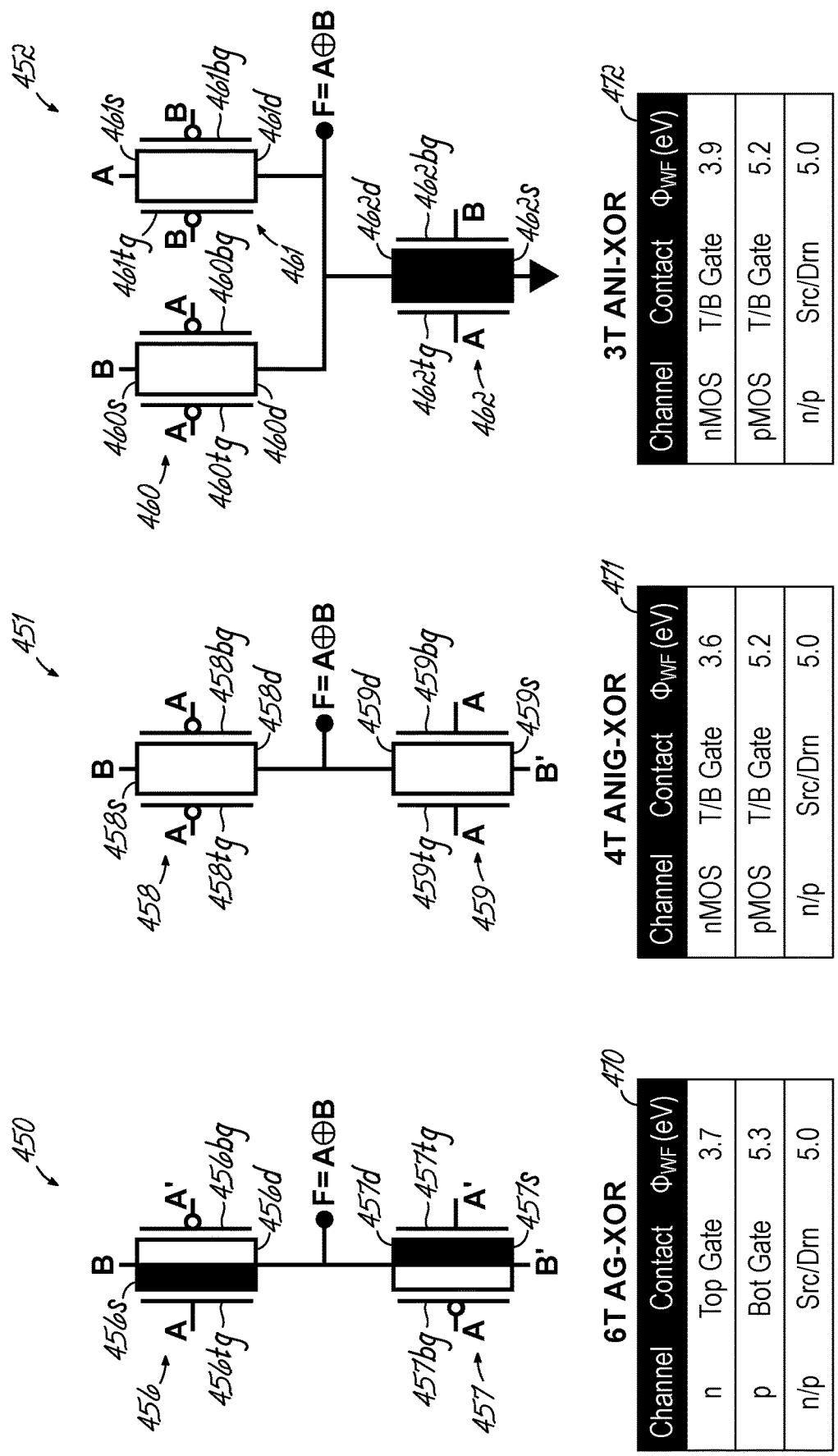
FIG. 30 is a diagrammatic view of three XOR logic circuits based on the device of FIG. 1 and having different topologies and optimized work-functions.

FIG. 30 depicts three XOR logic circuits 450-452 each having a different architecture that can be built using work-function engineering to optimize the SB-FinFETs 456-462 from which the XOR logic circuits 450-452 are built. The channel characteristics and gate work-functions of the SB-FinFETs 456-462 used in each of the XOR logic circuits 450-452 are shown in the corresponding table 470-472 below the respective XOR logic circuit 450-452. The 6T ambipolar gate (AG) XOR logic circuit 450 is the circuit used to determine the results illustrated in FIGS. 8, 9, 15, 16, 25, and 26 as described above. The 6T AG-XOR logic circuit 450 is based on the use of two ambipolar SB-FinFETs 456, 457 configured as pass-gates and driven by both inputs (A, B) as well as their compliments ($\overline{A}$, $\overline{B}$), which may also be indicated as (A', B').

Each SB-FinFET 456, 457 includes a source contact 456s, 457s, a drain contact 456d, 457d, a top gate electrode 456tg, 457tg adjacent to a depletion mode region of the device body, and a bottom gate electrode 456bg, 457bg adjacent to an enhancement mode region of the device body. The top gates 456tg, 457tg may be associated with an n-channel depletion-mode operation, and the bottom gates 456bg, 457bg associated with a p-channel enhancement mode operation of their respective SB-FinFETs 456, 457. As can be seen from table 470, top gates 456tg, 457tg have work-functions $\phi_{WF}$=3.7 eV, bottom gates 456bg, 457bg have work-functions $\phi_{WF}$=5.3 eV, and each source and drain 456s, 456d, 457s, 457d has a work-function $\phi_{WF}$=5.0 eV.

The A input signal is coupled to the top gate electrode 456tg of SB FinFET 456 and the bottom gate electrode 457bg of SB FinFET 457, the $\overline{A}$ input signal is coupled to the bottom gate 456bg of SB FinFET 456 and the top gate 457tg of SB FinFET 457, the B input signal is coupled to the source 456s of SB FinFET 456, and the $\overline{B}$ signal is coupled to the source 457s of SB FinFET 457. The drain 456d of SB FinFET 456 is coupled to the drain 457d of SB FinFET 457 to provide the output signal F=(A⊕B).

As shown for SB-FinFETs 456, 457 of AG XOR logic circuit 450, when the FinFET gates are built from two different metals with work-functions on either side of the mid-gap value, two opposite-type channels may be defined in a single FinFET. This may be analogous to a pass-gate parallel CMOS pair with n/p-channel MOSFETs driven with opposing logic states. Thus, the AG-XOR logic circuit 450 requires a total of six transistors including the inverters, and only two transistors if the inverted inputs ($\overline{A}$, $\overline{B}$) are available. In comparison, an XOR logic circuit made using conventional CMOS pass-gates would require eight transistors with the inverters.

The 4T ambipolar non-inverted gate (ANIG) XOR logic circuit 451 is another novel circuit that provides the logic function of a standard 6T CMOS XOR logic circuit using SB-FinFETs 458, 459 optimized by work-function engineering. Instead of one nMOS and one pMOS pass-gate with individual source/drain junctions, Schottky barrier contacts are utilized and the gate work-functions modified to operate either as n- or p-channel pass-gates. The top gate 458tg and bottom gate 458bg of SB-FinFET 458 may each be associated with an enhancement mode p-channel thereof. The top gate 459tg and bottom gate 459bg of SB-FinFET 459 may each be associated with an enhancement mode n-channel thereof. As can be seen from table 471, top and bottom gates 458tg, 458bg of SB-FinFET 458 have work-functions $\phi_{WF}$=5.2 eV, top and bottom gates 459tg, 459bg of SB-FinFET 459 have work-functions $\phi_{WF}$=3.6 eV, and each source and drain 458s, 458d, 459s, 459d has a work-function $\phi_{WF}$=5.0 eV.

In the ANIG-XOR logic circuit 451, the A input signal provides an input to the top gates 458tg, 459tg and the bottom gates 458bg, 459bg of each device 458, 459. The B input signal drives the positive power supply input, i.e., the source 458s of SB-FinFET 458. The B input signal drives the negative power supply input, which is the source 459s of SB-FinFET 459. The output signal F=(A⊕B) is provided by coupling the drains 458d, 459d of the SB-FinFETs 458, 459 together.

Because symmetrically driven SB-FinFETs are used, this device may be built by using FinFETs with non-independently driven gates having the work-functions indicated in table 471. Like the earlier AG-XOR case, if the $\overline{B}$ input signal is already available, this design may culminate in a 2T-XOR implementation as well. If the inputs B and $\overline{B}$ are replaced with different logic variables, this circuit can also serve as 2-to-1 MUX, which may be useful in a full-adder carry-out calculation.

The three-transistor (3T) ANI-XOR logic circuit 452 comprises three SB-FinFETs 460-462 and does not require any inverters. The top gates 460tg, 461tg and bottom gates 460bg, 461bg of SB-FinFETs 460, 461 may each be associated with an enhancement mode p-channel of their respective device. The top gate 462tg and bottom gate 426bg of SB-FinFET 462 may each be associated with a depletion mode n-channel of SB-FinFET 462.

3T ANI-XOR logic circuit 452 relies on a NAND-like pull-down network based on a high-$V_t$ nMOSFET that can only turn on if A=B=1 and two low-$V_t$ pMOSFETs for the pull-up network. Since no inverters are needed, the 3T ANI-XOR logic circuit 452 can provide the lowest transistor account for logic systems where the logic inverse inputs are not readily available. It may also require two different gate work-functions to ensure that thresholds can be optimized for each transistor. As can be seen from table 472, top and bottom gates 460tg, 460bg, 461tg, 461bg of SB-FinFETs 460, 461 have work-functions $\phi_{WF}$=5.2 eV, top and bottom gates 462tg, 462bg of SB-FinFET 462 have work-functions $\phi_{WF}$=3.9 eV, and each source and drain 460s-462s, 460d-462d has a work-function $\phi_{WF}$=5.0 eV.

The ANI-XOR logic circuit 452 has the A input signal coupled to the top gates 460tg, 462tg of SB FinFETs 460, 462, the bottom gate 460bg of SB FinFET 460, and the source 461s of SB FinFET 461. The B input signal is coupled to the bottom gates 461bg, 462bg of SB FinFETs 461, 462, the top gate 461tg of SB FinFET 461, and the source 460s of SB FinFET 460. The source 462s of FinFET 462 is coupled to $V_{SS}$. The output signal F=(A⊕B) is provided by coupling the drains 460d, 461d, 462d of the SB-FinFETs 460, 461, 462 together.

Figure 31A:
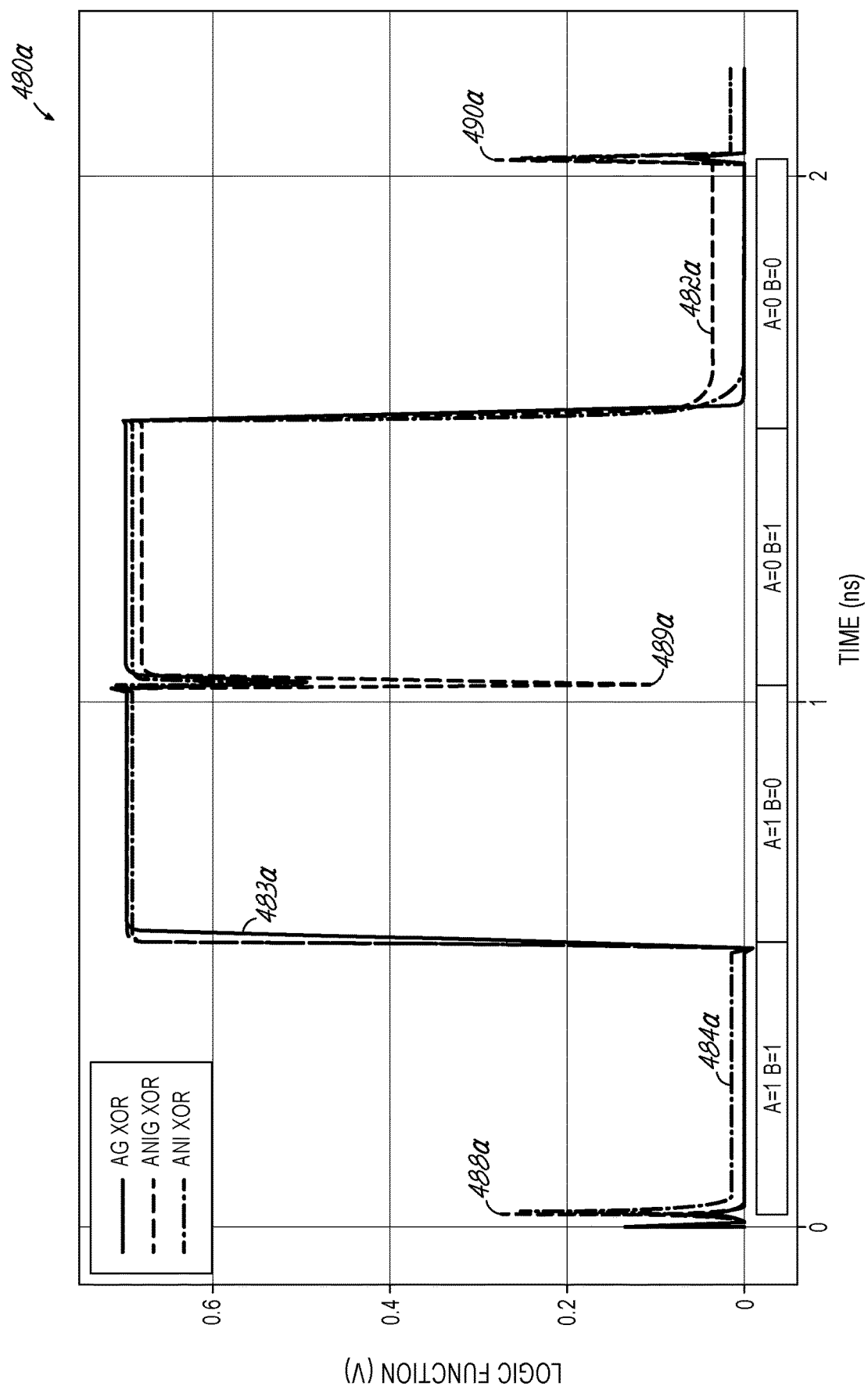
FIGS. 31A and 31B are graphical views illustrating the simulated performance of the XOR logic circuits of FIG. 30.
Figure 31B:
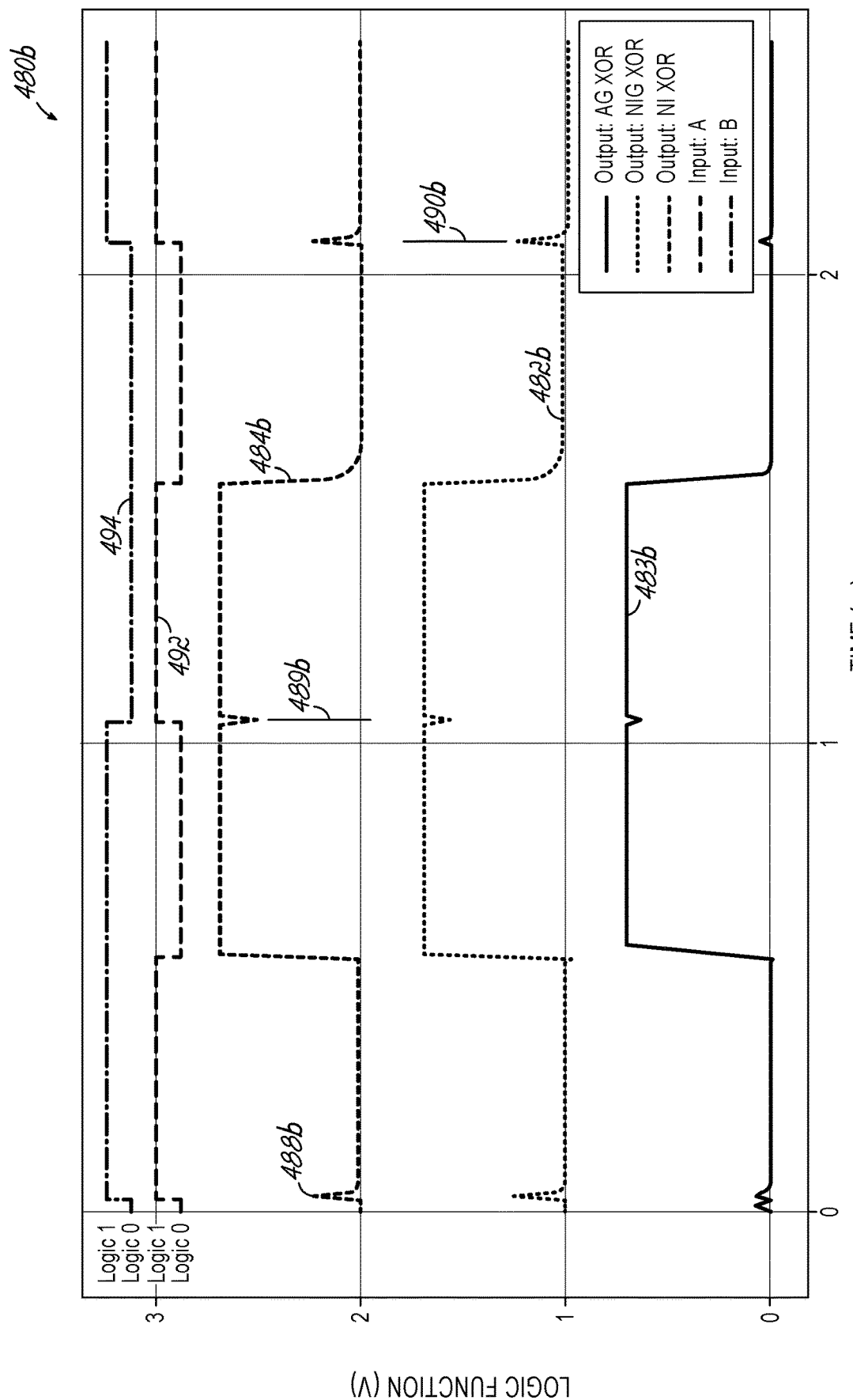

FIGS. 31A and 31B depict graphs 480a, 480b including plots 482a-484a and 482b-484b of the output voltage verses time that illustrate the output of each XOR-logic circuit 450-452 operates correctly and evenly with similar rise/fall times. Graph 480b also includes plots 492, 494 of input signals A and B. Plots 482a, 482b show the output of ANIG-XOR logic circuit 451, plots 483a, 483b show the output of AG XOR logic circuit 450, and plots 484a, 484b show the output of ANI-XOR logic circuit 452. Glitches at signal transition points 488a-490a, 488b-490b may be due to the relatively slow (e.g., 10 ps) 0 to 1 and 1 to 0 transitions used to ensure fast and well-behaved convergence in the TCAD simulations. Simulation data indicates that the AG-XOR logic circuit 450 has the best noise margins, and the ANIG-XOR logic circuit 451 has the worst noise margins, especially in the pull-down network, which introduces a voltage drop of approximately 30 mV.

Figure 31C:
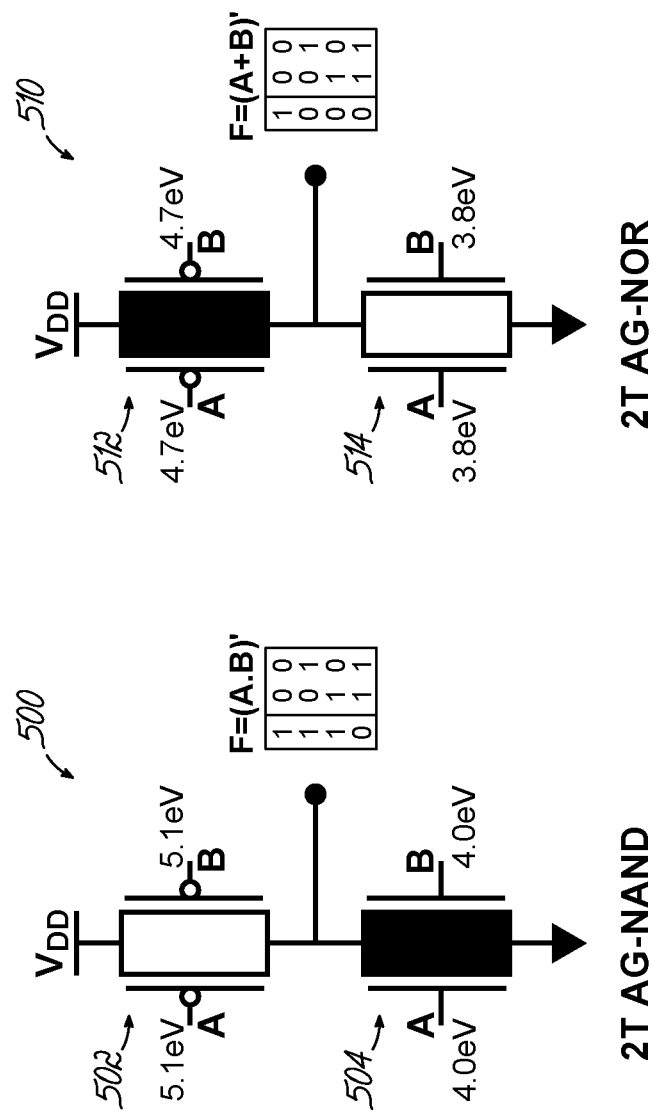
FIG. 31C is a diagrammatic view of a NAND logic circuit and a NOR logic circuit each based on the device of FIG. 1.

FIG. 31C depicts a 2T AG-NAND logic circuit 500 and a 2T AG-NOR logic circuit 510. A single high-$V_{tn}$ independent gate FinFET can be utilized as an AND logic pull-down element that only conducts if both gates are biased with logic 1 input. This creates an extremely compact 2T NAND gate that has been shown to reduce both power (40%) and delay (10%), culminating in an absolutely minimal logic gate arrangement. A similar arrangement can be made for p-MOS pull-up network in CMOS NOR gates, replacing two series pMOS with a single independent-gate high-$V_{tp}$ SB-FinFET. As can be seen, the high threshold voltages are adjusted for using gate work-functions, with top and bottom gates of p-channel enhancement mode SB-FinFET 502 having work-functions $\phi_{WF}$=5.1 eV, top and bottom gates of n-channel depletion mode SB-FinFET 504 having work-functions $\phi_{WF}$=4.0 eV, top and bottom gates of p-channel depletion mode SB-FinFET 512 having work-functions $\phi_{WF}$=4.7 eV, and top and bottom gates of n-channel enhancement mode SB-FinFET 514 having work-functions $\phi_{WF}$=3.8 eV. For each logic circuit 500, 510, the source of the upper device 502, 512 may be coupled to $V_{DD}$, the source of the lower device 504, 510 may be coupled to $V_{SS}$, and the drain of the upper device 502, 512 may be coupled to the drain of the lower device 504, 514 to provide the output of the logic circuit 500, 510.

Figure 31D:
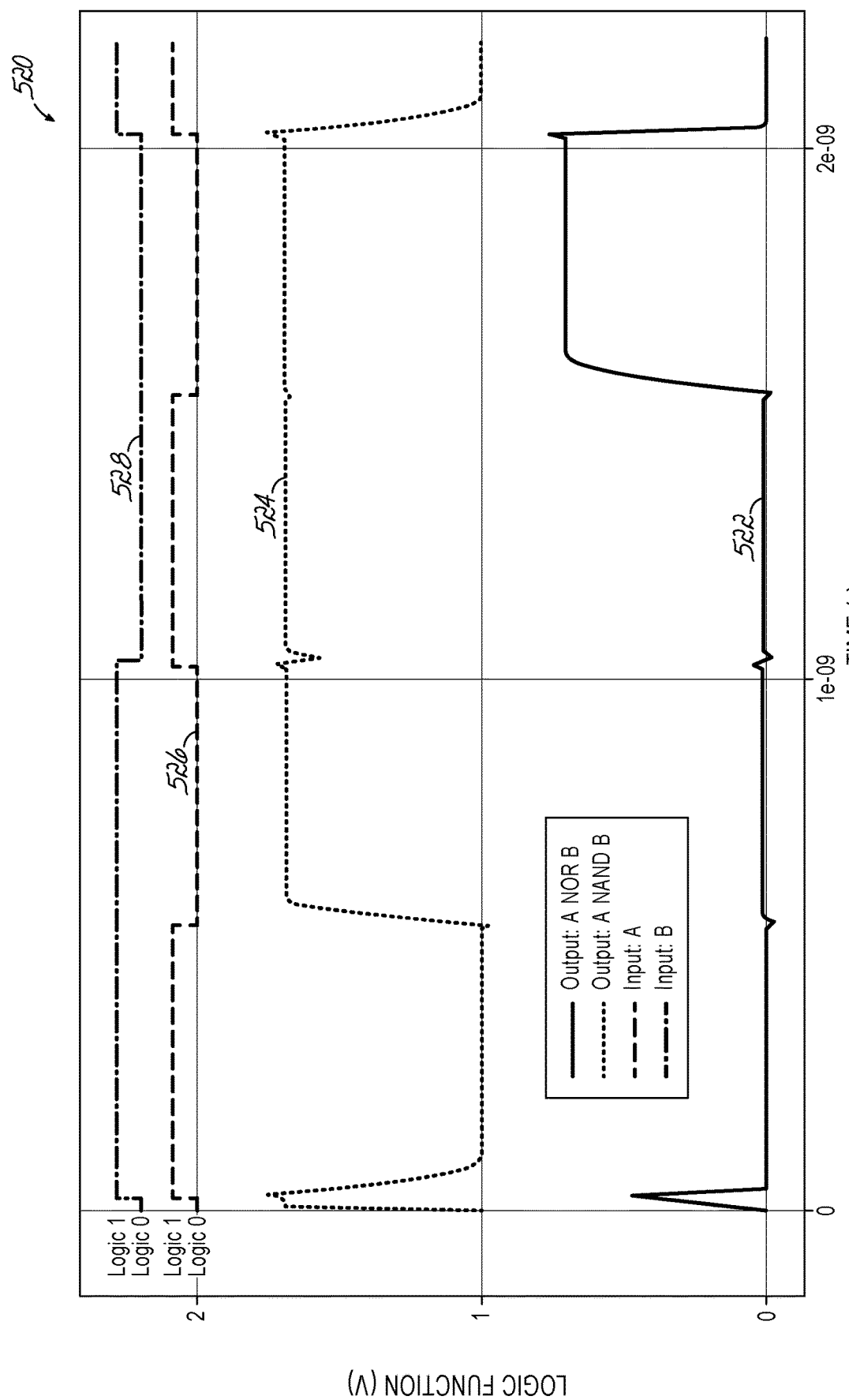
FIG. 31D is a graphical view illustrating the simulated performance of the NAND and NOR logic circuits of FIG. 31C.

FIG. 31D depicts a graph 520 including a plot 524 of the output of NAND logic circuit 500, a plot 522 of the output of NOR logic circuit 510, and plots 526, 528 of input signals A and B, respectively. Plot 522 of the output voltage verses time illustrates the output of NOR logic circuit 510 operates correctly and evenly with similar rise/fall times. Plot 524 of the output voltage verses time illustrates the output of NAND logic circuit 500 operates correctly and evenly with similar rise/fall times. Graph 520 shows that a pair of ambipolar SB-FinFETs 502, 504 with low-$V_{tp}$ and high-$V_{tn}$ devices in a series arrangement will work as a NAND logic gate. Similarly, in the opposite arrangement, operation of the NOR logic circuit 510 is also confirmed. Moreover, in each case, the logic circuits 500, 510 are shown to operate correctly with supply voltages as low as 0.6 V and gate lengths as short as 5 nm using this exact same arrangement of work-functions. In other words, the proposed work-function optimization is relevant and practical over a range of 2T NAND/NOR gates and operating conditions. Thus, together with the use of 2T-XOR gates, work-function engineering can be used to design ultra-compact logic circuits in terms of transistor count and area required.

Figure 32:
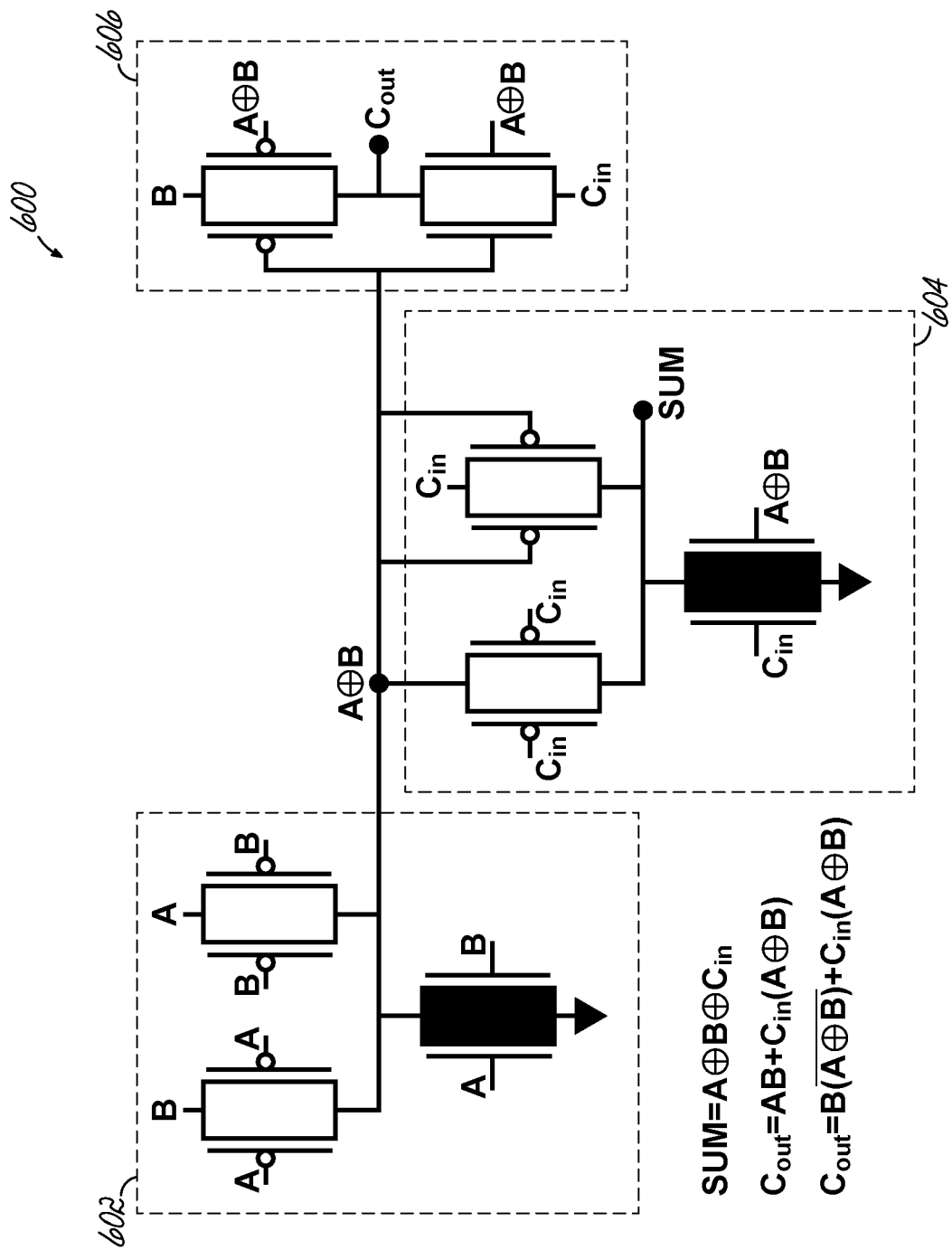
FIG. 32 is a diagrammatic view of a full adder logic circuit including XOR logic circuits of FIG. 30.

Besides general logic use, XOR logic circuits may also be used for the efficient implementation of full-adder circuits. FIG. 32 depicts a novel Ambipolar Full-Adder eight-transistor (AFA-8T) logic circuit 600 that requires no inverted inputs. The AFA-8T logic circuit 600 includes two ANI-XOR blocks 602, 604 as described above and a single 2T ANIG block 606 re-configured as a 2-to-1 MUX circuit via top and bottom inputs. Note that carry bit Gut takes advantage of the equivalence A·B=B·(A⊕B) so a second ANI-XOR block can be used, eliminating the need for an inverter.

Figure 33:
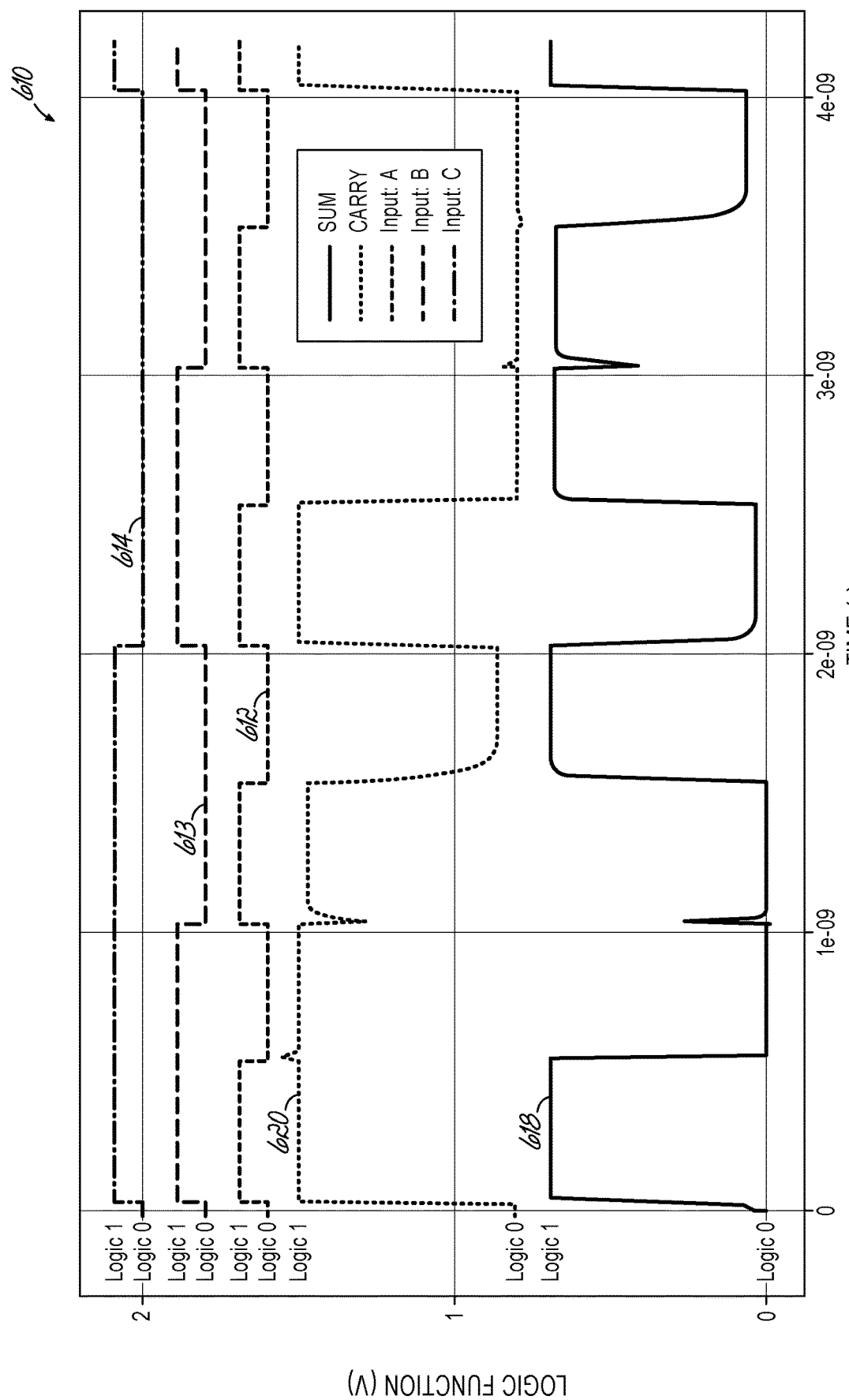
FIG. 33 is a graphical view illustrating the simulated performance of the full-adder logic circuit of FIG. 32.

FIG. 33 depicts a graph 610 including plots 612-614 of the input signals A, B, and C, respectively, of FIG. 32, plot 618 of the SUM signal output by AFA-8T logic circuit 600, and plot 620 of the carry bit $C_{out}$ (CARRY) signal output by AFA-8T logic circuit 600. The plots were determined using TCAD mix-mode simulations. For the chosen set of work-functions, the SUM signal is working with minimal (−10 mV) loss in noise margins, whereas the CARRY signal has a more significant (−85 mV) loss for one input combination (A=1, B=0, $C_{in}$=1). This loss may be corrected if work-functions are slightly altered. However, this may be a zero-sum game as losses could then appear in other input combinations. In most cases, the cause of the loss is the second ANI-XOR stage ($C_{in}$=1) which inherits a slight loss of logic levels from the first ANI-XOR stage. Thus, if work-functions for subsequent ANI-XORs are slightly varied, at the expense of process complexity or by adjusting W/L ratios in each stage, it should be possible to mitigate these losses further.

Figure 34:
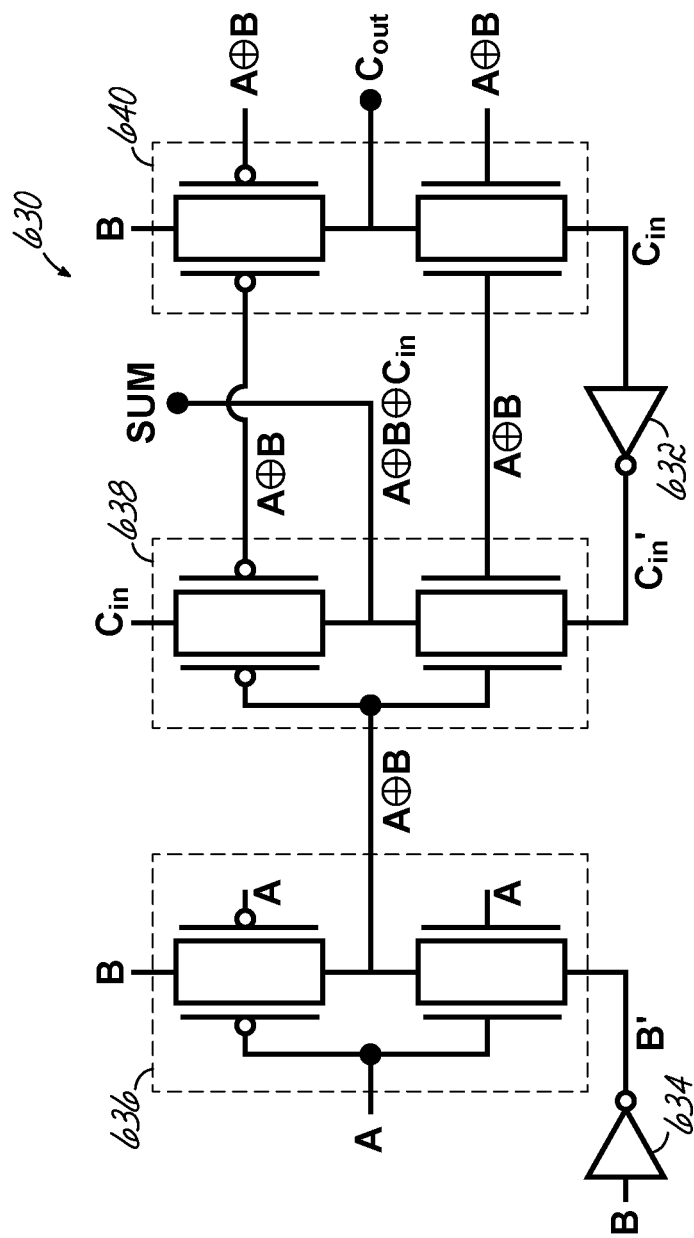
FIG. 34 is a diagrammatic view of another full adder logic circuit including XOR logic circuits of FIG. 30.

FIG. 34 depicts another novel Ambipolar Full-Adder ten-transistor (AFA-10T) logic circuit 630 including two inverters 632, 634. For embodiments in which inverted inputs are available, the inverters 632, 634 would not be needed, and the logic circuit 630 could be built with six transistors. In either case, the logic circuit 630 includes two 4T ANIG-XOR logic circuits 636, 638, and a 2T ANIG MUX logic circuit 640.

Figure 35:
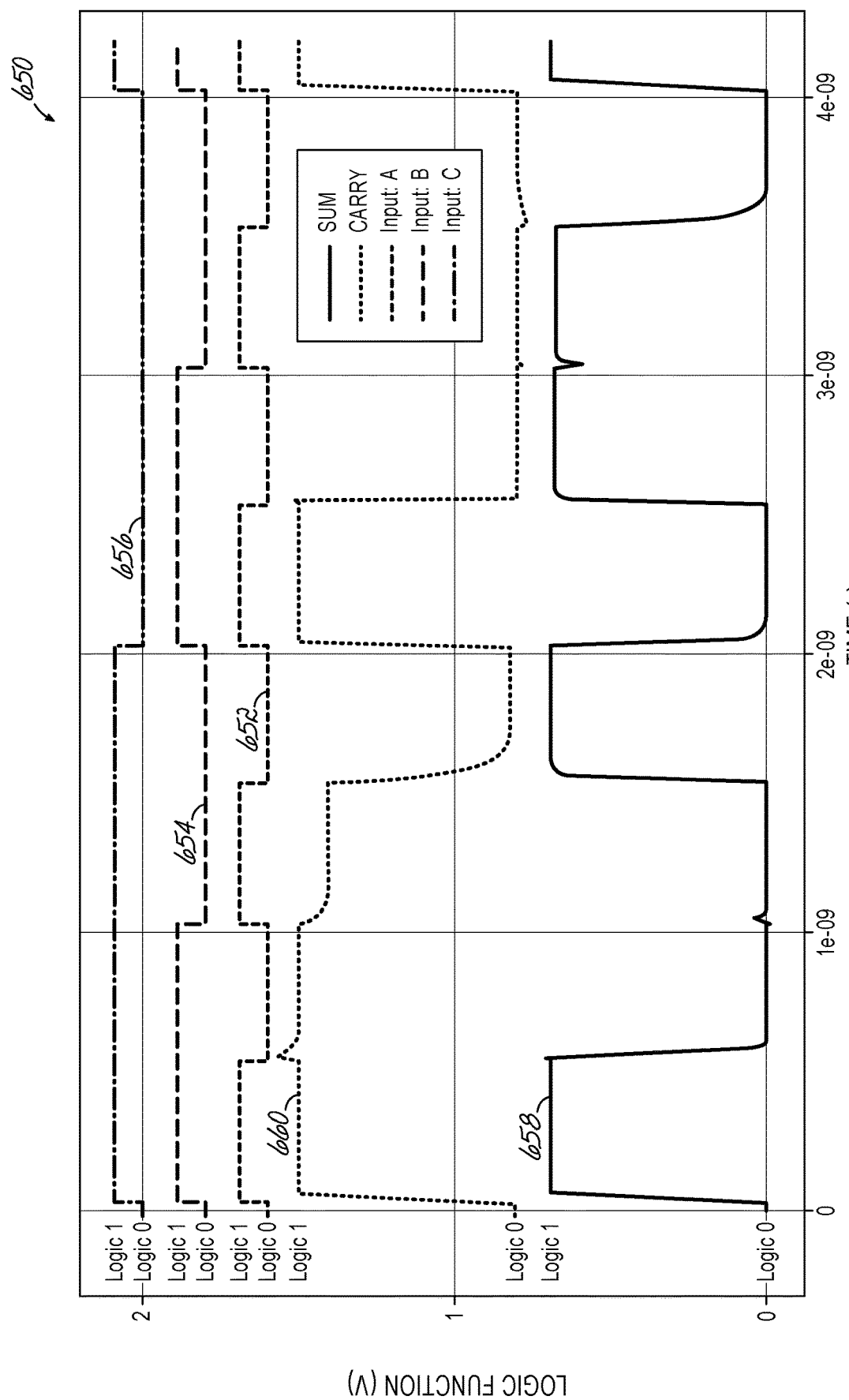
FIG. 35 is a graphical view illustrating the simulated performance of the full-adder logic circuit of FIG. 34.

FIG. 35 depicts a graph 650 including plots 652, 654, 656 of the input signals A, B, and C, respectively, of FIG. 34, plot 658 of the SUM signal output by AFA-10T logic circuit 630, and plot 660 of the carry bit $C_{out}$ (CARRY) signal output by AFA-8T logic circuit 600, which were determined using TCAD mix-mode simulations. Unlike the AFA-8T logic circuit 600, both SUM and CARRY outputs suffer from ≤60 mV losses in noise lower margins, while smaller losses are also visible in the logic high state, indicating that the work-functions chosen for the correct XOR operation may be suboptimal.

Conventional CMOS XOR logic circuits rely on nMOS or pMOS only pass-gates, which do not pass logic-0 and logic-1 states equally well. As a result, these CMOS logic circuits require additional inverting buffers to restore logic levels at the output. Output buffers may be particularly necessary for multi-stage logic circuits. Thus, logic circuits built using conventional CMOS pass-gates comprising a parallel connection of an n- and p-channel MOSFET have higher noise margins, although these noise margins can be improved at the expense of increasing the area to accommodate additional buffer transistors (e.g., eight transistors), increased power dissipation, or both.

In contrast, the above described work-function optimized 4T and 3T XOR gates utilize full CMOS blocks that can pass logic 0/1 levels as well as or better than their single-gate counterparts owing to the dual-gate action of the FinFET. Hence, embodiments of the present invention are valuable and unique in at least two different aspects. Specific embodiments described include two novel XOR logic circuits (4T and 3T) and two full adders (8T and 10T). These logic circuits are based on novel SB-FinFETs optimized using work-function engineering. The AFA-8T logic circuit 600 is believed to be the first fully-CMOS logic block of its kind. The nMOSFET-only example has a significant loss of noise margins that could reduce its value in real applications as compared to the AFA-8T logic circuit. The ANI-XOR logic circuits are believed to be the first CMOS logic gate that provides an XOR logic function without inverters and using only three transistors.

In addition to area gains approaching 50%, full-adder logic circuits in accordance with embodiments of the invention offer significant gains in dynamic performance as compared to conventional logic circuits. This has been determined by comparing simulated power-delay products with conventional CMOS designs, as shown in Table 3. The total power-delay product of the AFA-8T & AFA-10T logic circuits are 8.6 aJ and 20.6 aJ, respectively. This compares favorably to the conventional CMOS full-adder circuit, which has a power-delay product of 65.5 aJ. These values may not be completely accurate given the finite parasitics included in the TCAD model (e.g., $R_{SD}$=50 Ohms and $C_L$=1 fF) and the failure of the model to account for gate tunneling. However, they do indicate competitive performance for the ambipolar full-adder logic circuits. Noise margin losses in the ambipolar logic circuits may be improved further by fine tuning the work-functions and Fin dimensions. These adjustments to the work-functions of the ambipolar devices may also lower power dissipation and enhance the power-delay product. Instead of the XOR gate level, additional optimization of work-functions might be more beneficial at the functional level, i.e. by altering the work-function of a specific transistor so as to improve overall logic circuit performance.

TABLE 3

Comparison of Switching Performance of Ambipolar Full-Adders &
Conventional CMOS Pass-Gate Full-Adders with 20 Transistors

| Logic Circuit | <P> [μW] | <$t_d$> [ps] | <PDP> [aJ] | NM Loss [mV] |
|---|---|---|---|---|
| AFA-8T$_{SUM}$ | 470 | 27.94 | 13.13 | 60 |
| AFA-8TC$_{out}$ | 261 | 29.06 | 7.57 | 60 |
| AFA-8T$_{SUM}$ | 197 | 17.59 | 3.46 | 85 |
| AFA-8TC$_{out}$ | 1206 | 4.26 | 5.14 | 20 |
| CMOS-20T$_{SUM}$ | 7002 | 4.61 | 32.25 | 10 |
| CMOS-20TC$_{out}$ | 6510 | 5.10 | 33.21 | 5 |

Figure 36B:
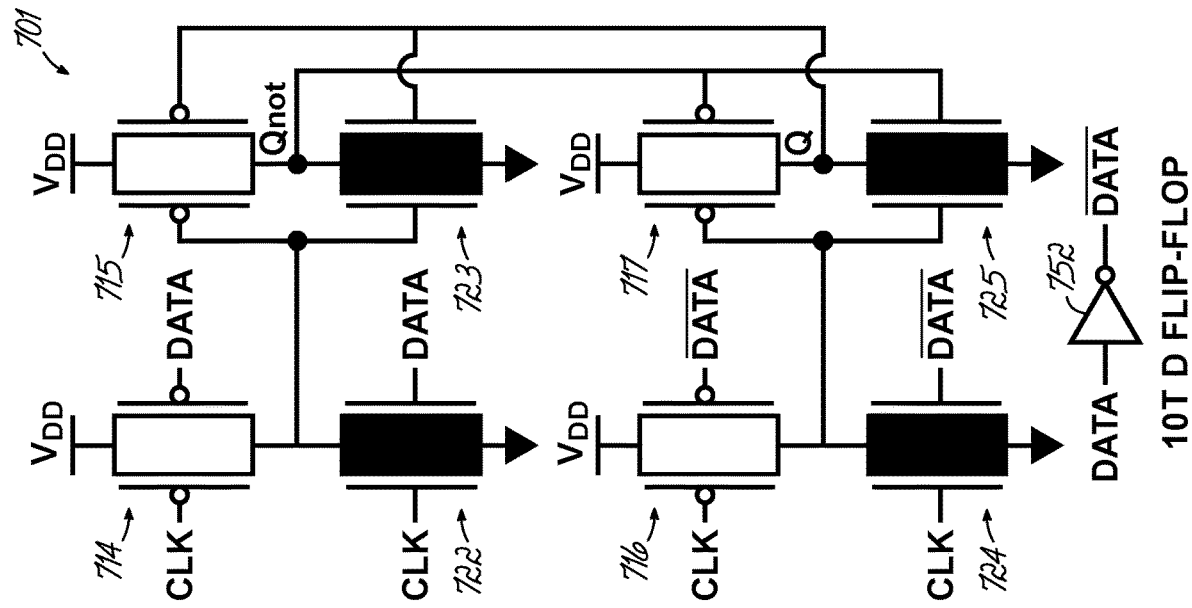
FIG. 36B is a diagrammatic view of a ten-transistor D-type flip-flop logic circuit based on the device of FIG. 1.
Figure 36A:
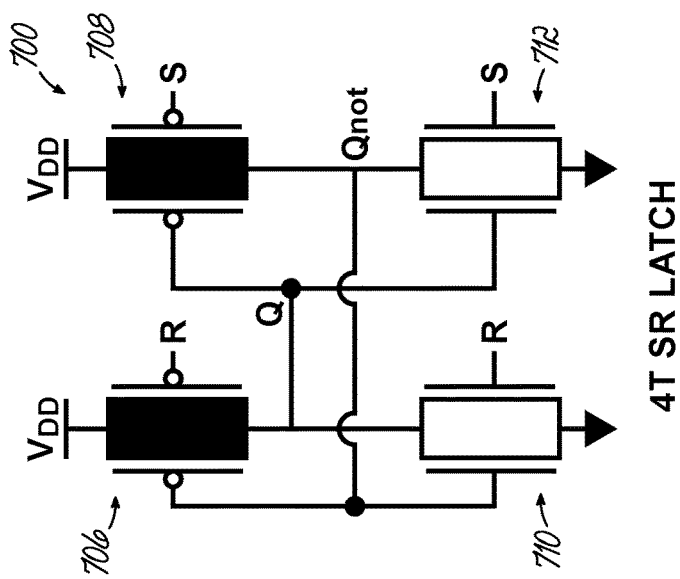
FIG. 36A is a diagrammatic view of a four-transistor set-reset latch logic circuit based on the device of FIG. 1.
Figure 36C:
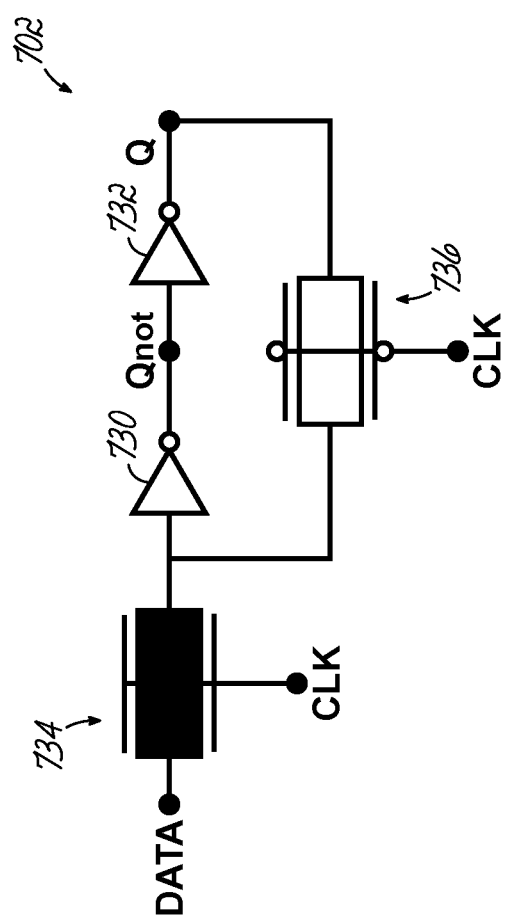
FIG. 36C is a diagrammatic view of a six-transistor D-type flip-flop logic circuit based on the device of FIG. 1.

FIGS. 36A-36C depicts a four-transistor (4T) set-reset (SR) latch logic circuit 700, a 10T D-type flip-flop logic circuit 701, and a 6T D-type flip-flop logic circuit 702. Each of the logic circuits 700-702 uses one or more of the ambipolar pass gates and NOR logic circuits described above, and was verified using mixed-signal TCAD simulations. The SR Latch logic circuit 700 includes two p-channel depletion mode SB-FinFETs 706, 708 and two n-channel enhancement mode SB-FinFETs 710, 712 having gates, sources, and drains connected as shown. The D-type flip-flop logic circuit 701 includes four p-channel enhancement mode SB-FinFETs 714-717, four n-channel depletion mode SB-FinFETs 722-725, and an inverter 752. The gates, sources, and drains of the SB-FinFETs 714-717, 722-725, and the input and output of the inverter 752 are connected as shown. The D-type flip-flop logic circuit 702 includes two inverters 730, 732, an n-channel depletion mode SB-FinFET 734, and a p-channel enhancement mode SB-FinFET 736 connected as shown.

Figure 36D:
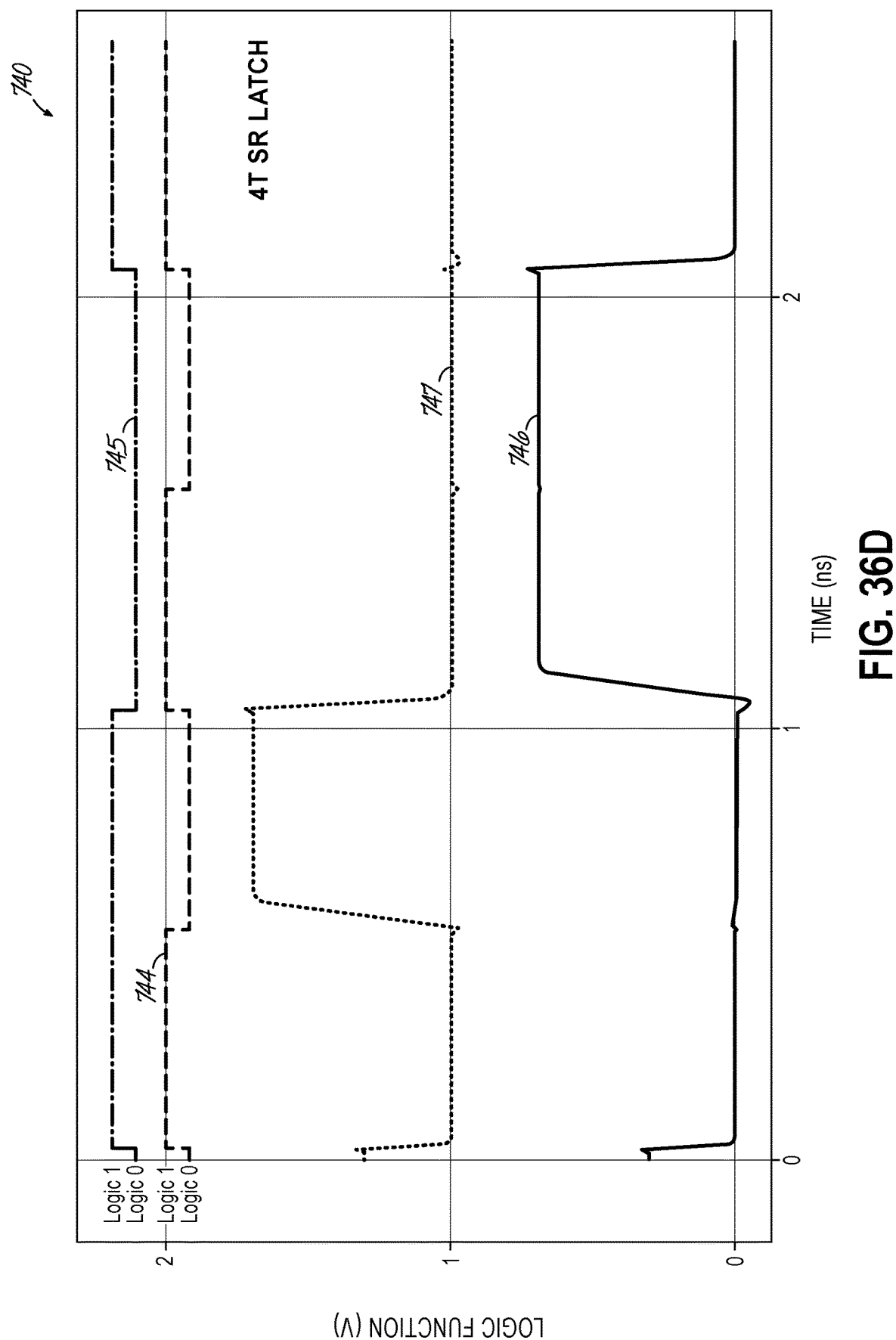
FIG. 36D is a graphical view illustrating the simulated performance of the set-rest latch logic circuit of FIG. 36A.
Figure 36E:
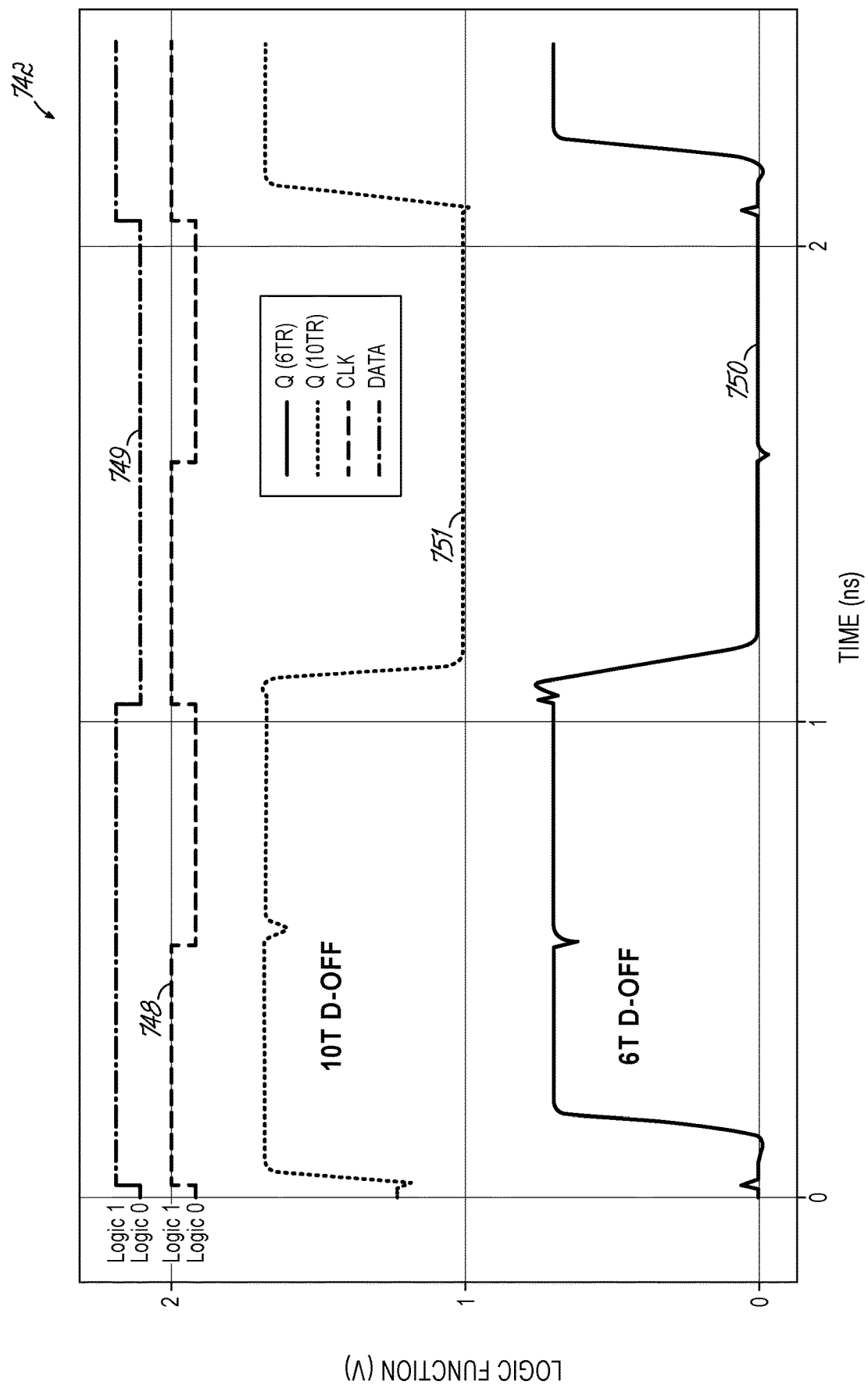
FIG. 36E is a graphical view illustrating the simulated performance of the ten-transistor and six-transistor D-type flip-flops of FIGS. 36B and 36C.

FIGS. 36D and 36E depict graphs 740 and 742. Graph 740 includes a plot 744 of a set logic signal, a plot 745 of a reset logic signal, a plot 746 of a Q output logic signal, and a plot 747 of a Qnot signal of SR latch logic circuit 700. Graph 742 includes a plot 748 of a clock logic signal, a plot 749 of a data logic signal, a plot 750 of the Q output logic signal for the 6T D-type flip-flop logic circuit 702, and a plot 751 of the Q signal of the 10T D-type flip-flop logic circuit 701. Extracted figures of merit for the dynamic response of the proposed circuits are listed in Table 4 below:

TABLE 4

Switching Performance of SR Latch and D-type Flip-Flops

| Circuit Type | <P> [μW] | <$t_d$> [ps] | <PDP> [aJ] | NM Loss [mV] | Area [λ$_2$] |
|---|---|---|---|---|---|
| 4T SR Latch | 0.201 | 33 | 7.407 | ~5 | 230 |
| 10T D-type FF | 1.113 | 30 | 33.389 | ~20 | 520 |
| 6T D-type FF | 0.098 | 46 | 4.527 | ~10 | 300 |

The SR latch logic circuit 700 with cross-feedback NOR gates has a total of 33 ps average delay while consuming ~0.2 nW. Similar performance was observed by modeling an SR latch built using ambipolar NAND logic circuits 500. In comparison, the two D flip-flop circuits are designed to show the multiple degrees of freedom provided by the work-function engineering approach. The 10T D-type flip-flop logic circuit 701 comprises four 2T NAND logic circuits 500 and the inverter 752. This logic circuit 701 was the fastest among the three flip-flop circuits, and only ~20% slower than a conventional FinFET circuit. The use of the n-channel SB-FinFET 734 in a pass gate configuration with a 4.1 eV gate work-function, and the p-channel SB-FinFET 736 with a 5.0 eV gate work-function extends the work-function engineering approach to 1T transmission gates, eliminating the need for an inverted clock input $\overline{CLK}$. This eliminates the need for two transistors, which produces a 25% reduction in the number of transistors in the logic circuit 702. The same circuit can also be implemented using the 1T ambipolar pass-gate devices described with respect to FIGS. 30 and 31C, however, this would require an additional inverter. The simulated power consumption of the novel 6T D-type flip-flop circuit 702 is only 98 nW, or about ten times less than the 10T-D-type flip-flop logic circuit 701. This is despite the 6T D-type flip-flop circuit 702 being 1.5 times slower than the larger two-stage design. Therefore, 6T D-type flip-flop circuit 702 has an advantage over the 10T-D-type flip-flop logic circuit 701 not only in terms of transistor count and area, but also having more than seven times better power-delay product.

While standard Silicon CMOS has been used to describe embodiments of the invention for purposes of clarity, it should be understood that other ambipolar devices such as nanowire or carbon nanotube channels can also be used to implement transistor architectures presented here. Thus, the ultra-high-density logic circuit implementations disclosed can be implemented using other than silicon-based devices.

The terminology used herein is for the purpose of describing particular embodiments only and is not intended to be limiting of the embodiments of the invention. As used herein, the singular forms "a", "an" and "the" are intended to include both the singular and plural forms, and the terms "and" and "or" are each intended to include both alternative and conjunctive combinations, unless the context clearly indicates otherwise. It will be further understood that the terms "comprises" or "comprising," when used in this specification, specify the presence of stated features, integers, actions, steps, operations, elements, or components, but do not preclude the presence or addition of one or more other features, integers, actions, steps, operations, elements, components, or groups thereof. Furthermore, to the extent that the terms "includes", "having", "has", "with", "comprised of", or variants thereof are used in either the detailed description or the claims, such terms are intended to be inclusive in a manner similar to the term "comprising".

While all the invention has been illustrated by a description of various embodiments, and while these embodiments have been described in considerable detail, it is not the intention of the Applicant to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of the Applicant's general inventive concept.

What is claimed is:
1. A device comprising:
   a first semiconductor layer including a first end, a second end opposite the first end, a first surface that extends from the first end to the second end, and a second surface opposite the first surface;
   a first contact coupled to the first end of the first semiconductor layer and formed from a first material having a first work-function;
   a second contact coupled to the second end of the first semiconductor layer and formed from a second material having a second work-function;

a first gate electrode coupled to the first surface of the first semiconductor layer and formed from a third material having a third work-function; and a second gate electrode coupled to the second surface of the first semiconductor layer and formed from a fourth material having a fourth work-function, wherein at least one of the first work-function is different from the second work-function, or the third work-function is different from the fourth work-function.

2. The device of claim 1 wherein:

the third work-function has a first value that causes a first portion of the first semiconductor layer proximate the first surface to be an n-type semiconductor, and the fourth work-function has a second value that causes a second portion of the first semiconductor layer proximate the second surface to be a p-type semiconductor.

3. The device of claim 2 wherein the first portion of the first semiconductor layer includes portions of the first semiconductor layer closer to the first surface than the second surface, and the second portion of the first semiconductor layer includes the portions of the first semiconductor layer that are closer to the second surface than the first surface.

4. The device of claim 1 wherein:

in response to a voltage being applied across the first contact and the second contact, a hole current and an electron current flow between the first contact and the second contact; and the first work-function is offset from the second work-function to reduce a difference between the hole current and the electron current as compared to when the first work-function equals the second work-function.

5. The device of claim 1 wherein:

the first gate electrode is biased with a first voltage that causes electron conduction or tunneling in the first semiconductor layer proximate the first gate electrode; and the second gate electrode is biased with a second voltage that causes hole conduction or tunneling in the first semiconductor layer proximate the second gate electrode.

6. The device of claim 1 wherein the first and second work-functions are larger or smaller than a mid-gap energy level of the first semiconductor layer.

7. The device of claim 6 wherein the first and second work-functions lower a barrier height for a first charge carrier and increase the barrier height for a second charge carrier crossing a boundary between at least one of either the first contact or the second contact and the first semiconductor layer.

8. The device of claim 7 wherein the first charge carrier is a hole, and the second charge carrier is an electron.

9. The device of claim 1 further comprising:

a first dielectric layer that couples the first gate electrode to the first surface of the first semiconductor layer; and a second dielectric layer that couples the second gate electrode to the second surface of the first semiconductor layer.

10. The device of claim 9 wherein the first dielectric layer has a first thickness and the second dielectric layer has second thickness different from the first thickness.

11. The device of claim 1 further comprising:

a first source of a first logic signal coupled to the first contact; and a second source of a second logic signal coupled to the first gate electrode directly and coupled to the second gate electrode through an inverter, wherein the second contact provides a logical AND function of the first logic signal and the second logic signal.

12. The device of claim 1 further comprising:

a second semiconductor layer including a third end, a fourth end opposite the third end, a third surface that extends from the third end to the fourth end, and a fourth surface opposite the third surface;

a third contact coupled to the third end of the second semiconductor layer and formed from a fifth material having a fifth work-function;

a fourth contact coupled to the fourth end of the second semiconductor layer and formed from a sixth material having a sixth work-function;

a third gate electrode coupled to the third surface of the second semiconductor layer and formed from a seventh material having a seventh work-function;

a fourth gate electrode coupled to the fourth surface of the second semiconductor layer and formed from a material having an eighth work-function;

a first source of a first logic signal coupled to the first gate electrode and the third gate electrode directly, and to the second gate electrode and the fourth gate electrode through an inverter; and a second source of a second logic signal coupled to the second contact and the fourth contact directly, wherein at least one of the fifth work-function is different from the sixth work-function, or the seventh work-function is different from the eighth work-function, and the first contact is coupled to the third contact to provide an output that is a logical XOR function of the first and second logic signals.

13. The device of claim 1 further comprising:

a second semiconductor layer including a third end, a fourth end opposite the third end, a third surface that extends from the third end to the fourth end, and a fourth surface opposite the third surface;

a third contact coupled to the third end of the second semiconductor layer and formed from a fifth material having a fifth work-function;

a fourth contact coupled to the fourth end of the second semiconductor layer and formed from a sixth material having a sixth work-function;

a third gate electrode coupled to the third surface of the second semiconductor layer and formed from a seventh material having a seventh work-function;

a fourth gate electrode coupled to the fourth surface of the second semiconductor layer and formed from an eighth material having an eighth gate work-function;

a logic level high voltage source coupled to the second contact;

a logic level low voltage source coupled to the third contact;

a first source of a first logic signal coupled to the first gate electrode through a first inverter and to the third gate electrode directly; and a second source of a second logic signal coupled to the second gate electrode through a second inverter and the fourth gate electrode directly, wherein at least one of the fifth work-function is different from the sixth work-function, or the seventh work-function is different from the eighth work-function, and the first contact is coupled to the fourth contact to provide a logical NAND function of the first and second logic signals.

14. The device of claim 13 wherein the third contact is a source contact and the fourth contact is a drain contact.

15. The device of claim 1 wherein the first contact is a source contact and the second contact is a drain contact.

16. A method of fabricating a device, the method comprising:
providing a semiconductor layer including a first end, a second end opposite the first end, a first surface that extends from the first end to the second end, and a second surface opposite the first surface;
coupling a first contact formed from a first material having a first work-function to the first end of the semiconductor layer;
coupling a second contact formed from a second material having a second work-function to the second end of the semiconductor layer;
coupling a first gate electrode formed from a third material having a third work-function to the first surface of the semiconductor layer; and
coupling a second gate electrode formed from a fourth material having a fourth work-function to the second surface of the semiconductor layer,
wherein at least one of the first work-function is different from the second work-function, or the third work-function is different from the fourth work-function.

17. A device comprising:
a semiconductor layer including a first end, a second end opposite the first end, a first surface that extends from the first end to the second end, and a second surface opposite the first surface;
a first contact coupled to the first end of the semiconductor layer and formed from a first material having a first work-function;
a second contact coupled to the second end of the semiconductor layer and formed from a second material having a second work-function;
a first gate electrode coupled to the first surface of the semiconductor layer and formed from a third material having a third work-function; and
a second gate electrode coupled to the second surface of the semiconductor layer and formed from a fourth material having a fourth work-function,
wherein the first gate electrode and the second gate electrode are configured to be driven independently of each other, the third work-function has a first value that causes the first gate to operate as an n-channel device, and the fourth work-function has a second value different from the first value that causes the second gate to operate as a p-channel device.

18. The device of claim 17 wherein the semiconductor layer includes an n-channel proximate to the first gate electrode and a p-channel proximate to the second gate electrode, and the first work-function and the second work-function have values that cause a first current in the n-channel to be equal to a second current in the p-channel.

19. The device of claim 17 wherein a first portion of the semiconductor layer proximate to one of the first gate electrode or the second gate electrode operates in an enhancement mode, and a second portion of the semiconductor layer proximate to the other of the first gate electrode or the second gate electrode operates in a depletion mode.

* * * * *